(12) United States Patent
Zhu et al.

(10) Patent No.: US 11,264,179 B2
(45) Date of Patent: Mar. 1, 2022

(54) METHODS FOR PRODUCING AND USING PEROVSKITE MATERIALS AND DEVICES THEREFROM

(71) Applicants: Alliance for Sustainable Energy, LLC, Golden, CO (US); Shanghai Jiao Tong University, Shanghai (CN)

(72) Inventors: Kai Zhu, Littleton, CO (US); Joseph M. Luther, Boulder, CO (US); Yixin Zhao, Shanghai (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/704,207

(22) Filed: Dec. 5, 2019

(65) Prior Publication Data
US 2020/0118767 A1 Apr. 16, 2020

Related U.S. Application Data

(63) Continuation of application No. 15/312,714, filed as application No. PCT/US2015/033068 on May 28, 2015, now Pat. No. 10,566,143.
(Continued)

(51) Int. Cl.
*H01L 51/42* (2006.01)
*H01L 51/44* (2006.01)
(Continued)

(52) U.S. Cl.
CPC ....... *H01G 9/2013* (2013.01); *H01L 51/0007* (2013.01); *H01L 51/0026* (2013.01);
(Continued)

(58) Field of Classification Search
CPC ............. H01L 51/0012; H01L 51/0021; H01L 51/0026; H01L 51/0028; H01L 51/0035;
(Continued)

(56) References Cited

U.S. PATENT DOCUMENTS 5,871,579 A 2/1999 Liang et al.
6,231,666 B1 5/2001 Clem et al.
(Continued)

FOREIGN PATENT DOCUMENTS

CN 103956394 A 7/2014
EP 2 804 232 A1 11/2014
(Continued)

OTHER PUBLICATIONS

Hybrid Lead Halide Iodide and Lead Halide Bromide in Efficient Hole Conductor Free Perovskite Solar Cell Sigalit Aharon , Bat El Cohen, J. Phys. Chem. C 2014, 118, 30, 17160-17165 Publication Date:Apr. 17, 2014 (Year: 2014).*
(Continued)

*Primary Examiner* — Bradley Smith
*Assistant Examiner* — David J Goodwin
(74) *Attorney, Agent, or Firm* — Michael A. McIntyre

(57) ABSTRACT

The present disclosure describes solution methods for manufacturing perovskite halide films for use in solar cells. The methods include the use of additives that facilitate the formation of transitory, intermediate films that are later transformed into the final target perovskite halide films, such that the final films provide improved physical characteristics and operational performance.

19 Claims, 43 Drawing Sheets

Related U.S. Application Data

(60) Provisional application No. 62/103,277, filed on Jan. 14, 2015, provisional application No. 62/061,475, filed on Oct. 8, 2014, provisional application No. 62/004,020, filed on May 28, 2014.

(51) Int. Cl.
*H01L 51/00* (2006.01)
*H01G 9/20* (2006.01)

(52) U.S. Cl.
CPC ...... *H01L 51/0032* (2013.01); *H01L 51/4226* (2013.01); *H01L 51/4253* (2013.01); *Y02E 10/549* (2013.01); *Y02P 70/50* (2015.11)

(58) Field of Classification Search
CPC ............. H01L 51/0037; H01L 51/0047; H01L 51/0077
See application file for complete search history.

(56) References Cited

U.S. PATENT DOCUMENTS

| | | | |
|---|---|---|---|
| 6,429,318 | B1 | 8/2002 | Mitzi |
| 8,563,855 | B2 | 10/2013 | Pschirer et al. |
| 9,583,724 | B2* | 2/2017 | Huang ............... H01L 51/0012 |
| 9,701,696 | B2* | 7/2017 | Zhu ............................ C07F 7/24 |
| 9,793,056 | B1* | 10/2017 | Bag ........................ H01L 51/424 |
| 10,199,579 | B2* | 2/2019 | Huang ....................... G01J 1/42 |
| 2004/0191150 | A1 | 9/2004 | Yano et al. |
| 2010/0301311 | A1 | 12/2010 | Oku |
| 2011/0300064 | A1 | 12/2011 | Takeshima |
| 2012/0216865 | A1 | 8/2012 | Snaith et al. |
| 2014/0020739 | A1 | 1/2014 | Yang et al. |
| 2014/0060643 | A1 | 3/2014 | Martin et al. |
| 2014/0332078 | A1 | 11/2014 | Guo et al. |
| 2015/0129034 | A1 | 5/2015 | Snaith et al. |
| 2015/0136232 | A1 | 5/2015 | Snaith et al. |
| 2015/0249170 | A1 | 9/2015 | Snaith et al. |
| 2016/0218307 | A1* | 7/2016 | Huang ................. H01G 9/2009 |
| 2016/0251383 | A1 | 9/2016 | Zhu et al. |
| 2017/0084399 | A1* | 3/2017 | Vak ...................... H01L 51/0036 |
| 2019/0256535 | A1* | 8/2019 | Ma ........................... C07F 1/005 |

FOREIGN PATENT DOCUMENTS

| | | |
|---|---|---|
| WO | WO 2010/085598 A2 | 7/2010 |
| WO | WO 2011/110869 A2 | 9/2011 |
| WO | WO 2011/123117 A1 | 10/2011 |
| WO | WO 2012/162763 A1 | 12/2012 |
| WO | WO 2013/171518 A1 | 11/2013 |
| WO | WO 2014/045021 A1 | 3/2014 |
| WO | WO 2014/097299 A1 | 6/2014 |
| WO | WO 2014/132076 A1 | 9/2014 |
| WO | WO 2014/180789 A1 | 11/2014 |
| WO | WO 2014/181072 A1 | 11/2014 |
| WO | WO 2014/202965 A1 | 12/2014 |
| WO | WO 2015/036905 A1 | 3/2015 |
| WO | WO 2015/166006 A1 | 11/2015 |

OTHER PUBLICATIONS

Efficient Hybrid Solar Cells Based on Meso-Superstructured Organometal Halide Perovskites Michael M. Lee, Joël Teuscher, Tsutomu Miyasaka Science Nov. 2, 2012: vol. 338, Issue 6107, pp. 643-647 (Year: 2012).*

"Best Research-Cell Efficiencies", NREL, http://www.nrel.gov/ncpv/images/efficiency_chart.jpg, accessed Apr. 22, 2016, p. 1.

Ball et al., "Low-temperature Processed Meso-superstructured to Thin-film Perovskite Solar Cells", Energy & Environmental Science, 2013, vol. 6, pp. 1739-1743.

Barzykin et al., "Mechanism of Charge Recombination in Dye-Sensitized Nanocrystalline Semiconductors: Random Flight Model", The Journal of Physical Chemistry B, 2002, vol. 106, No. 17, pp. 4356-4363.

Battaglia et al., "Silicon Heterojunction Solar Cell with Passivated Hole Selective $MoO_x$ Contact", Applied Physics Letters, 2014, vol. 104, pp. 113902-1-113902-5.

Bi et al., "Using a Two-step Deposition Technique to Prepare Perovskite ($CH_3NH_3PbI_3$) for Thin Film Solar Cells Based on $ZrO_2$ and $TiO_2$ Mesostructures", Royal Society of Chemistry Advances, 2013, vol. 3, pp. 18762-18766.

Bi et al., "Effect of Different Hole Transport Materials on Recombination in $CH_3NH_3PbI_3$ Perovskite-Sensitized Mesoscopic Solar Cells", The Journal of Physical Chemistry Letters, 2013, vol. 4, No. 9, pp. 1532-1536.

Bisquert et al., "Interpretation of the Time Constants Measured by Kinetic Techniques in Nanostructured Semiconductor Electrodes and Dye-Sensitized Solar Cells", The Journal of Physical Chemistry B, 2004, vol. 108, No. 7, pp. 2313-2322.

Burschka et al., "Sequential Deposition as a Route to High-performance Perovskite-sensitized Solar Cells", Nature, 2013, vol. 499, No. 18, pp. 316-320.

Cai et al., "High Performance Hybrid Solar Cells Sensitized by Organolead Halide Perovskites", Energy & Environmental Science, 2013, vol. 6, No. 5, pp. 1480-1485.

Chen et al., "Planar Heterojunction Perovskite Solar Cells via Vapor-Assisted Solution Process", Journal of the American Chemical Society, 2014, vol. 136, No. 2, pp. 622-625.

Chiang et al., "High Voltage and Efficient Bilayer Heterojunction Solar Cells Based on an Organic-inorganic Hybrid Perovskite Absorber with a Low-cost Flexible Substrate", Physical Chemistry Chemical Physics, 2014, vol. 16, pp. 6033-6040.

Choi et al., "Structure of Methylammonium Lead Iodide Within Mesoporous Titanium Dioxide: Active Material in High-Performance Perovskite Solar Cells", Nano Letters, 2014, vol. 14, No. 1, pp. 127-133.

Christians et al., "An Inorganic Hole Conductor for Organo-Lead Halide Perovskite Solar Cells. Improved Hole Conductivity with Copper Iodide", Journal of the American Chemical Society, 2014, vol. 136, No. 2, pp. 758-764.

Chung et al., "All-solid-state Dye-sensitized Solar Cells with High Efficiency", Nature, 2012, vol. 485, pp. 486-489.

Colella et al., "$MAPbI_{3-x}Cl_x$ Mixed Halide Perovskite for Hybrid Solar Cells: The Role of Chloride as Dopant on the Transport and Structural Properties", Chemistry of Materials, 2013, vol. 25, pp. 4613-4618.

Conings et al., "Perovskite-Based Hybrid Solar Cells Exceeding 10% Efficiency with High Reproducibility Using a Thin Film Sandwich Approach", Advanced Materials, Apr. 2014, vol. 26, No. 13, pp. 2041-2046.

Dasgupta et al., "Enhanced Extraction Rates through Gap States of Molybdenum Oxide Anode Buffer", The Journal of Physical Chemistry C, 2013, vol. 117, No. 8, pp. 9206-9211.

Dloczik et al., "Dynamic Response of Dye-Sensitized Nanocrystalline Solar Cells: Characterization by Intensity-Modulated Photocurrent Spectroscopy", The Journal of Physical Chemistry B, 1997, vol. 101, No. 49, pp. 10281-10289.

Docampo et al., "Efficient Organometal Trihalide Perovskite Planar-heterojunction Solar Cells on Flexible Polymer Substrates", Nature Communications, 2013, vol. 4, Article No. 2761, pp. 1-6.

Docampo et al., "Solution Deposition-Conversion for Planar Heterojunction Mixed Halide Perovskite Solar Cells", Advanced Energy Materials, 2014, vol. 4, pp. 1-6.

Dualeh et al., "Effect of Annealing Temperature on Film Morphology of Organic-Inorganic Hybrid Perovskite Solid-State Solar Cells", Advanced Functional Materials, 2014, vol. 24, No. 21, pp. 3250-3258.

Dualeh et al., "Impedance Spectroscopic Analysis of Lead Iodide Perovskite-Sensitized Solid-State Solar Cells", ACS Nano, 2014, vol. 8, No. 1, pp. 362-373.

Edri et al., "High Open-Circuit Voltage Solar Cells Based on Organic-Inorganic Lead Bromide Perovskite", The Journal of Physical Chemistry Letters, 2013, vol. 4, No. 6, pp. 897-902.

Edri et al., "Chloride Inclusion and Hole Transport Material Doping to Improve Methyl Ammonium Lead Bromide Perovskite-Based

(56) References Cited

OTHER PUBLICATIONS

High Open-Circuit Voltage Solar Cells", Journal of Physical Chemistry Letters, 2014, vol. 5, pp. 429-433.
Eperon et al., "Formamidinium Lead Trihalide: A Broadly Tunable Perovskite for Efficient Planar Heterojunction Solar Cells", Energy & Environmental Science, 2014, vol. 7, No. 3, pp. 982-988.
Eperon et al., "Morphological Control for High Performance, Solution-Processed Planar Heterojunction Perovskite Solar Cells", 2014, vol. 24, No. 1, pp. 151-157.
Etgar et al., "Mesoscopic $CH_3NH_3PbI_3/TiO_2$ Heterojunction Solar Cells", Journal of the American Chemical Society, 2012, vol. 134, No. 42, pp. 17396-17399.
Gao et al., "n-Type Transition Metal Oxide as a Hole Extraction Layer in PbS Quantum Dot Solar Cells", Nano Letters, 2011, vol. 11, pp. 3263-3266.
Green et al., "The Emergence of Perovskite Solar Cells", Nature Photonics, 2014, vol. 8, pp. 506-514.
Gretener et al., "Development of $MoO_x$ Thin Films as Back Contact Buffer for CdTe Solar Cells in Substrate Configuration", Thin Solid Films, 2013, vol. 535, pp. 193-197.
Heo et al., "Efficient Inorganic-organic Hybrid Heterojunction Solar Cells Containing Perovskite Compound and Polymeric Hole Conductors", Nature Photonics, 2013, vol. 7, No. 6, pp. 486-491.
Im et al., "6.5% Efficient Perovskite Quantum-Dot-Sensitized Solar Cell", Nanoscale, 2011, vol. 3, pp. 4088-4093.
Jeon et al., "Efficient Inorganic-Organic Hybrid Perovskite Solar Cells Based on Pyrene Arylamine Derivatives as Hole-Transporting Materials", Journal of the American Chemical Society, 2013, vol. 135, No. 51, pp. 19087-19090.
Jeon et al., "Solvent Engineering for High-performance Inorganic-organic Hybrid Perovskite Solar Cells", Nature Materials, 2014, vol. 13, No. 9, pp. 897-903.
Jang et al., "Voltage-Enhancement Mechanisms of an Organic Dye in High Open-Circuit Voltage Solid-State Dye-Sensitized Solar Cells", ACS Nano, 2011, vol. 5, No. 10, pp. 8267-8274.
Jin et al., "Thousandfold Change in Resistivity in Magnetoresistive La—Ca—Mn—O Films", Science, vol. 264, pp. 413-415.
Juarez-Perez et al., "Role of the Selective Contacts in the Performance of Lead Halide Perovskite Solar Cells", The Journal of Physical Chemistry Letters, 2014, vol. 5, No. 4, pp. 680-685.
Kagan et al., "Organic-inorganic Hybrid Materials as Semiconducting Channels in Thin-film Field-effect Transistors", Science, 1999, vol. 286, No. 5441, pp. 945-947.
Kim et al., "Lead Iodide Perovskite Sensitized All-Solid-State Submicron Thin Film Mesoscopic Solar Cell with Efficiency Exceeding 9%", Scientific Reports, Aug. 21, 2012, vol. 2, Article No. 591, pp. 1-7.
Kim et al., "Mechanism of Carrier Accumulation in Perovskite Thin-Absorber Solar Cells", Nature Communications, 2013, vol. 4, Article No. 2242, pp. 1-7.
Kim et al., "High Efficiency Solid-State Sensitized Solar Cell-Based on Submicrometer Rutile $TiO_2$ Nanorod and $CH_3NH_3PbI_3$ Perovskite Sensitizer", Nano Letters, 2013, vol. 13, pp. 2412-2417.
Kim et al., "Organolead Halide Perovskite: New Horizons in Solar Cell Research", The Journal of Physical Chemistry C, 2014, vol. 118, pp. 5615-5625.
Kojima et al., "Organometal Halide Perovskites as Visible-Light Sensitizers for Photovoltaic Cells", Journal of the American Chemical Society, 2009, vol. 131, No. 7, pp. 6050-6051.
Laban et al., "Depleted Hole Conductor-free Lead Halide Iodide Heterojunction Solar Cells", Energy & Environmental Science, 2013, vol. 6, No. 11, pp. 3249-3253.
Lee et al., "Efficient Hybrid Solar Cells Based on Meso-Superstructured Organometal Halide Perovskites", Science, 2012, vol. 338, No. 6107, pp. 643-647.
Liang et al., "Synthesis and Characterization of Organic-Inorganic Perovskite Thin Films Prepared Using a Versatile Two-Step Dipping Technique", Chemistry of Materials, 1998, vol. 10, No. 1, pp. 403-411.
Liang et al., "Additive Enhanced Crystallization of Solution-Processed Perovskite for Highly Efficient Planar-Heterojunction Solar Cells", Advanced Materials, Jun. 2014, vol. 26, No. 22, pp. 3748-3754.
Liu et al., "Efficient Planar Heterojunction Perovskite Solar Cells by Vapour Deposition", Nature, 2013, vol. 501, pp. 395-398.
Liu et al., "Perovskite Solar Cells with a Planar Heterojunction Structure Prepared Using Room-Temperature Solution Processing Techniques", Nature Photonics, 2014, vol. 8, pp. 133-138.
Maeno et al., "Superconductivity in a Layered Perovskite Without Copper", Nature, 1994, vol. 372, pp. 532-534.
Neale et al., "Size and Shape Control of Nanocrystallites in Mesoporous $TiO_2$ Film", Journal of Materials, 2007, vol. 17, pp. 3216-3221.
Nelson et al., "Trap-limited Recombination in Dye-sensitized Nanocrystalline Metal Oxide Electrodes", Physical Review B, 2001, vol. 63, No. 20, pp. 205321-1-205321-9.
Nicolosi et al., "Liquid Exfoliation of Layered Materials", Science, 2013, vol. 340 pp. 1226419-1-1226419-18.
Noh et al., "Chemical Management for Colorful, Efficient, and Stable Inorganic-Organic Hybrid Nanostructured Solar Cells", Nano Letters, 2013, vol. 13, pp. 1764-1769.
Park, "Organometal Perovskite Light Absorbers Toward a 20% Efficiency Low-Cost Solid-State Mesoscopic Solar Cell", The Journal of Physical Chemistry Letters, 2013, vol. 4, No. 15, pp. 2423-2429.
Park et al., "Enhanced Crystallinity in Organic-Inorganic Lead Halide Perovskites on Mesoporous $TiO_2$ via Disorder-Order Phase Transition", Chemistry of Materials, 2014, vol. 26, No. 15, pp. 4466-4471.
Pellet et al., "Mixed-Organic-Cation Perovskite Photovoltaics for Enhanced Solar-Light Harvesting", Angewandte Chemie, 2014, vol. 53, pp. 3151-3157.
Preda et al., "Films and Crystalline Powder of $PbI_2$ Intercalated with Ammonia and Pyridine", Journal of Materials Science: Materials in Electronics, 2009, vol. 20, Supplement 1, pp. 465-470.
Qin et al., "Inorganic Hole Conductor-Based Lead Halide Perovskite Solar Cells with 12.4% Conversion Efficiency", Nature Communications, 2014, vol. 5, pp. 1-6.
Qiu et al., "All-solid-state Hybrid Solar Cells Based on a new Organometal Halide Perovskite Sensitizer and One-dimensional $TiO_2$ Nanowire Arrays", Nanoscale, 2013, vol. 5, No. 8, pp. 3245-3248.
Saidaminov et al., "High-quality Bulk Hybrid Perovskite Single Crystals within Minutes by Inverse Temperature Crystallization", Nature Communications, Jul. 6, 2015, pp. 1-6.
Schaak et al., "Perovskites by Design: A Toolbox of Solid-State Reactions", Chemistry of Materials, 2002, vol. 14, No. 4, pp. 1455-1471.
Service, "Perovskite Solar Cells Keep on Surging", Science, 2014, vol. 344, p. 458.
Shi et al., "Hole-Conductor-Free Perovskite Organic Lead Iodide Heterojunction Thin-Film Solar Cells: High Efficiency and Junction Property", Applied Physics Letters, 2014, vol. 104, pp. 063901-1 063901-4.
Snaith, "Perovskites: The Emergence of a New Era for Low-Cost, High-Efficiency Solar Cells", The Journal of Physical Chemistry Letters, 2013, vol. 4, No. 21, pp. 3623-3630.
Solbrand et al., "Electron Transport in the Nanostructured $TiO_2$-Electrolyte System Studied with Time-Resolved Photocurrents", The Journal of Physical Chemistry B, 1997, vol. 101, No. 14, pp. 2514-2518.
Stranks et al., "Electron-Hole Diffusion Lengths Exceeding 1 Micrometer in an Organometal Trihalide Perovskite Absorber", Science, 2013, vol. 342, No. 6156, pp. 341-344.
Vasilopoulou et al., "High Performance Organic Light Emitting Diodes Using Substoichiometric Tungsten Oxide as Efficient Hole Injection Layer", vol. 13, 2012, Organic Electronics, pp. 796-806.
Wang et al., "Epitaxial $BiFeO_3$ Multiferroic Thin Film Heterostructures", Science, 2003, vol. 299, pp. 1719-1722.
Wang et al., "Low-Temperature Processed Electron Collection Layers of Graphene/$TiO_2$ Nanocomposites in Thin Film Perovskite Solar Cells", Nano Letters, 2014, vol. 14, pp. 724-730.

(56) References Cited

OTHER PUBLICATIONS

Wojciechowski et al., "Sub-150° C. Processed Meso-superstructured Perovskite Solar Cells with Enhanced Efficiency", Energy & Environmental Science, 2014, vol. 7, pp. 1142-1147.

Wu et al., "Retarding the Crystallization of $PbI_2$ for Highly Reproducible Planar-Structured Perovskite Solar Cells via Sequential Deposition", Energy & Environmental Science, 2014, vol. 7, pp. 2934-2938.

Xing et al., "Long-Range Balanced Electron- and Hole-Transport Lengths in Organic-Inorganic $CH_3NH_3PbI_3$", Science, 2013, vol. 342, No. 6156, pp. 344-347.

Yella et al., "Nanocrystalline Rutile Electron Extraction Layer Enables Low-Temperature Solution Processed Perovskite Photovoltaics with 13.7% Efficiency", Nano Letters, 2014, vol. 14, pp. 2591-2596.

Yin et al., "Unusual Defect Physics in $CH_3NH_3PbI_3$ Perovskite Solar Cell Absorber", Applied Physics Letters, 2014, vol. 104, pp. 063903-1-063903-4.

Yu-Hallada et al., "Photoexcitation and Photoluminescence Study of Coordination Complexes of Lead Diiodide with Pyridine", The Journal of Physical Chemistry, 1990, vol. 94, No. 19, pp. 7518-7523.

Zhang et al., "A Facile Solvothermal Growth of Single Crystal Mixed Halide Perovskite $CH_3NH_3Pb(Br_{1-x}Cl_x)_3$", Chemical Communications, Mar. 2015, vol. 51, No. 37, pp. 7820-7823.

Zhang et al., "Controllable Sequential Deposition of Planar $CH_3NH_3PbI_3$ Perovskite Films via Adjustable Volume Expansion", NANO Letters, 2015, vol. 15, No. 6, pp. 3959-3963.

Zhao et al., "Charge Transport and Recombination in Perovskite $(CH_3NH_3)PbI_3$ Sensitized $TiO_2$ Solar Cells", The Journal of Physical Chemistry Letters, 2013, vol. 4, No. 17, pp. 2880-2884.

Zhao et al., "Effective Hole Extraction Using $MoO_x$-Al Contact in Perovskite $CH_3NH_3PbI_3$ Solar Cells", Applied Physics Letters, 2014, vol. 104, pp. 213906-1-213906-4.

Zhao et al., "Optical Bleaching of Perovskite $(CH_3NH_3)PbI_3$ Through Room-temperature Phase Transformation Induced by Ammonia", Chemical Communications, 2014, vol. 50, No. 13, pp. 1605-1607.

Zhao et al., "$CH_3NH_3Cl$-Assisted One-Step Solution Growth of $CH_3NH_3PbI_3$: Structure, Charge-Carrier Dynamics, and Photovoltaic Properties of Perovskite Solar Cells", The Journal of Physical Chemistry C, 2014, vol. 118, No. 18, pp. 9412-9418.

Zhao et al., "Solid-State Mesostructured Perovskite $CH_3NH_3PbI_3$ Solar Cells: Charge Transport, Recombination, and Diffusion Length", The Journal of Physical Chemistry Letters, 2014, vol. 5, No. 3, pp. 490-494.

Zhao et al., "Efficient Planar Perovskite Solar Cells Based on 1.8 eV Band Gap $CH_3NH_3PbI_2Br$ Nanosheets via Thermal Decomposition", The Journal of the American Chemical Society, 2014, vol. 136, No. 35, pp. 12241-12244.

Zhao et al., "Mesoporous Perovskite Solar Cells: Material Composition, Charge-carrier Dynamics, and Device Characteristics", Faraday Discussions, 2014, vol. 176, pp. 301-312.

Zhao et al., "Three-step Sequential Solution Deposition of $PbI_2$-free $CH_3NH_3PbI_3$ Perovskite", Journal of Materials Chemistry A, 2015, vol. 3, No. 17, pp. 9086-9091.

Zhu et al., "Influence of Surface Area on Charge Transport and Recombination in Dye-Sensitized $TiO_2$ Solar Cells", The Journal of Physical Chemistry B, 2006, vol. 110, No. 50, pp. 25174-25180.

International Search Report and Written Opinion for International (PCT) Application No. PCT/US15/33068, dated Nov. 24, 2015, pp. 1-13.

Ma et al., "A highly efficient mesoscopic solar cell based on $Ch_3NH_3PbI_{3-x}Cl_x$ fabricated via sequential solution deposition," Royal Society of Chemistry, ChemComm, vol. 50, 2014, pp. 12458-12461.

Tan et al., "Thermally Induced Structural Evolution and Performance of Mesoporous Block Copolymer-Directed Alumina Perovskite Solar Cells," ACS Nano, vol. 8, No. 5, 2014, pp. 4730-4739.

Supplementary European Search Report dated Nov. 7, 2017, 5 pages.

Tao, C. et al., "Performance improvement of inverted polymer solar cells with different top electrodes by introducing a $MoO3$ buffer layer," Applied Physics Letters, vol. 93, 2008, 3 pages.

\* cited by examiner

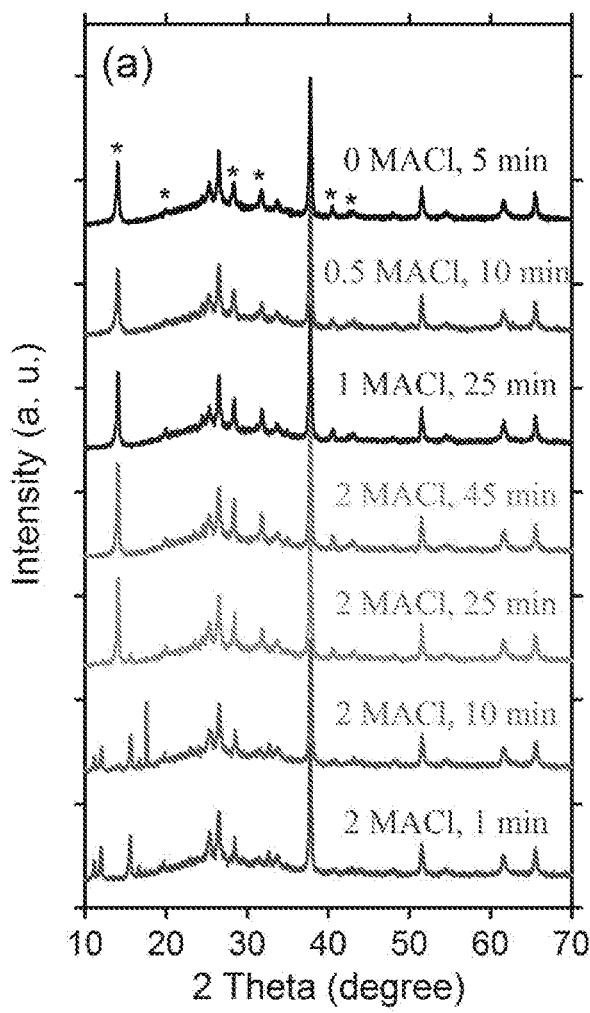
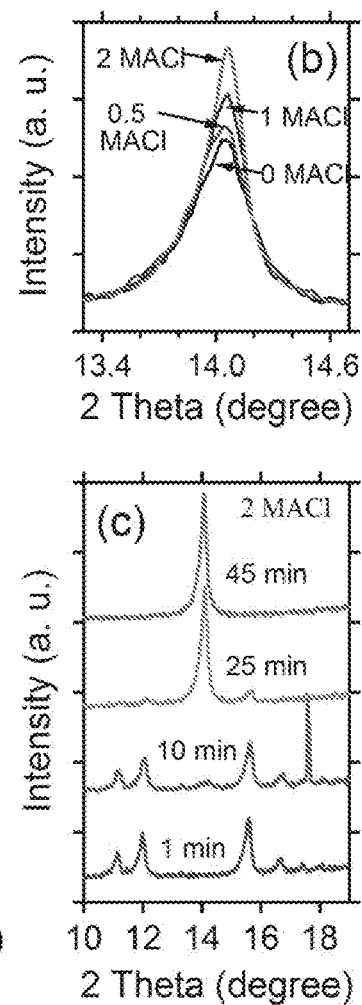
Figure 8a
Figure 8b
Figure 8c

Fig. 9a  Fig. 9b  Fig. 9c  Fig. 9d
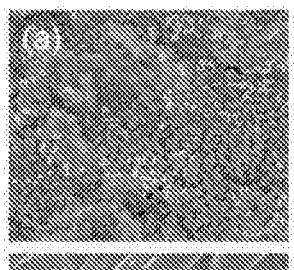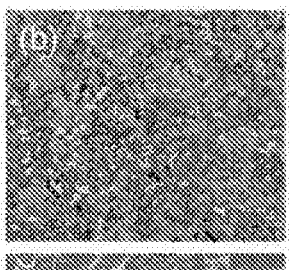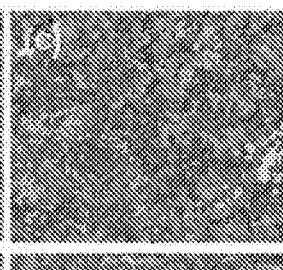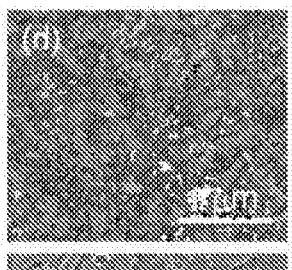
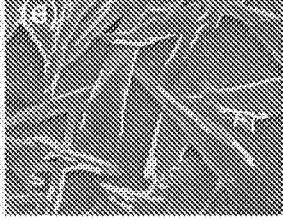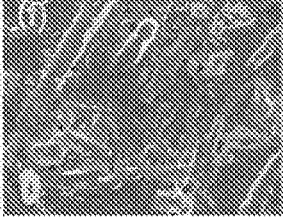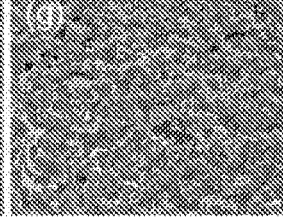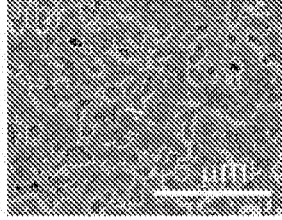
Fig. 9e  Fig. 9f  Fig. 9g  Fig. 9h

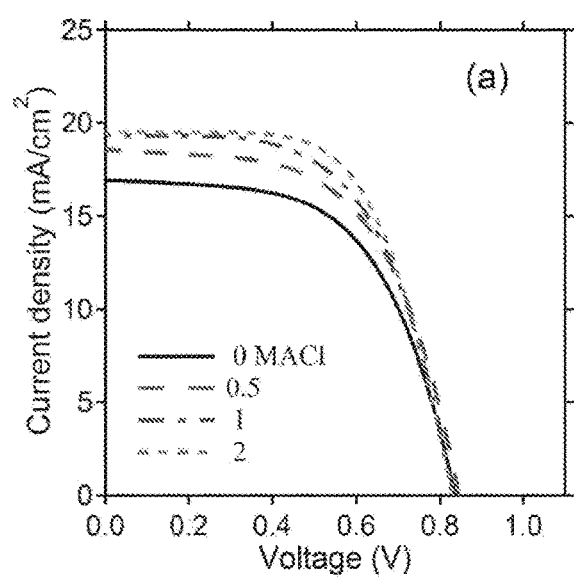
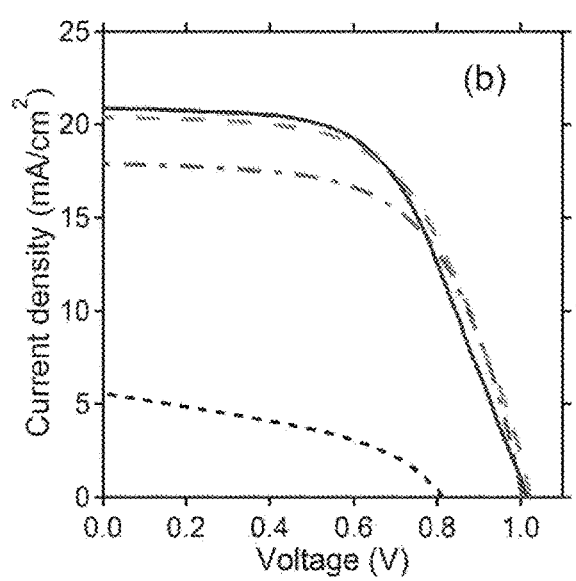
Figure 10a Figure 10b

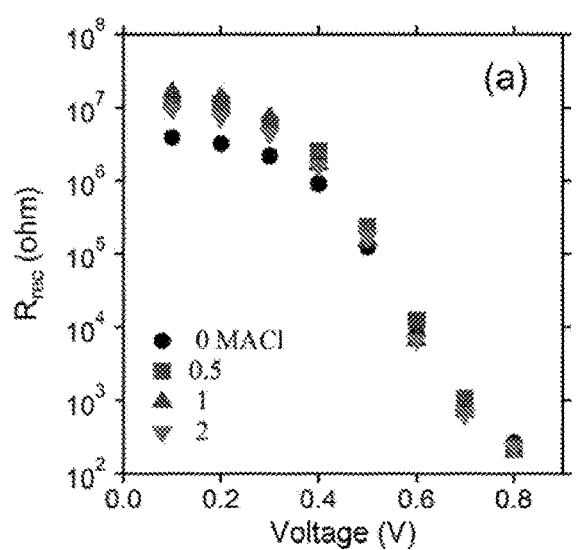 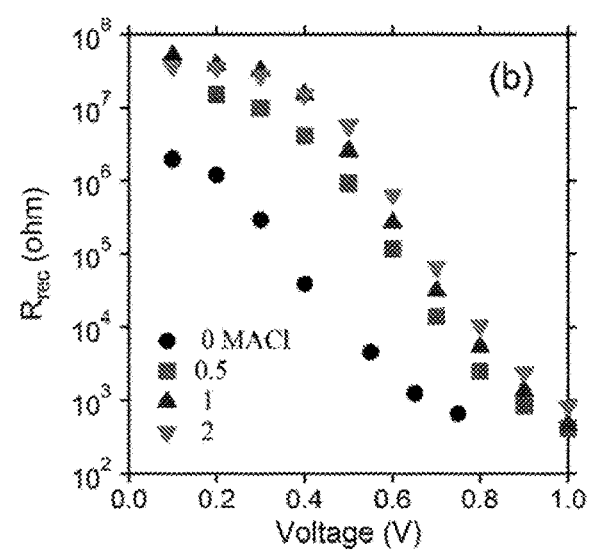
Figure 11a  Figure 11b

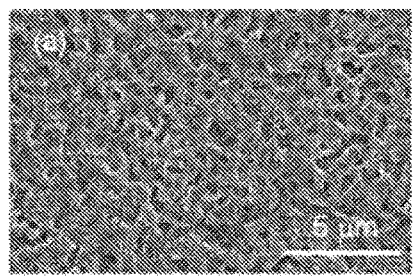 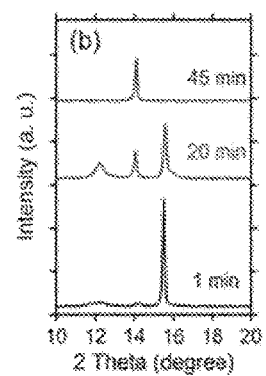
Figure 16a      Figure 16b      Figure 16c

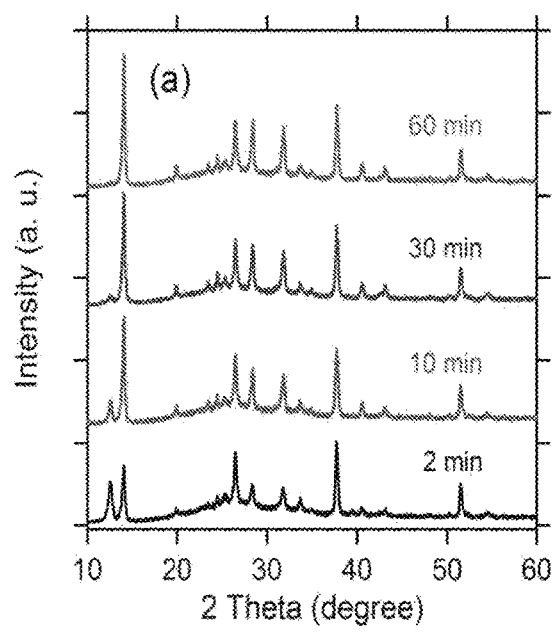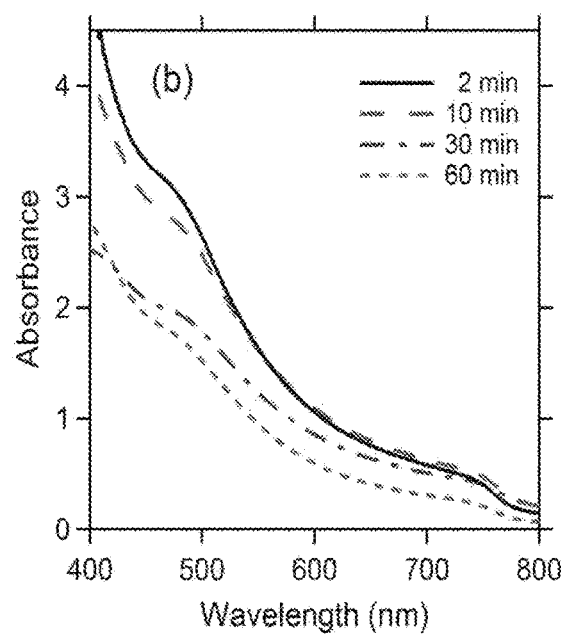
Figure 22a Figure 22b

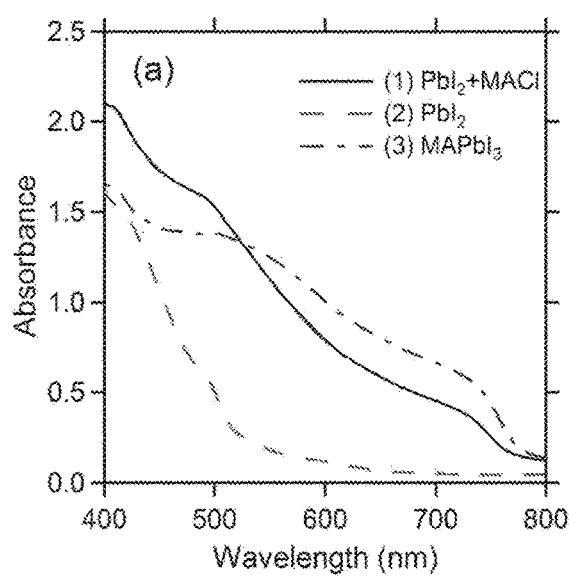
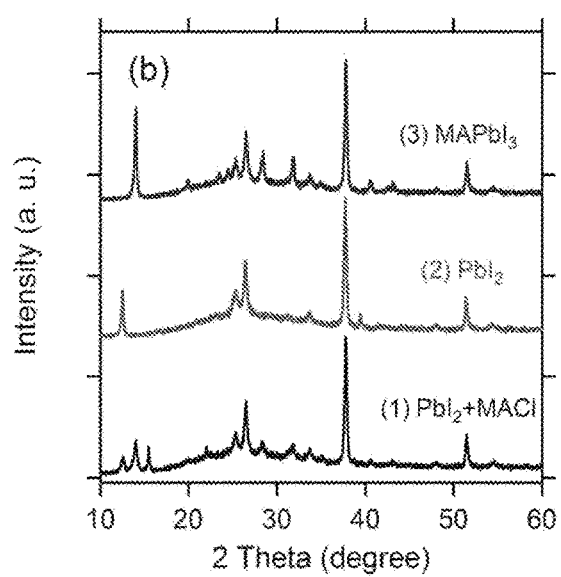
Figure 24a Figure 24b

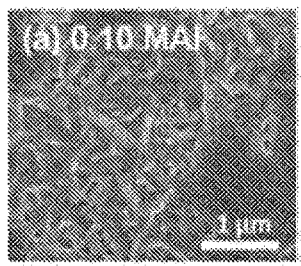 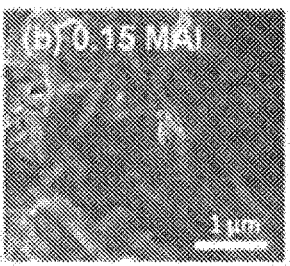 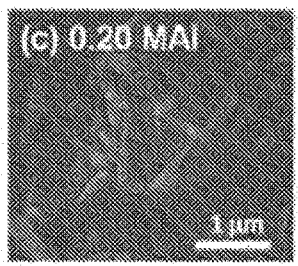 
Figure 30a    Figure 30b    Figure 30c    Figure 30d
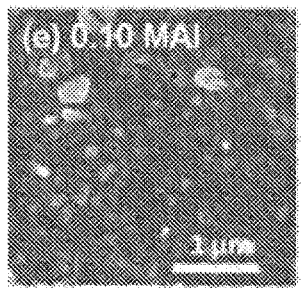 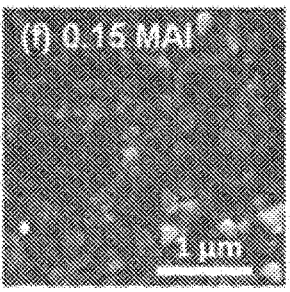 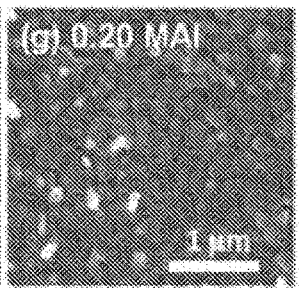 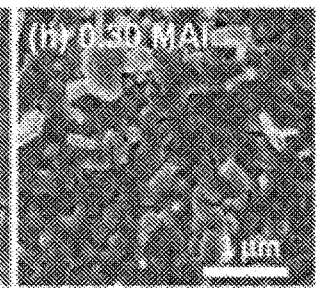
Figure 30e    Figure 30f    Figure 30g    Figure 30h

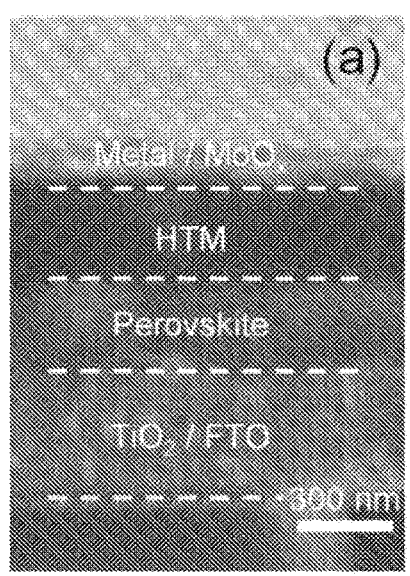
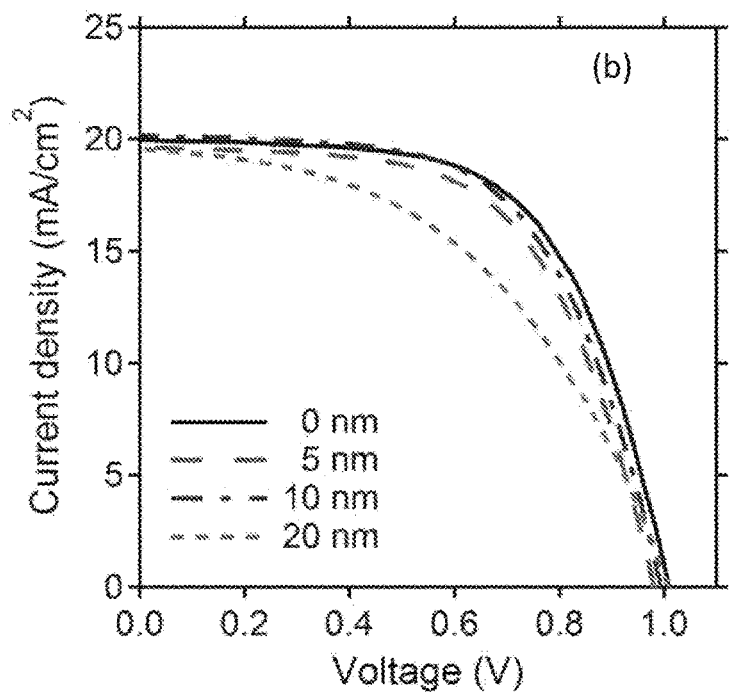
Figure 39a  Figure 39b

METHODS FOR PRODUCING AND USING PEROVSKITE MATERIALS AND DEVICES THEREFROM

CROSS-REFERENCE TO RELATED APPLICATIONS

This application claims the benefit of U.S. Pat. No. 10,566,143, issued on Feb. 18, 2020, which is the national stage entry of PCT Patent Application No. PCT/US15/33068, which claims priority to each of U.S. Provisional Application No. 62/004,020, filed May 28, 2014; U.S. Provisional Application No. 62/061,475, filed Oct. 8, 2014; and U.S. Provisional Application No. 62/103,277, filed Jan. 14, 2015; the contents of which are incorporated herein by reference in their entirety.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND

Perovskite halides (e.g., $CH_3NH_3PbI_3$) represent a new class of light absorbers that have demonstrated tremendous progress in solar cell performance from 3.8% in 2009 to 20.1% in 2015. One attraction for perovskite halides is their bandgap tuning capability. For example, perovskite halide $CH_3NH_3PbI_2Br$ has a bandgap of about 1.8 eV, which makes it suitable for developing tandem or multijunction perovskite-based solar cells. However, perovskite halides have the capability of bandgap tuning by modifying their components building blocks. Moreover, high-efficiency perovskite solar cells can be made by low-cost processing methods. In addition, perovskite halides are not only direct-bandgap absorbers with strong absorption coefficients, but they also demonstrate long electron and hole diffusion lengths. For these and other reasons, perovskite halide solar cell technology is expected to attract strong interest from solar manufacturers and start-ups looking for their next-generation solar cell products.

However, current manufacturing methods typically produce unsatisfactory perovskite halide films. For example, many of the films produced are not full coverage, continuous films, free from pin-holes. In addition, it is very difficult to produce perovskite halide films that are highly crystalline and phase-pure; e.g. films that do not possess residual impurities such as lead iodide. Thus, there remains a need for both better performing perovskite halide films, and solar cells made therefrom, but also improved manufacturing methods for making high performance perovskite halide films.

SUMMARY

An aspect of the present invention is a "two-step" method of forming a perovskite film, where the method includes applying a solution onto a substrate, the solution containing at least two alkyl ammonium halides and a metal halide in a solvent. The method then includes thermally treating the solution, such that the treating removes substantially all of the solvent and at least a portion of at least one of the alkyl ammonium halides from the solution, and the remaining alkyl ammonium halides and the metal halide crystallize to form a final alkyl ammonium metal halide perovskite film on the substrate.

In some embodiments of the present invention, the solution may include two alkyl ammonium halides. The first alkyl ammonium halide may be an alkyl ammonium chloride and the second alkyl ammonium halide may be an alkyl ammonium iodide.

In some embodiments of the present invention, during the treating, an intermediate alkyl ammonium metal halide perovskite film may form where the intermediate film may include at least two halogen elements, which then transform to the final perovskite film that includes at least one halogen element. In other embodiments, the intermediate perovskite film may include two halogen elements and the final perovskite film comprises one halogen element. In still further embodiments, the two halogen elements may be chlorine and iodine and the one halogen element may be iodine.

In some embodiments of the present invention, the intermediate perovskite film may include at least one of a methyl ammonium metal iodide and a methyl ammonium metal chloride, or a methyl ammonium metal dihalide comprising iodide and chloride. In some embodiments of the present invention, the final perovskite film may be a methyl ammonium metal iodide.

In some embodiments of the present invention, the alkyl group for the at least two alkyl ammonium halides may be at least one of a methyl group, an ethyl group, a propyl group, or a butyl group. In some embodiments of the present invention, each of the at least two alkyl ammonium halides may have a halogen from at least one of fluorine, chlorine, bromine, iodine, or astatine, such that the halogen for each alkyl ammonium halide is different from the halogen of each of the remaining alkyl ammonium halides. In some embodiments, a first alkyl ammonium halide may be alkyl ammonium chloride with a second alkyl ammonium halide with a halogen selected from bromine, iodine, or astatine.

In some embodiments of the present invention, a metal of the metal halide may be at least one of lead, tin, germanium, or any other metal in the 2+ valence state. In some embodiments of the present invention, the solvent may be at least one polar solvent. In still further embodiments of the present invention, the solvent may be at least one of dimethysulfoxide, dimethylformamide, γ-butyrolactone, or N-methyl-2-pyrrolidone.

In some embodiments of the present invention, the metal halide and the alkyl ammonium iodide may be present in the solution at a molar ratio of about one to one (1:1). In still further embodiments, the alkyl ammonium iodide and the alkyl ammonium chloride may be present in the solution at a molar ratio ranging from about 1:0.1 to about 1:4. In still further embodiments, at least one of the alkyl ammonium halides, or the metal halide may be present in the solution at a concentration ranging from about 0.1 M to about 3.0 M.

In some embodiments of the present invention, the thermally treating may include heating the solution at a temperature ranging from about 20° C. to about 250° C. In some further embodiments of the present invention, the thermally treating comprises heating the solution for a period of time ranging from about 30 seconds to about 6 hours.

A further aspect of the present invention is a "three-step" method of forming a perovskite film, where the method includes applying a first solution onto a substrate, the first solution containing in a first solvent, a first alkyl ammonium halide with a first halogen, and a metal halide with a second halogen different from the first halogen. The method then includes completing a first thermal treatment of the first solution to form a first film of the metal halide on the substrate, followed by contacting a second solution with the first film, the second solution containing in a second solvent, a second alkyl ammonium halide with the second halogen, such that the second alkyl ammonium halide reacts with the first film to form a final crystalline alkyl ammonium metal halide perovskite film that is substantially free of the first film and the first halogen.

In some embodiments of the present invention, the "three-step" method may further include, during at least a portion of the contacting, completing a second thermal treatment of the second solution and the first film. In some embodiments of the present invention, the first thermal treatment may form an unstable intermediate film that may include the metal halide and an alkyl ammonium metal halide with the first halogen, such that the intermediate film subsequently changes to form the first metal halide film.

In some embodiments of the present invention, the first halogen and the second halogen may include fluorine, chlorine, bromine, iodine, or astatine. In other embodiments, the first halogen may have a lower molecular weight than the second halogen. In still further embodiments, the first halogen is chlorine and the second halogen is iodine.

In some embodiments of the present invention, an alkyl group for at least one of the first alkyl ammonium halide or the second alkyl ammonium halide may include at least one of a methyl group, an ethyl group, a propyl group, or a butyl group. In some embodiments of the present invention, a metal of the metal halide may include at least one of lead, tin, germanium, or any other metal in the 2+ valence state.

In some embodiments of the present invention, the first solvent may include at least one polar solvent. In some further embodiments, the second solvent comprises isopropyl alcohol.

In some embodiments of the present invention, the metal halide and the first alkyl ammonium halide may be present in the first solution at a molar ratio ranging from about 1:0.1 to about 1:3. In some further embodiments, at least one of the metal halide and the first alkyl ammonium halide may be present in the first solution at a concentration ranging from about 0.1 M to about 3.0 M. In still further embodiments, the second alkyl ammonium halide may be present in the second solution at a concentration ranging from 0.1 mg/ml solvent to about 100 mg/ml solvent.

In some embodiments of the present invention, at least one of the thermal treatments may include heating at least one of the solutions at a temperature ranging from about 40° C. to about 250° C. In further embodiments, at least one of the thermal treatments may include heating at least one of the solutions for a period of time ranging from about 30 seconds to about 6 hours.

A further aspect of the present invention is a method for manufacturing a solar cell, the method including in order, forming a perovskite film on a substrate by any one of the methods described herein, depositing a hole-transport layer on the perovskite film, depositing a molybdenum oxide layer on the hole-transport layer, and depositing an aluminum layer on the molybdenum oxide layer.

A further aspect of the present invention is a solar cell including in order, transparent conducting oxide substrate, an electron-transport layer on the transparent conducting oxide substrate, a perovskite halide film on the electron-collecting layer, a hole-transport layer on the perovskite halide film, a molybdenum oxide layer on the hole-transport layer, and an aluminum layer on the molybdenum oxide layer.

In some embodiments of the present invention, the electron-transport layer may be titanium oxide. In further embodiments of the present invention, the hole-transport layer may be spiro-OMeTAD.

BRIEF DESCRIPTION OF THE DRAWINGS

FIGS. 8a-c depict (a) XRD patterns of $CH_3NH_3PbI_3$ on mesoporous $TiO_2$ film as a function of the MACl amount in the precursors for different annealing times at 100° C.; magnified views of the XRD patterns (b) near 14 degrees for perovskite films using 0-2 MACl with their respective optimum annealing time; and magnified views of the XRD patterns (c) for the 2-MACl sample with different annealing time (1-45 min).

FIGS. 9a-h are typical SEM images of perovskite $CH_3NH_3PbI_3$ grown on (a-d) mesoporous $TiO_2$ film and (e-h) planar $TiO_2$ compact layer with different MACl amount (a, e: 0; b, f: 0.5; c, g: 1; d, h: 2).

FIGS. 10a-b are graphs showing the effect of MACl on the J-V curves of (a) mesostructured and (b) planar perovskite $CH_3NH_3PbI_3$ solar cells.

FIGS. 11a-b are graphs showing the effect of MACl on the recombination resistance ($R_{rec}$) as a function of voltage for (a) mesostructured and (b) planar perovskite $CH_3NH_3PbI_3$ solar cells.

FIGS. 16*a-c* are (a) SEM image, (b) XRD patterns, and (c) EDX analysis of the mixed halide $CH_3NH_3PbI_{3-x}Cl_x$ prepared from the precursor containing MAI and $PbCl_2$ (3:1 molar ratio).

FIGS. 22*a-b* are graphs showing the effect of the dipping time in the 10 mg MAI/mL IPA solution on the evolution of (a) XRD patterns and (b) UV-vis absorption spectra for the perovskite films deposited from 1.0 M $PbI_2$ precursor on mesoporous $TiO_2$ film.

FIGS. 24*a-b* are graphs showing (a) UV-vis absorption spectra and (b) XRD patterns of the films in each of the three production steps: (1) initial film formation from precursor of mixed $PbI_2$ and MACl; (2) thermally decomposed $PbI_2$ film from the second step; (3) final $CH_3NH_3PbI_3$ formed after dipping in MAI solution after the third step.

FIGS. 30*a-h* are typical SEM images of $PbI_2$.xMAI (x=0.1, 0.15, 0.2, and 0.3) precursor films (a-d) and $CH_3NH_3PbI_3$ films prepared from their respective precursor films as indicated (e-h).

FIGS. 39*a-b* illustrate (a) typical cross-sectional SEM image of a planar $FTO/TiO_2/CH_3NH_3PbI_3$/spiro-MeOTAD/$MoO_x$/Metal (Ag or Al) solar cell; and (b) the effect of $MoO_x$ interlayer thickness on the J-V characteristics of perovskite $CH_3NH_3PbI_3$ solar cells using Ag top contact.

DETAILED DESCRIPTION

Figure 1:
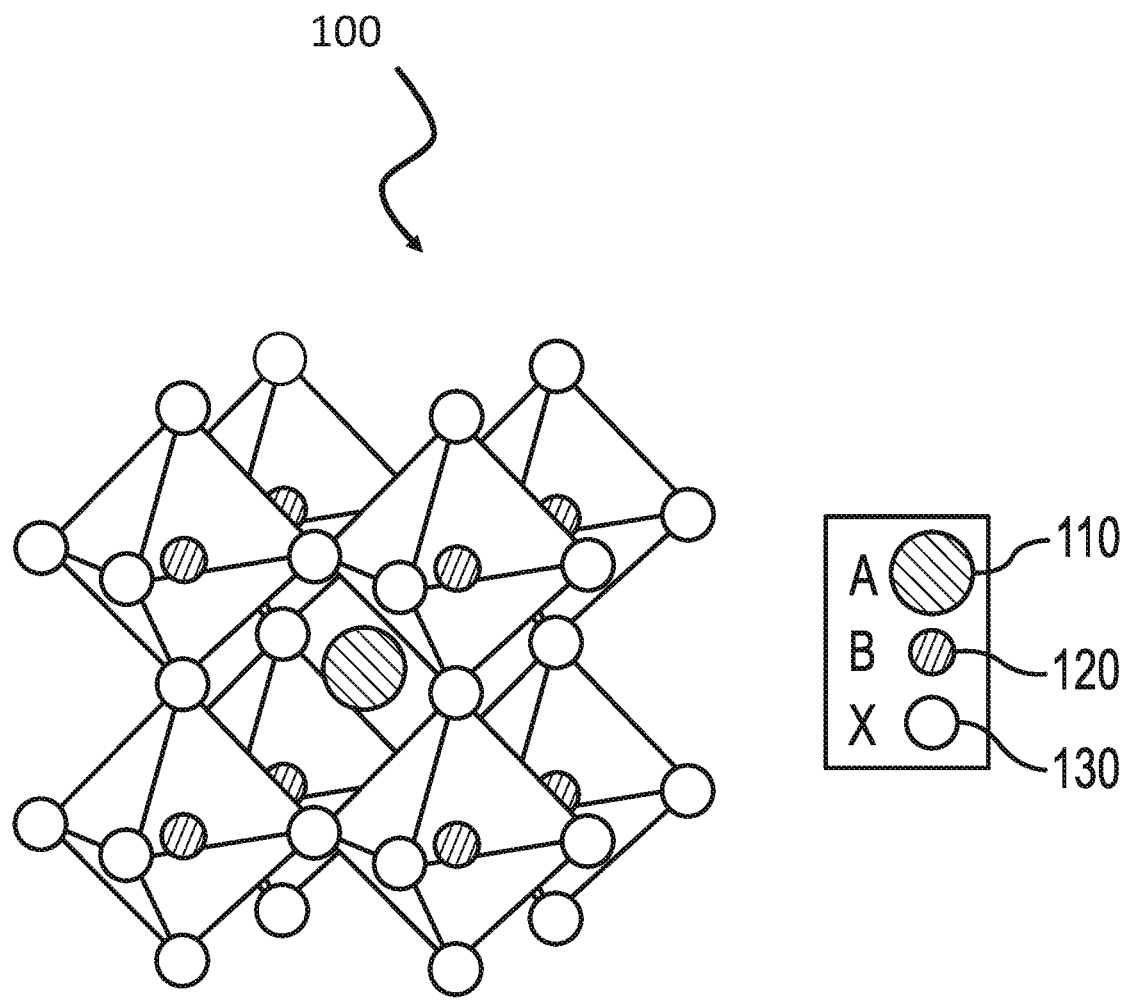
FIG. 1 illustrates an alkyl ammonium metal halide perovskite crystal structure, according to exemplary embodiments of the present invention.

FIG. 1 illustrates that perovskite halides 100 may organize into cubic crystalline structures and may be described by the general formula $ABX_3$, where X (130) is an anion and A (110) and B (120) are cations, typically of different sizes (A typically larger than B). In a cubic unit cell, the B-cation 120 resides at the eight corners of a cube, while the A-cation 110 is located at the center of the cube with twelve X-anions 130 centrally located between B-cations 120 along each edge of the unit cell. Typical inorganic perovskites include calcium titanium oxide (calcium titanate) minerals such as, for example, $CaTiO_3$ and $SrTiO_3$. In some embodiments of the present invention, the A-cation 110 may include a nitrogen-containing organic compound such as an alkyl ammonium compound. The B-cation 120 may include a metal and the X-anion 130 may include a halogen.

Additional examples for A-cations 110 include organic cations and/or inorganic cations. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH^{3+}$), ethylammonium ($CH_3CH_2NH^{3+}$), propylammonium ($CH_3CH_2CH_2NH^{3+}$), butylammonium ($CH_3CH_2CH_2CH_2NH^{3+}$), formamidinium ($NH_2CH=NH^{2+}$), and/or any other suitable nitrogen-containing organic compound. In other examples, A-cations 110 may include an alkylamine. Thus, A-cations 110 may include an organic component with one or more amine groups. For example, an A-cation 110 may be an alkyl diamine halide such as formamidinium ($CH(NH_2)_2$).

Examples of metal B-cations 120 include, for example, lead, tin, germanium, and or any other 2+ valence state metal that can charge-balance the perovskite halide 100. Examples for the X-anion 130 include halogens: e.g fluorine, chlorine, bromine, iodine and/or astatine. In some cases, the perovskite halide may include more than one X-anions 130, for example pairs of halogens; chlorine and iodine, bromine and iodine, and/or any other suitable pairing of halogens. In other cases, the perovskite halide 100 may include two or more halogens of fluorine, chlorine, bromine, iodine, and/or astatine.

Thus, A-cation 110, B-cation 120, and X-anion 130 may be selected within the general formula of $ABX_3$ to produce a wide variety of perovskite halides 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite halide 100 may have more than one halogen element, where the various halogen elements are present in none integer quantities; e.g. x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Figure 2:
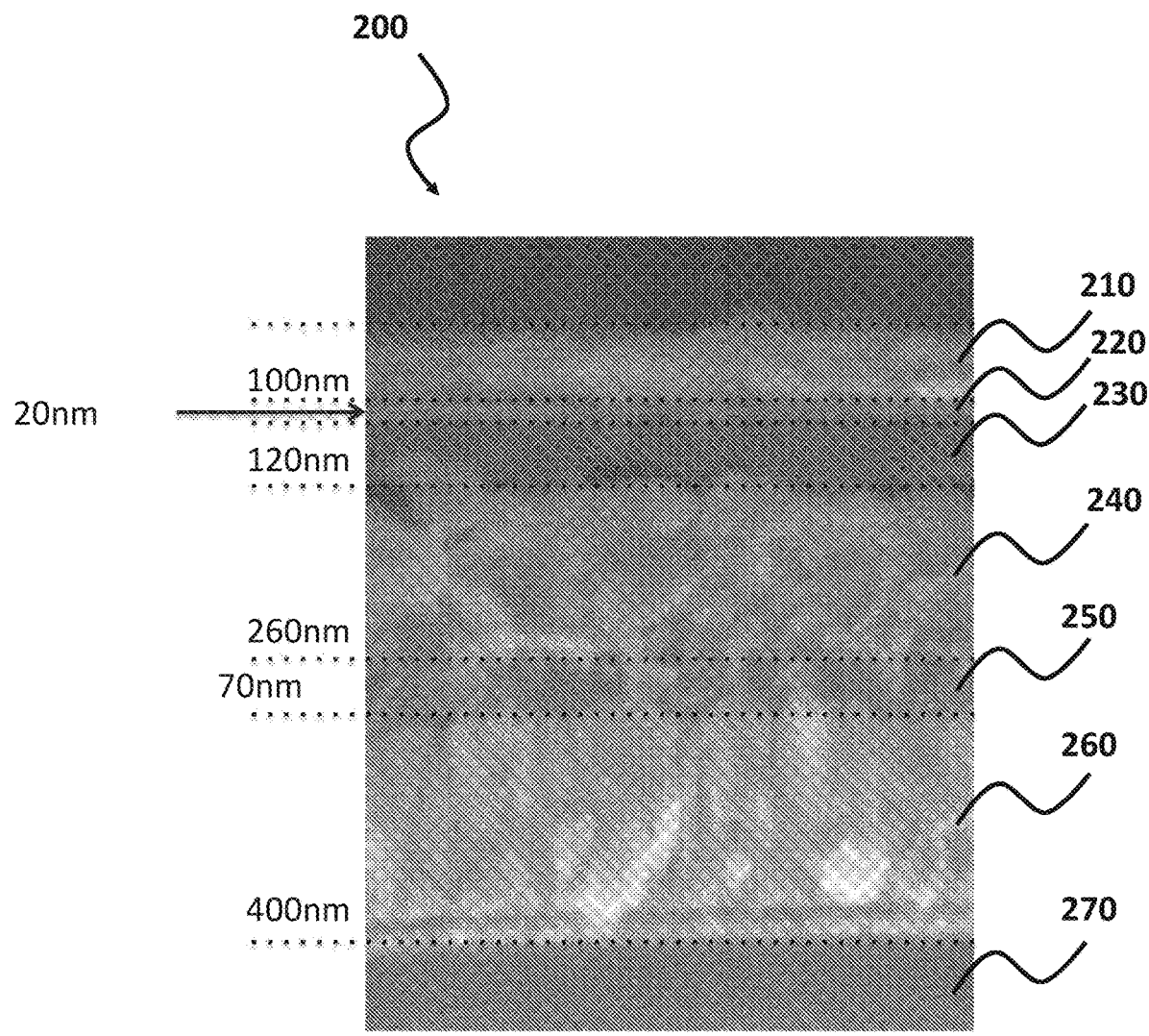
FIG. 2 illustrates a solar cell constructed with a perovskite halide film and molybdenum oxide/aluminum top contact, according to exemplary embodiments of the present invention.

FIG. 2 illustrates a solar cell 200 constructed with a perovskite halide absorbing layer 240. In this example, the perovskite halide absorbing layer 240 is positioned between an electron-transport layer 250 and a hole-transport layer 230. In some cases, the electron-transport layer 250 may be constructed from titanium dioxide and the hole-transport layer 230 may be constructed from Spiro-OMeTAD (2,2',7,7'-tetrakis-(N,N-di-p-methoxyphenyl-amine)-9,9'-spirobifluorene). In addition, FIG. 2 illustrates that the solar cell 200 has a bottom contact layer 260 positioned on a transparent substrate 270. The bottom contact layer 260 may be any suitable transparent conducting oxide layer, for example fluorine-doped tin oxide. The transparent substrate 270 may be glass or any other suitable material. FIG. 2 also illustrates that the solar cell 200 may include a top contact constructed from a layer of molybdenum oxide 220 and aluminum 210. Embodiments of the present invention similar to that shown in FIG. 2 have demonstrated superior results, especially regarding performance stability over time.

In some embodiments of the device summarized in FIG. 2, a solar cell utilizing a molybdenum oxide/aluminum (i.e., $MoO_x/Al$) top contact with a $CH_3NH_3PbI_3$ absorber layer demonstrated an efficiency of about 11.4%. The molybdenum oxide/aluminum may replace noble/precious metals (e.g., Au or Ag) as a top contact for extracting photogenerated holes. As described in detail herein, the device performance of perovskite solar cells using a $MoO_x/Al$ top contact may be comparable to that of cells using silver as the standard top contact. In addition, analysis of impedance spectroscopy measurements suggests that using a thin (e.g., 10-nm thick) $MoO_x/Al$ top contact does not appear to affect charge-recombination properties of perovskite solar cells.

Figure 3:
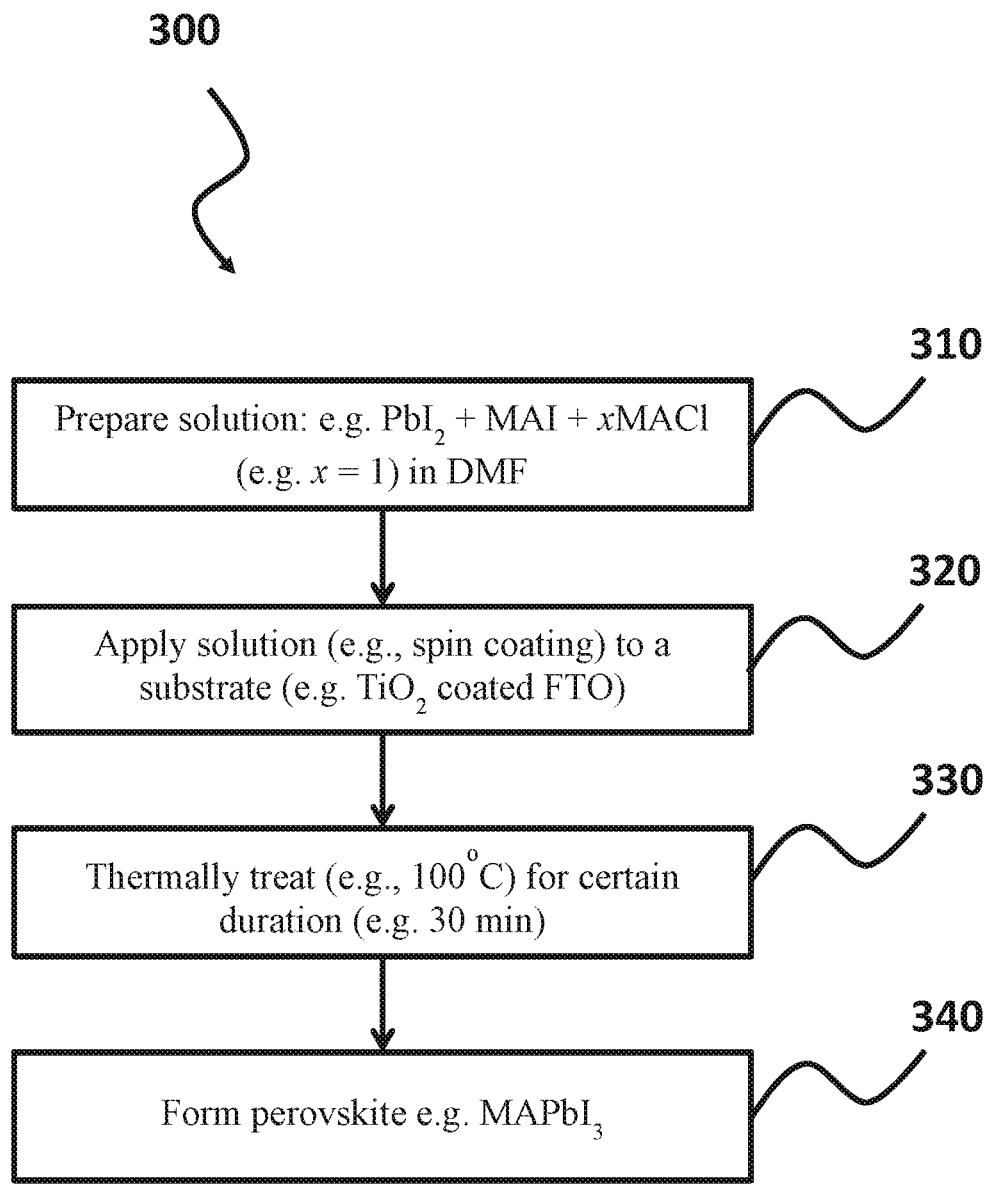
FIG. 3 illustrates a schematic of a "one-step" method for making a methyl ammonium lead iodide perovskite, according to exemplary embodiments of the present invention.

FIG. 3 illustrates a method 300 of making perovskite halide films. The method may begin at 310 with preparing a solution that may include a solvent, a metal halide, and at least two alkyl ammonium halides. For example, the solvent may be dimethylformamide (DMF), the metal halide may be lead iodide ($PbI_2$) and the two alkyl ammonium halides may be methyl ammonium iodide (MAI—$CH_3NH_3I$) and methyl ammonium chloride (MACl—$CH_3NH_3Cl$).

Once the solution is prepared, it may be deposited or applied 320 to a suitable substrate; e.g. a titanium oxide surface on a transparent conducting oxide layer. The depositing 320 may be accomplished by any suitable means, for example, spin coating, dip coating, curtain coating, etc. In the process of depositing 320, at least a portion of the solvent may be removed from the solution. The depositing 320 may be followed by thermal treatment 330. Thermal treatment 330 may include heating the solution to at least one specified target temperature, resulting in the removal of any remaining solvent and at least one of the alkyl ammonium halides. In some cases the thermal treatment 330 may include a temperature ramp, such that the solution is heated over a specified range of temperature over a specified period of time. Alternatively, the solution may be allowed "dry" in ambient conditions, for example, at room temperature. For example, referring again to FIG. 3, a solution of DMF, lead iodide, MAI, and MACl may be heated to about 100° C. where the solution is maintained at that temperature for about 30 minutes, resulting in the removal of substantially all of the DMF and substantially all of the MACl, resulting in the formation 340 of the target perovskite halide film on the substrate; methyl ammonium lead halide perovskite ($CH_3NH_3PbI_3$). In some cases, the thermal treatment step 330 may remove substantially all of the solvent. However, in other cases small amounts of solvent may remain in the final target perovskite film.

Figure 4:
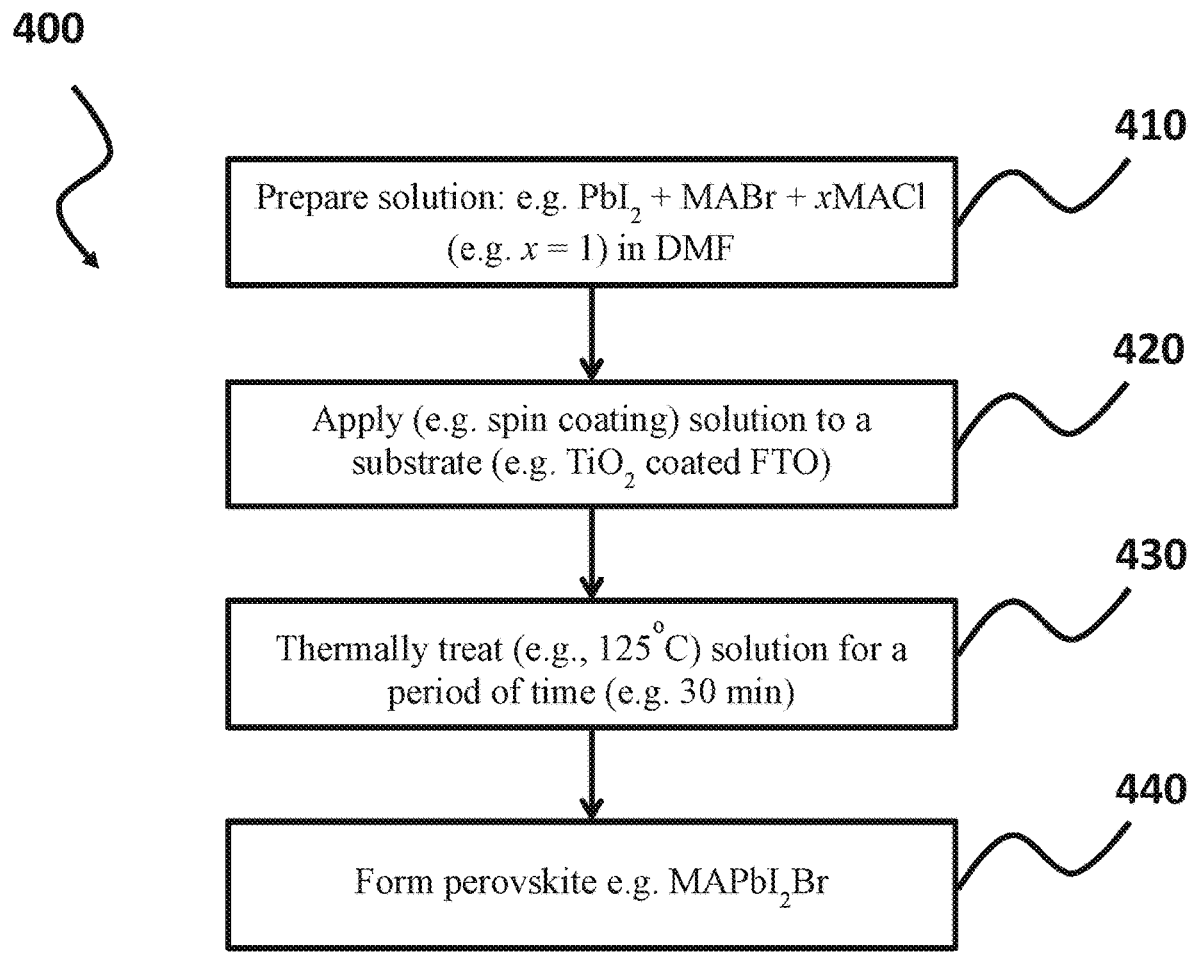
FIG. 4 illustrates a schematic of a "one-step" method for making a methyl ammonium lead iodide bromide perovskite, according to exemplary embodiments of the present invention.

However, the methods described herein need not be limited to producing halide perovskites containing only one halogen element. FIG. 4 illustrates another example of the present invention, a method 400 that may produce a perovskite dihalide (e.g. containing two halogen elements). In this example, the method may begin with preparing 410 a solution containing a metal halide and two alkyl ammonium halides in a solvent (e.g. DMF), where each of these three compounds contain a different halogen. For example, the metal halide may be lead iodide, the first alkyl ammonium halide may be methyl ammonium bromide (MABr), and the second alkyl ammonium halide may be MACl. Once the solution preparation 410 is completed, it may be applied 420 to a suitable substrate (e.g. spin coating). After applying 420, the solution may then be thermally treated 430 to form 440 the final perovskite halide film on the substrate. Referring again to FIG. 4, the final perovskite halide film may be methyl ammonium lead di-iodide bromide ($CH_3NH_3PbI_2Br$).

As will be demonstrated later in this disclosure, the methods summarized in FIGS. 3 and 4 may provide significantly improved final perovskite halide films, and better performing solar cells that incorporate these films. Referring again to the example illustrated in FIG. 3, referred to herein as a "one-step" method, the solution may begin with an equimolar mixture of MAI and $PbI_2$ in the solvent. The use of the second alkyl ammonium halide, the MACl, strongly affects the crystallization process during the thermal treatment step 330 leading to the formation 340 of the final $CH_3NH_3PbI_3$ film. The final $CH_3NH_3PbI_3$ film made by this method demonstrates enhanced absorption of light and significantly improved coverage of the $CH_3NH_3PbI_3$ film on its substrate. This method has been shown to provide measurable improvement relative to some of the standard one-step solution methods used to manufacture $CH_3NH_3PbI_3$ films. For example, usage of MACl as the second alkyl ammonium halide has shown solar cells performance improvement from about 2% to 12% for a planar cell structure and from about 8% to 10% for a mesostructured device architecture, relative to one-step methods utilizing only one alkyl ammonium halide (MAI).

Figure 5:
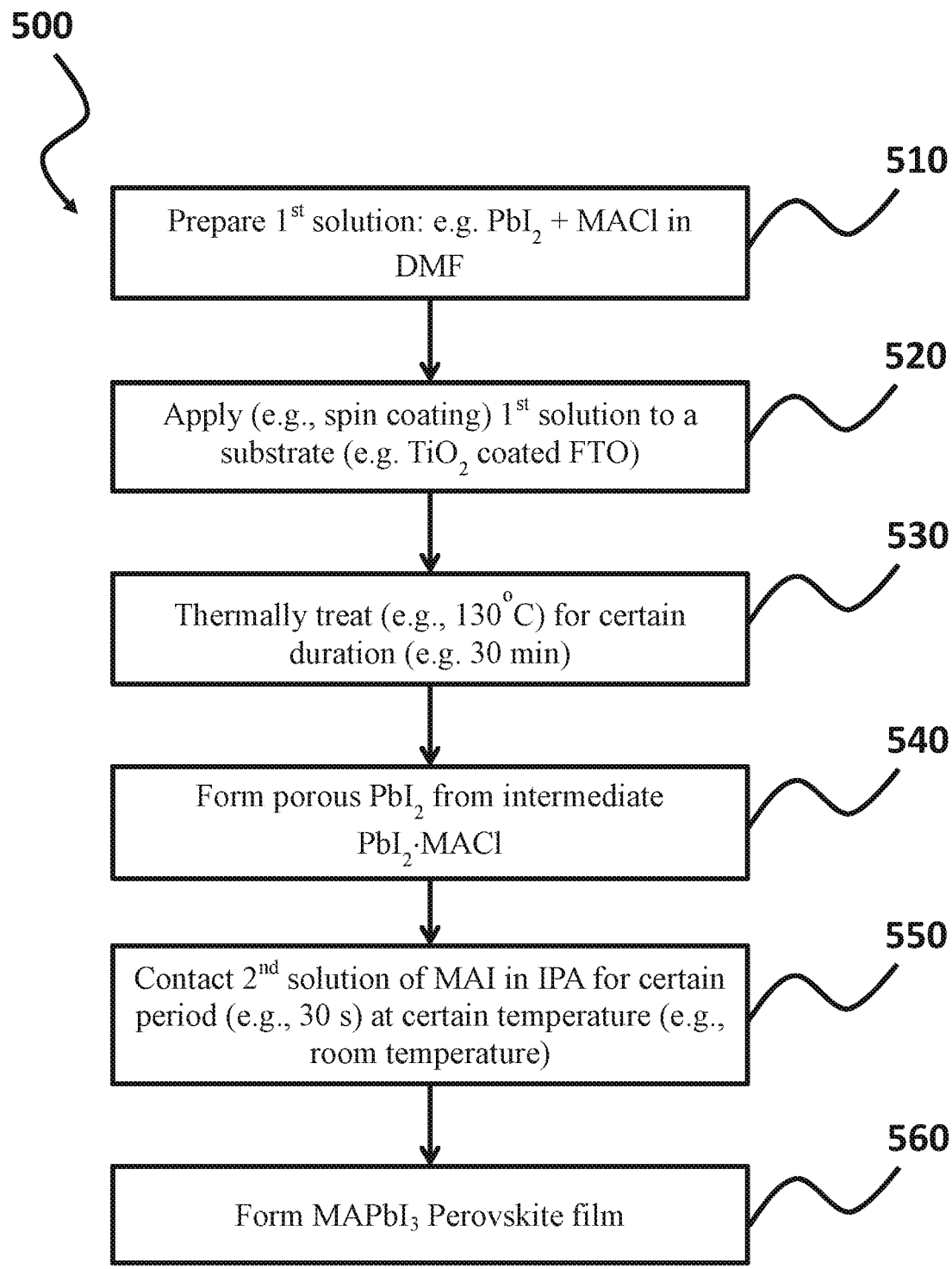
FIG. 5 illustrates a schematic of a "three-step" method for making an alkyl ammonium metal halide perovskite, according to exemplary embodiments of the present invention.

FIG. 5 illustrates another exemplary method 500 for forming final perovskite halide films, according to some embodiments of the present invention. This method 500 may begin with preparing 510 a first solution containing a metal halide and an alkyl ammonium halide in a first solvent, where the metal halide and the alkyl ammonium halide contain different halogens. Once the first solution is prepared, it may be applied 520 to a substrate. The applying step 520 may be by spin coating, dip coating, curtain coating, and/or any other suitable solution technique. For the case of spin coating, the applying step 520 may remove some or substantially all of the first solvent. Once applied, the solution may be thermally treated 530. The thermal treatment step 530 may include heating the solution to a final target temperature and then maintaining the solution at that target temperature for a defined period of time. In some cases the thermal treatment 530 may include a temperature ramp, such that the solution is heated over a specified range of temperature over a specified period of time. Alternatively, the solution may be allowed to "dry" in ambient conditions, for example, at room temperature. The thermal treatment step 530 will cause the formation of an intermediate film that includes the metal halide and the alkyl ammonium halide. However, this intermediate film is only a transitory film. Eventually the thermal treating 530 removes substantially all of the alkyl ammonium halide and transforms 540 the intermediate film into a porous metal halide film. In some cases there may be significant residual alkyl ammonium halide (e.g., MAI, MACl, or MABr) in the porous (or compact) metal halide film. Next, the metal halide film may be contacted 550 with a second solution. This second solution may include a second alkyl ammonium halide, different from the first, in a second solvent, which may be different from the first solvent. In some cases, the contacting step 550 will transform 560 the metal halide film into the final target perovskite halide film. In other cases, the contacting step 550 may also include thermally treating the second solution, by heating the solution above ambient and/or room temperature.

Referring again to FIG. 5, the specific method 500 example shown, begins with preparing 510 a first solution of lead iodide and MACl in DMF solvent. The first solution is then applied 520 to a substrate by spin-coating the solution onto a substrate (e.g. titanium dioxide on a transparent conducting oxide film). After the first solution has been applied 520 to the substrate, the solution is then thermally treated 530 by heating the solution to about 130° C. and maintaining that temperature for about 30 minutes. The thermal treatment step 530 results in the temporary formation of an intermediate film of $PbI_2$*MACl, which then degrades/decomposes/transforms 540 to a porous lead iodide film that is substantially free of solvent and MACl. The lead iodide film is then brought into contact 550 with a second solution prepared from a MAI in a second solvent, in this case isopropyl alcohol (IPA). In this case, the contacting step 550 is for 30 seconds at room temperature. However, in other embodiments, the contacting step 550 may be for longer or shorter periods of time at temperatures above room temperature (e.g. up to 250° C.).

In general the second solvent should have a lower solubility for the final target perovskite film than the solubility of the first solvent for the final target perovskite film. IPA is one example, however, other common alcohol-containing solvents may also be used; e.g. butyl alcohol.

In some cases the thermal treatment step 530 may remove substantially all of the first solvent. However, in other cases small amounts of the first solvent may remain in the porous metal halide film. Similarly, in some cases the contacting step 550 may remove substantially all of the second solvent. However, in other cases small amounts of the second solvent may remain in the final target perovskite film.

The method illustrated in FIG. 5 is referred to herein as a "three-step" method. In summary, the three-step method may be characterized by the formation of a transitory and thermally unstable stoichiometric precursor film of an $PbI_2$.alkyl ammonium halide film (e.g. deposited onto a mesoporous $TiO_2$ substrate), which then during thermal treatment 530 transforms to a porous $PbI_2$ film. In some cases (e.g., "drying" at room temperature) there may be significant residual alkyl ammonium halide in the $PbI_2$ film. Then, during a second contacting step 550, the $PbI_2$ film is converted into $CH_3NH_3PbI_3$ by contacting the $PbI_2$ film with a solvent solution (e.g. IPA) of $CH_3NH_3I$. Thus, embodiments of the three-step method shown in FIG. 5, enable the formation of metal halide film, through the thermal decomposition of the metal halide.alkyl ammonium halide precursor film. This transition from a transitory intermediate film to a lead halide film enables the rapid conversion of metal halide film to the final target perovskite halide film, without any residual metal halide in the final target perovskite film, which results in improved device performance (e.g. solar cell).

EXAMPLES

The following examples are included to demonstrate certain embodiments of the present disclosure. It should be appreciated by those of skill in the art that the techniques disclosed in the examples which follow represent techniques discovered by the inventors to function well in the practice of the subject matter of the present disclosure, and thus can be considered to constitute modes for its practice. However, those of skill in the art should, in light of the present disclosure, appreciate that many changes can be made to the specific embodiments disclosed herein and still obtain a like or similar result without departing from the spirit and scope of the subject matter of the present disclosure.

Example 1: One Step Method

Disclosed herein is a one-step solution method for preparing perovskite $CH_3NH_3PbI_3$ films. The disclosed one-step solution method includes introducing a second alkyl ammonium halide, MACl, to an equimolar mixture of a first alkyl ammonium halide, MAI, and a metal halide, lead iodide, in solution—to prepare perovskite $CH_3NH_3PbI_3$ on a substrate. Examples of substrates that may be used include mesoporous and planar $TiO_2$ substrates. Optical and structural characterizations show that the use of one or more alkyl ammonium halides adjusts the crystallization process for forming $CH_3NH_3PbI_3$. Depending on the amount of alkyl ammonium halides in the precursor solution, the crystallization process may occur in a time period ranging from a few minutes to several tens of minutes. Using two or more alkyl ammonium halides not only improves absorption of $CH_3NH_3PbI_3$ but also enhances the $CH_3NH_3PbI_3$ coverage on planar substrates, leading to significant improvement of device performance. In this Example, methyl ammonium chloride (MACl) was used as a second alkyl ammonium halide and was mixed into a solvent solution containing MAI and $PbI_2$), to generate final target perovskite halide films of $CH_3NH_3PbI_3$. Charge transport and recombination properties were examined by intensity-modulated photocurrent/photovoltage spectroscopies (IMPS/IMVS) and impedance spectroscopy (IS).

Experimental Setup and Device Fabrication

Transparent conducting substrate and mesoporous $TiO_2$ films were fabricated. Initially, fluorine-doped transparent conducting $SnO_2$-coated glass substrate was pre-patterned by etching with Zn powder and ~25 wt % HCl solution for about 2 minutes. The patterned FTO substrate was then cleaned by soaking in ~5 wt % NaOH in alcohol for ~16 hours and then rinsing it sequentially with deionized (DI) water and ethanol. The cleaned FTO substrate was subsequently coated with a compact $TiO_2$ layer by spray pyrolysis using 0.2 M Ti(IV) bis(ethyl acetoacetate)-diisopropoxide in 1-butanol solution at ~450° C., followed by annealing at ~450° C. for about one hour. The 20-nm-sized $TiO_2$ nanoparticles were synthesized utilizing standard methods known in the field. The $TiO_2$ paste, together with ~6 wt % of the 20-nm $TiO_2$ nanoparticles, were mixed with terpineol and ethyl cellulose, and then screen-printed with 3-μm emulsion thickness on the patterned FTO substrates. The printed mesoporous $TiO_2$ film was annealed at ~500° C. for about 0.5 hours. The average film thickness was determined by an Alpha-Step 500 surface profiler. The $TiO_2$ films were then soaked in ~0.04 M $TiCl_4$ solution at ~65° C. for about 30 minutes, followed by rinsing with DI water and ethanol, and finally dried under $N_2$. The $TiCl_4$-treated $TiO_2$ films (for mesostructured cells) and compact $TiO_2$ films (for planar devices) on patterned FTO were annealed again at ~500° C. for ~30 minutes before the $CH_3NH_3PbI_3$ perovskite films were deposited on these substrates.

In connection with device fabrication steps, $CH_3NH_3I$ (MAI) was synthesized by reacting methylamine (33 wt % ethanol solution) and hydroiodic acid (57 wt % in water, Aldrich) with the molar ratio of 1.2:1 in an ice bath for 2 h with stirring followed by vacuum drying and cleaning with ethyl acetate. $CH_3NH_3Cl$ (MACl) was synthesized by reacting methylamine (33 wt % ethanol solution) and 33 wt % hydrocholoride acid with the molar ratio of 1.2:1 in an ice bath for 2 h with stirring followed by vacuum drying and cleaning with acetonitrile. Four different $CH_3NH_3PbI_3$ precursor solutions were prepared by dissolving 0.693 g $PbI_2$ (1.5 mmol); 0.239 g MAI (1.5 mmol); and 0 g, 0.050 g (0.75 mmol), 0.100 g (1.5 mmol), or 0.200 g (3 mmol) MACl in 2.75 g dimethylformamide (DMF) at room temperature—noted as 0 molar (M) MACl, 0.5 M MACl, 1 M MACl, and 2 M MACl, respectively. Devices were fabricated in ambient condition (unless stated otherwise) as detailed below. The perovskite $CH_3NH_3PbI_3$ precursor solutions were spin-coated onto (1) 650-nm-thick $TiO_2$ mesoporous films on FTO at 3,000 rpm for ~30 seconds for mesostructured cells, and (2) compact $TiO_2$ films on FTO at 2,500 rpm for ~10 seconds. The perovskite-coated films were then annealed on a hotplate at ~100° C. for periods of time ranging from about 5 minutes to about 45 minutes. For both mesostructured and planar perovskite solar cells, a hole-transport material (HTM) solution was spin-coated on the perovskite-covered $TiO_2$ electrodes at 4,000 rpm for ~30 seconds. The HTM solution consisted of 0.1 M 2,2',7,7'-tetrakis-(N,N-di-p-methoxyphenyl-amine)-9,9'-spirobifluorene (spiro-MeO-TAD), 0.035 M bis(trifluoromethane)sulfonimide lithium salt (Li-TFSi), and 0.12 M 4-tert-butylpyridine (tBP) in chlorobenzene/acetonitrile (10:1, v/v) solution. Finally, a 150-nm-thick Ag layer was deposited on the HTM layer by thermal evaporation. The active area of each device was about 0.15-0.28 $cm^2$.

In connection with characterizing the fabricated structures, the crystal structures of the perovskite films were measured by X-ray diffraction (XRD, Rigaku D/Max 2200 diffractometer with Cu Kα radiation). The absorption spectra of the mesoporous and planar perovskite films were characterized by a UV/Vis-NIR spectrophotometer (Cary-6000i). The photocurrent-voltage (J-V) characteristic of perovskite $CH_3NH_3PbI_3$ solar cells were measured with a Keithley 2400 source meter under the simulated AM 1.5G illumination (100 mW/$cm^2$; Oriel Sol3A Class AAA Solar Simulator), from open circuit to short circuit with a scan rate of 0.2 V/s. J-V hysteresis was observed when scanned from short circuit to open circuit, especially for planar devices. Charge transport and recombination properties of the mesostructured perovskite cells were measured by intensity-modulated photocurrent and photovoltage spectroscopies. Impedance spectroscopy (IS) was performed using a PARSTAT 2273 workstation with the frequency range of 0.1 Hz-100 kHz and the modulation amplitude of 10 mV. The IS spectra were analyzed using ZView 2.9c software (Scribner Associates).

Results and Discussion

Figure 6:
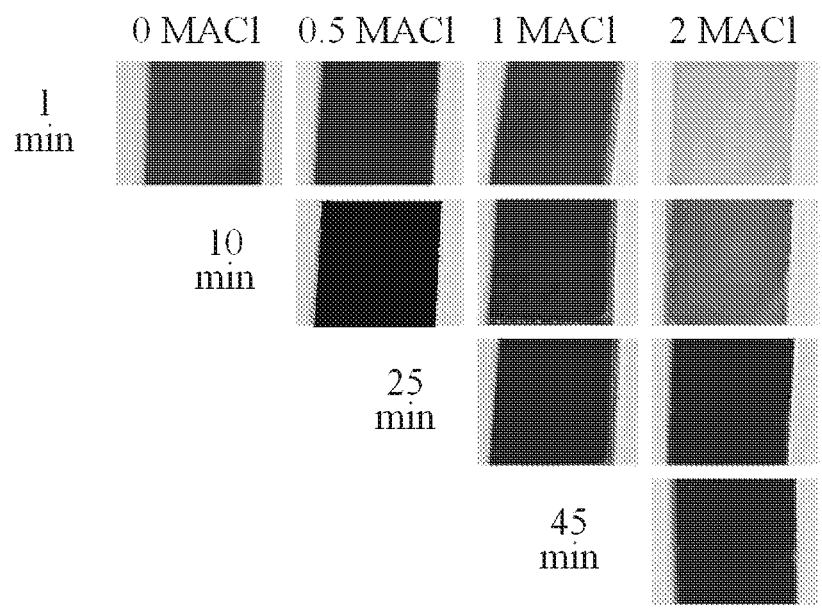
FIG. 6 provides images of the perovskite films prepared from $CH_3NH_3PbI_3$ precursors with different amounts of $CH_3NH_3Cl$ and annealed at 100° C. with varying duration.
Figure 7A:
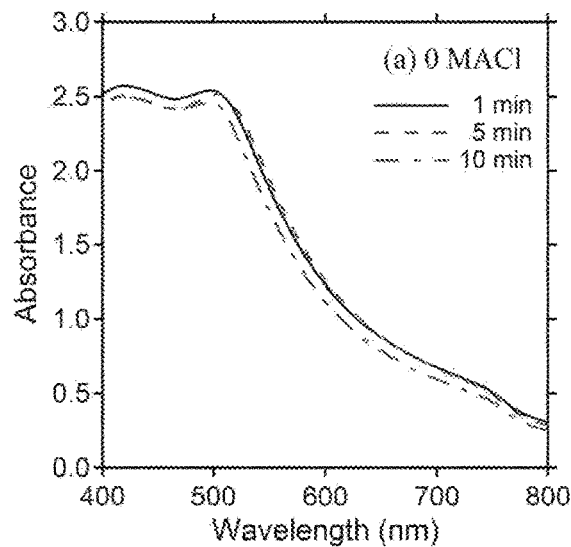
FIGS. 7a-d are UV-vis absorption spectra of perovskite $CH_3NH_3PbI_3$ on mesoporous $TiO_2$ films as a function of annealing time at 100° C. using precursors containing (a) 0 methyl ammonium chloride ("MACl"), (b) 0.5 MACl, (c) 1 MACl, and (d) 2 MACl.
Figure 7B:
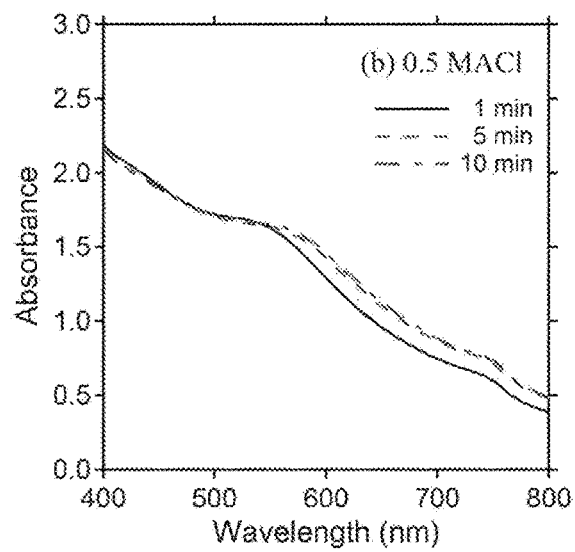
Figure 7C:
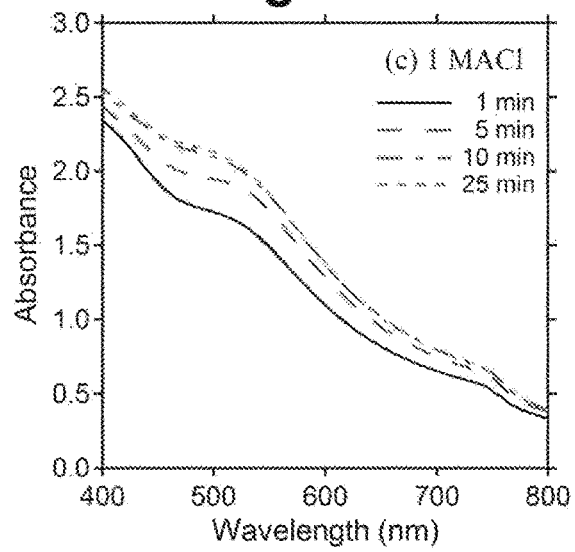

FIG. 6 shows perovskite films prepared from $CH_3NH_3PbI_3$ precursors with different amounts of CH₃NH₃Cl (or MACl; as indicated) and annealed at about 100° C. with varying duration (as indicated). FIG. 6 shows the effect of varying annealing time (from about 1 minute to about 45 minutes) at about 100° C. on the appearance of perovskite $CH_3NH_3PbI_3$ films prepared by using the perovskite precursors with different amounts of added $CH_3NH_3Cl$ (MACl). The perovskite precursor solution contained $PbI_2$, $CH_3NH_3I$ (or MAI), and MACl with a molar ratio of 1:1:x, where x varied from 0 to 2. The thickness of the mesoporous $TiO_2$ film was about 650 nm. When no MACl was used, the perovskite film turned brown within one minute of annealing at 100° C. The absorbance of this film stayed virtually unchanged at 5 minutes and then decreases when annealed for 10 minutes (FIG. 7a). With an increasing amount of MACl added to the precursor solution, the process that turned the perovskite film brown/dark brown with annealing occurred at significantly slower rates. When 2 M MACl was used, it took more than 25 minutes for the perovskite film to turn brown. The annealing-time-dependent absorption spectra for these perovskite films prepared using different amounts of MACl are shown in FIGS. 7a-d. Adding MACl to the precursor solution not only slowed down the perovskite film darkening process but also darkened the color the final perovskite films (the color of the final perovskite film changed from brown with no MACl to dark brown with 1-2 MACl; FIG. 6).

FIGS. 8a-c depict (a) XRD patterns of $CH_3NH_3PbI_3$ on mesoporous $TiO_2$ film as a function of the MACl amount in the precursors for different annealing time at about 100° C.; magnified views of the XRD patterns (b) near 14 degrees for perovskite films using 0-2 M MACl with their respective optimum annealing time; and magnified views of the XRD patterns (c) for the 2 M MACl sample with different annealing times (from about 1 minute to about 45 minutes). Peaks associated with the perovskite $CH_3NH_3PbI_3$ structure are labeled. The other peaks are either from the $TiO_2$/FTO substrate or from a transient intermediate structure related to MACl.

Figure 7D:
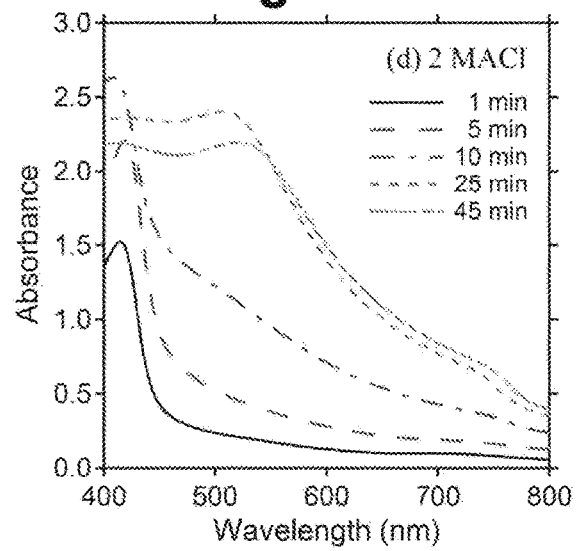

FIG. 8a compares the X-ray diffraction (XRD) patterns of $CH_3NH_3PbI_3$ on mesoporous $TiO_2$ film prepared from precursor solutions containing different amounts of MACl. When the absorption spectrum reached about maximum for each amount of added MACl (about 5 minutes for 0 M MACl, 10 minutes for 0.5 M MACl, 25 minutes for 1M MACl, and 45 minutes for 2 M MACl), the perovskite samples showed the same XRD patterns for $CH_3NH_3PbI_3$. The strongest $CH_3NH_3PbI_3$ (110) peak near 14 degrees increased slightly in intensity and became narrower as the amount of MACl added to the precursor solution increased (FIG. 8b). This suggests an increase in crystallinity or a change in the preferred orientation of the final target perovskites with higher MACl concentration, which, without wishing to be bound by theory, is presumably caused by a slower crystallization process at higher MACl concentration. The perovskite film using 2 M MACl displayed the longest time to complete a color change, and its XRD pattern, as a function of the annealing time (from about 1 minute to about 45 minutes) at ~100° C., are shown in FIG. 8a. The main characteristic $CH_3NH_3PbI_3$ (110) peak near 14 degrees only appeared after about 25 minutes of thermal treatment. At the early stage of thermal treatment (from about 1 minute to about 10 minutes), several intermediate peaks were present (FIG. 8c), which all disappeared after 45 minutes of thermal treatment. Table 1 shows the energy dispersive X-ray (EDX) analysis of the perovskite halide films prepared with the 2 M MACl solution, suggesting that a significant amount of chlorine is initially incorporated into the film with an I:Cl ratio of about 2.7:1.6. The amount of chloride detected in the perovskite film decreased rapidly from 1.6 to 0.1 during thermal treatment times ranging from about 1 minute to about 25 minutes. Longer annealing time (~45 minutes) led to a complete loss of chloride (within the EDX detection limit of 1%). The intermediate XRD peaks for the 2 M MACl samples with short annealing times (from about 1 minute to about 10 minutes) are associated with the incorporation of MACl or its variation, which sublimes from the film with longer annealing times. The significant structural change for the 2 M MACl sample based on XRD measurement is consistent with the changes of its absorption spectra as a function of annealing time (FIG. 7d). Similar to the 2 M MACl sample, no chloride was observed for other samples using zero molar or the other lower amounts of MACl with sufficient annealing times (Table 1). These results suggest that adding MACl to the $CH_3NH_3PbI_3$ precursor solution forms an intermediate crystal structure related to MACl, which slows down the crystallization of $CH_3NH_3PbI_3$. The intermediate structure subsequently appears to disappear with prolonged annealing to finally yield the targeted final perovskite halide film; e.g. $CH_3NH_3PbI_3$.

TABLE 1

Effect of MACl Amount (x) and Annealing Time on the Pb:I:Cl Ratio of Perovskite Films.

| x MACl (time) | Pb | I | Cl |
|---|---|---|---|
| 2 (1 min) | 1 | 2.7 (0.3[a]) | 1.6 (0.2) |
| 2 (10 min) | 1 | 2.6 (0.3) | 0.6 (0.1) |
| 2 (25 min) | 1 | 2.8 (0.3) | 0.1 (0.1) |
| 2 (45 min) | 1 | 2.9 (0.3) | — |
| 1 (25 min) | 1 | 3.0 (0.3) | — |
| 0.5 (10 min) | 1 | 3.0 (0.4) | — |
| 0 (5 min) | 1 | 2.9 (0.4) | — |

[a]The errors of the element ratios are obtained based on the EDX detection limit of 1%.

FIGS. 9a-h show the typical scanning electron microscopy (SEM) images of top views of the annealed perovskite films prepared from precursor solutions with different amounts of MACl. FIGS. 9a-d correspond to the perovskite films deposited on mesoporous $TiO_2$ films (650-nm thickness) using from 0 M to 2 M MACl, respectively. When no MACl was used, some islands of sub-micron-sized $CH_3NH_3PbI_3$ were observed on the top surface of the mesoporous $TiO_2$ film. These islands either disappeared or became less visible when MACl was used. Despite the slight difference of the perovskite appearance on the top surface of $TiO_2$ films, the overall appearances of these four films were similar and adopted the structure of the underlying mesoporous $TiO_2$ films. In contrast, adding MACl to the precursor solution lead to dramatic changes of the morphology of the perovskite $CH_3NH_3PbI_3$ films deposited directly on compact $TiO_2$ on the fluorine-doped tin oxide (FTO) glass substrate. FIG. 9e-h correspond to the perovskite films deposited on compact $TiO_2$ using from 0 M to 2 M MACl, respectively. When no MACl was used, large elongated crystal plates formed, with a significant portion of the substrate being exposed without $CH_3NH_3PbI_3$ coverage. When 0.5 M MACl was used, the large crystal plates partially disappeared and some small crystals started to form, leading to enhanced surface coverage by the perovskite halide films. When using more MACl (1 M and 2 M), the elongated large crystal plates totally disappeared and the substrate was coated with interconnected, relatively small crystals with a high surface coverage. These differences in the surface coverage of perovskite films on the planar substrate are likely to affect final device characteristics.

Figure 12A:
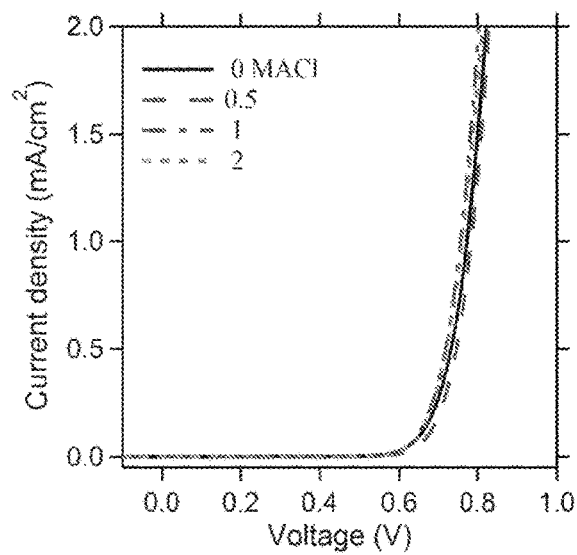
FIGS. 12a-b are dark J-V curves of (a) mesostructured and (b) planar perovskite solar cells as a function of added amount of MACl in the precursor solution for growing $CH_3NH_3PbI_3$.
Figure 12B:
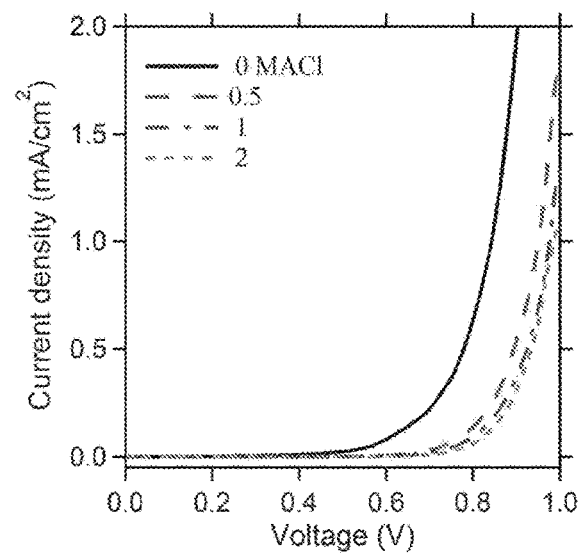

FIGS. 10a-b depict the effect of MACl on the J-V curves of (a) mesostructured and (b) planar perovskite $CH_3NH_3PbI_3$ solar cells. All devices used spiro-MeOTAD as a hole conductor and silver as a top contact. FIG. 10a shows the effect of MACl on the current density-voltage (J-V) characteristics of mesostructured perovskite solar cells based on 650-nm-thick $TiO_2$ mesoporous films. The cell with 0 M MACl demonstrated a short-circuit photocurrent density ($J_{sc}$) of ~16.91 mA/cm², open-circuit voltage ($V_{oc}$) of ~0.835 V, and fill factor (FF) of ~0.583 to yield an efficiency ($\eta$) of ~8.23%. The cell efficiency increased to about 9% to 10% when using MACl (0.5 M to 2 M) to adjust the crystallization process of the perovskite halide; $CH_3NH_3PbI_3$. The efficiency improvement resulted mainly from the higher $J_{sc}$ associated with stronger light absorption (FIGS. 7a-d) due to the use of the MACl. When $CH_3NH_3PbI_3$ was deposited directly on the planar compact $TiO_2$, the device performance (FIG. 10b) showed a similar trend with MACl compared to the mesostructured perovskite solar cells. The degree of performance improvement by MACl for planar devices was greater than the performance improvement for the mesostructured devices. The $J_{sc}$ increased from about 6 mA/cm² to about 18 mA/cm² when the amount of MACl was changed from 0 M to 0.5 M. When 1 M to 2 M MACl was used, the $J_{sc}$ increased to >20 mA/cm². The $V_{oc}$ increased from about 0.8 V for 0 M MACl to >1 V for 0.5 M to 2 M MACl. The FF increased from about 0.41 to a range of 0.57-0.61 for the same changes in MACl concentrations. As a result, the overall efficiency was improved from about 2% (0 M MACl) to ~11% (0.5 M MACl) to ~12% (1 M to 2 M MACl). The device parameters ($J_{sc}$, $V_{oc}$, FF, and $\eta$) for all these mesoporous and planar cells are summarized in Table 2.

mesostructured perovskite solar cells varied significantly with the bias voltage, following an approximately exponential decrease with voltage. All mesostructured perovskite cells exhibited essentially the same voltage dependence of $R_{rec}$, suggesting that using MACl as a second alkyl ammonium halide in the solution has minimal effect on the recombination kinetics in mesostructured cells. In contrast, a strong MACl effect was evident on the voltage dependence of $R_{rec}$ for planar perovskite cells (FIG. 11b.) The $R_{rec}$ values for the planar device not using MACl were generally from about 1 to 2 orders of magnitude lower than those for the planar devices using MACl to assist the crystallization of $CH_3NH_3PbI_3$. Thus, the recombination rate for planar samples prepared without MACl was much faster than that for planar samples prepared with MACl. The observed difference in $R_{rec}$ for these planar devices is consistent with their markedly different dark J-V characteristics (FIGS. 12a-b). The onset voltage of the dark current shifted from about 500 mV to over 700 mV when MACl was used as a second alkyl ammonium halide in the solution. Both $R_{rec}$ and dark J-V results were consistent with the influence of MACl on the morphologies of planar perovskite $CH_3NH_3PbI_3$ films grown directly on the compact $TiO_2$ layer (FIGS. 9e-h). When no MACl was used, a significant portion of the substrate was exposed without $CH_3NH_3PbI_3$ coverage, which may lead to enhanced recombination and decreased solar cell performance.

Figure 13:
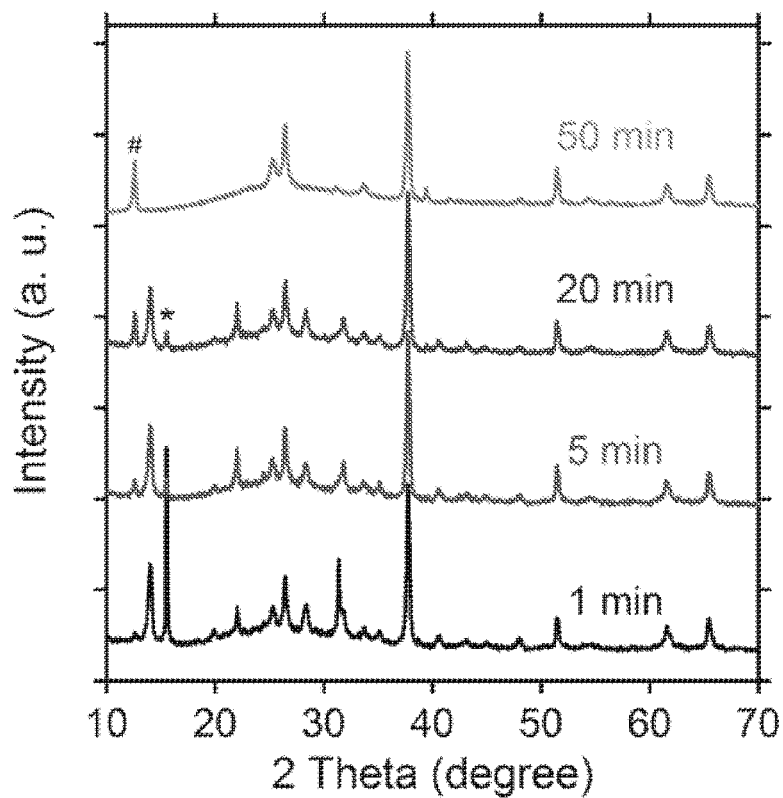
FIG. 13 is a graph showing the effect of annealing time (at 100° C.) on the XRD patterns of perovskite films prepared from precursor containing equimolar $PbI_2$ and MACl. In addition to the main perovskite (110) peak near 14 degrees, two new peaks appear at about 12.6 (denoted by pound) and 15.5 degrees (denoted by asterisk).

To help understand the role of MACl on the perovskite film formation using the disclosed solution mixtures (i.e., a mixture of $PbI_2$, MAI, and a second alkyl ammonium halide with different molar ratios), perovskite films prepared from a solution containing only $PbI_2$ and MACl in the absence of MAI were evaluated. These films will be referred to herein as $PbI_2$-MACl. FIG. 13 shows the effect of thermal treatment time (at about 100° C.) on the XRD patterns of the $PbI_2$-

TABLE 2

Effect of MACl Amount (x) on Short-Circuit Photocurrent Density $J_{sc}$, Open-Circuit Voltage $V_{oc}$, Fill Factor FF, and Conversion Efficiency $\eta$ of Solid-State Mesostructured (Meso) and Planar Perovskite $CH_3NH_3PbI_3$ Solar Cells. The mean values and standard deviations of the PV parameters from 12-20 cells for each type of devices are given in parentheses.

| Cell Type (x) | $J_{sc}$ (mA/cm²) | $V_{oc}$ (V) | FF | $\eta$ (%) |
|---|---|---|---|---|
| Meso (0) | 16.91 | 0.835 | 0.583 | 8.23 |
| | (16.96 ± 0.64) | (0.826 ± 0.013) | (0.545 ± 0.032) | (7.64 ± 0.64) |
| Meso (0.5) | 18.55 | 0.845 | 0.582 | 9.12 |
| | (17.91 ± 0.67) | (0.836 ± 0.016) | (0.552 ± 0.039) | (8.25 ± 0.54) |
| Meso (1) | 19.31 | 0.833 | 0.595 | 9.57 |
| | (19.44 ± 0.61) | (0.824 ± 0.019) | (0.565 ± 0.023) | (9.03 ± 0.33) |
| Meso (2) | 19.48 | 0.829 | 0.625 | 10.09 |
| | (19.38 ± 0.50) | (0.823 ± 0.016) | (0.597 ± 0.020) | (9.52 ± 0.37) |
| Planar (0) | 5.55 | 0.813 | 0.413 | 1.86 |
| | (4.75 ± 0.82) | (0.735 ± 0.060) | (0.375 ± 0.035) | (1.34 ± 0.39) |
| Planar (0.5) | 17.90 | 1.004 | 0.607 | 10.91 |
| | (17.38 ± 0.66) | (0.974 ± 0.022) | (0.561 ± 0.038) | (9.50 ± 0.85) |
| Planar (1) | 20.85 | 1.016 | 0.566 | 11.99 |
| | (20.08 ± 0.76) | (1.019 ± 0.029) | (0.515 ± 0.048) | (10.51 ± 0.92) |
| Planar (2) | 20.36 | 1.023 | 0.581 | 12.10 |
| | (19.84 ± 0.63) | (1.013 ± 0.042) | (0.540 ± 0.029) | (10.85 ± 0.79) |

Figure 15:
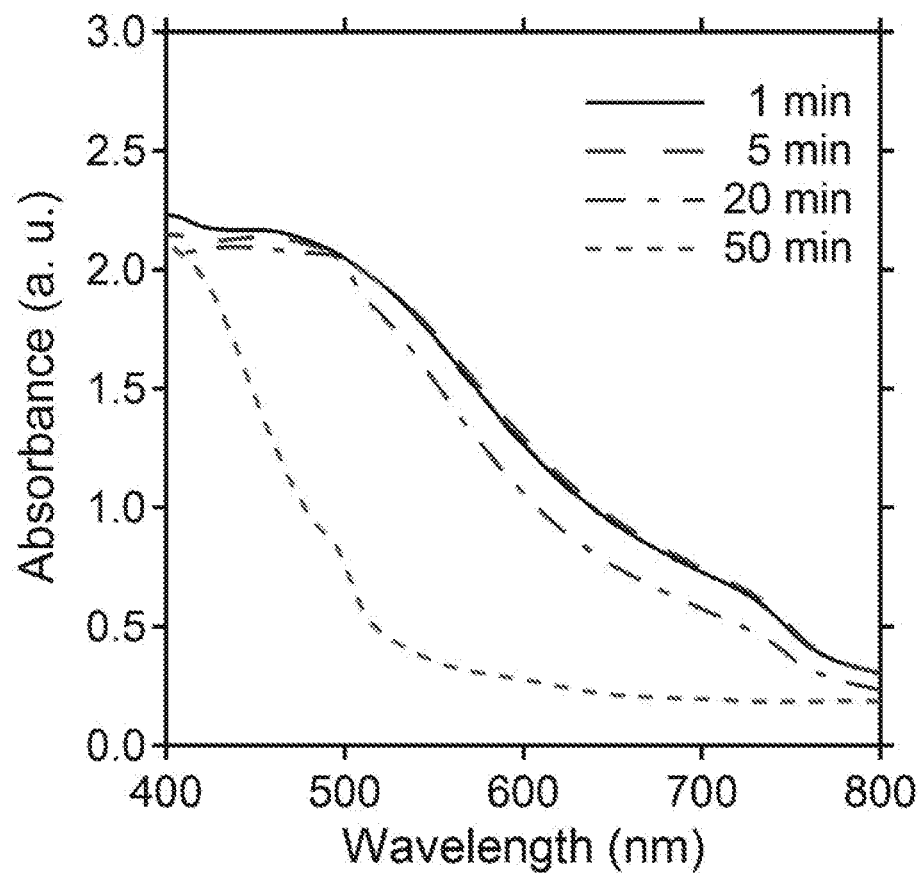
FIG. 15 is a graph displaying UV-vis absorption spectra of perovskite film as a function of annealing time at 100° C. using a precursor containing equimolar mixture of MACl and $PbI_2$.

FIGS. 11a-b illustrate the effect of MACl on the recombination resistance ($R_{rec}$) as a function of voltage for (a) mesostructured and (b) planar perovskite $CH_3NH_3PbI_3$ solar cells. Impedance spectroscopy was used to study the effect of using MACl on the recombination resistance ($R_{rec}$) for mesostructured and planar perovskite $CH_3NH_3PbI_3$ solar cells. FIG. 11a shows the $R_{rec}$ values as a function of voltage for mesostructured perovskite solar cells. The $R_{rec}$ for all MACl films prepared from the stoichiometric solution of $PbI_2$ and MACl with the same Pb concentration as used in the disclosed MACl-added solutions for making perovskite halides films; $CH_3NH_3PbI_3$. After about 1 minute of thermal treatment, the $PbI_2$-MACl film displayed the characteristic perovskite (110) peak near 14 degrees. There were two additional new XRD peaks at about 12.6 and 15.5 degrees, respectively. In contrast, the perovskite film using MACl-added $CH_3NH_3PbI_3$ precursor exhibited different XRD patterns during the early stage of annealing (FIGS. 8a-c). The peak near 12.6 degrees may be attributed to the formation of $PbI_2$, whereas the peak near 15.5 degrees may be attributed to the formation of $CH_3NH_3PbCl_3$. With increased thermal treatment time, the intensities of both the 14- and 15.5-degree perovskite peaks decreased. In contrast, the 12.6-degree $PbI_2$ peak increased with thermal treatment time. With thermal treatment times longer than about 50 minutes, the two perovskite peaks near 14 and 15.5 degrees disappear completely. These XRD results show that the $PbI_2$-MACl film is not stable and decomposes to primarily $PbI_2$ with annealing. Consistent with the XRD results, the absorption spectrum of the $PbI_2$-MACl film also undergoes significant changes with thermal treatment time (FIG. 15). The initial absorption spectrum of the $PbI_2$-MACl film was similar to that of $CH_3NH_3PbI_3$ with a brown color. The film turned yellowish after >20 minutes of thermal treatment, and its absorption spectrum become dominated by the absorption of $PbI_2$, which is consistent with the XRD results. Devices based on the $PbI_2$-MACl films with from 5 minutes to about 10 minutes of thermal treatment only show 2-3% efficiencies. These results suggest that direct reaction between $PbI_2$ and MACl (in the absence of MAI) may not lead to the formation of pure, high quality $CH_3NH_3PbI_3$ perovskite films. Furthermore, the maximum molar ratio of $MACl:PbI_2$ in the $PbI_2$-MACl precursor solutions was 1:1. Using a larger molar ratio for $MACl:PbI_2$ did not lead to a clear, fully-dissolved starting solution. In contrast, the solutions described herein containing $PbI_2$, MAI, and from 0.5 M to 2 M MACl were clear and stable in ambient conditions. These results show that the exact precursor composition is critical to the formation of perovskite films. Thus, the success in preparing $CH_3NH_3PbI_3$ film in this study cannot be associated with $PbI_2$-MACl in the absence of MAI. Without wishing to be bound to by theory, it is believed that the $CH_3NH_3PbI_3$ films, with MACl-added to the MAI and $PbI_2$ starting solution, are formed through a possible intermediate, $MAI.PbI_2.xMACl$, with an unknown crystalline structure. The additive MACl may act as a "sacrificial" agent to form this intermediate and then slowly decompose, volatilize, and/or sublime during the annealing process.

Figure 14A:
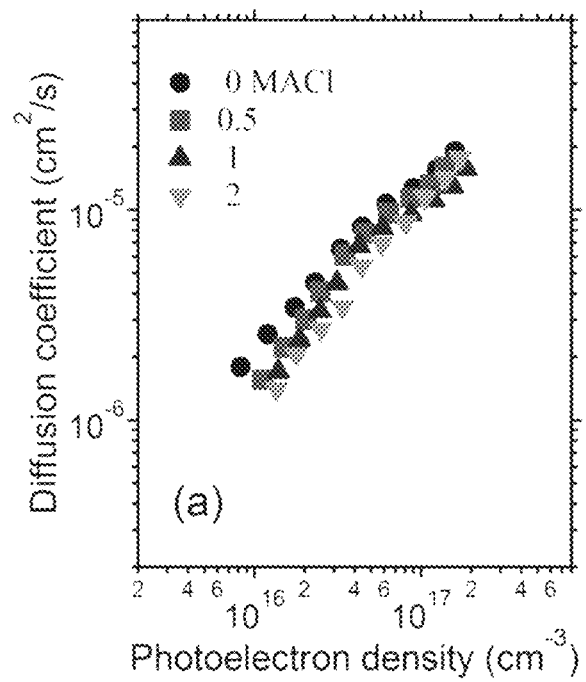
FIGS. 14a-b are graphs displaying the effect of MACl on (a) electron diffusion coefficient as a function of photoelectron density and (b) recombination lifetime as function of voltage in mesostructured perovskite $CH_3NH_3PbI_3$ solar cells.
Figure 14B:
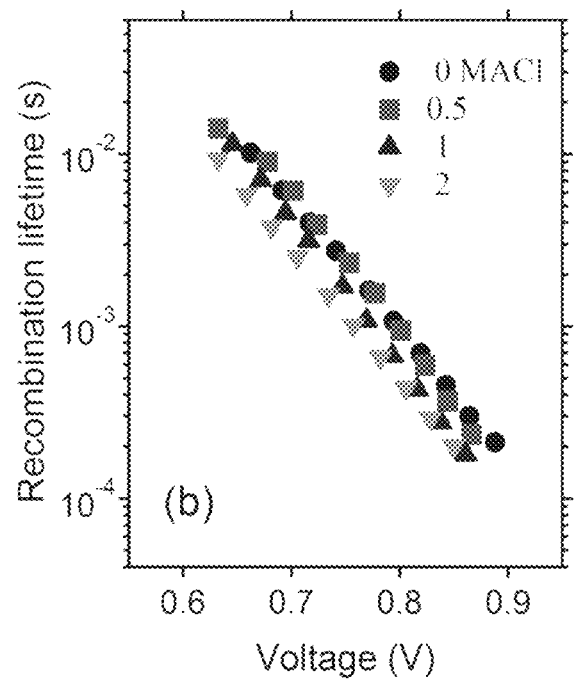

Charge transport and recombination properties in mesostructured perovskite $CH_3NH_3PbI_3$ solar cells were studied by IMPS and IMVS. FIG. 14a shows the effect of using MACl on the diffusion coefficient (D) as a function of photoelectron density (n). All cells exhibited essentially the same power-law dependence ($D \propto n^{1/\alpha-1}$, with $\alpha$ being a disorder parameter) that is attributable to the electrons undergoing multiple trapping and detrapping through the mesoporous electrode film. There was no obvious difference of the D values for mesostructured perovskite cells using different amounts of MACl in the $CH_3NH_3PbI_3$ precursor solution, suggesting that using MACl does not affect the trap distribution on the $TiO_2$ surface. Similarly, no significant difference is observed for the recombination lifetime as a function of voltage for mesostructured cells prepared using different amounts of MACl (FIG. 14b).

FIGS. 16a-c provide (a) an SEM image, (b) XRD patterns, and (c) EDX analysis of the mixed halide $CH_3NH_3PbI_{3-x}Cl_x$ prepared from the starting solution containing MAI and $PbCl_2$ (at about a 3:1 molar ratio). FIG. 16a shows the SEM image of the $CH_3NH_3PbI_{3-x}Cl_x$ film thermally treated at about 100° C. for ~45 minutes. The overall film morphology was similar to the $CH_3NH_3PbI_3$ films prepared using the $CH_3NH_3PbI_3$ precursors with the addition of from about 1 M to about 2 M MACl (FIGS. 9g and 9h). The crystal structure evolution of the $CH_3NH_3PbI_{3-x}Cl_x$ film was examined by the thermal treatment time dependence of the XRD patterns. With ~1 minute of thermal treatment at 100° C., the film exhibited three XRD peaks near 12.6, 14, and 15.5 degrees, which were similar to the XRD patterns of the $PbI_2$-MACl films (FIG. 13) during the early stage of annealing. Again, the perovskite film using MACl added to the MAI and $PbI_2$ starting solution exhibited different XRD patterns during the initial thermal treatment stage, implying the existence of different crystal structures formed during the early stage of thermal treatment. With increasing thermal treatment time, to about 45 minutes, only the perovskite peak near 14 degrees is left for the $CH_3NH_3PbI_{3-x}Cl_x$ film, similar to the XRD patterns for $CH_3NH_3PbI_3$ shown in FIGS. 8a-c. Consistent with this observation, the EDX analysis (FIG. 16c) of the $CH_3NH_3PbI_{3-x}Cl_x$ film shows that with increasing thermal treatment time, the CH ratio decreased from about 1.6:2.7 at 1 about minute to 0.5:2.8 at about 20 minutes. The $CH_3NH_3PbI_{3-x}Cl_x$ film thermally treated for ~45 minutes did not show any detectable trace of chloride.

Figure 17:
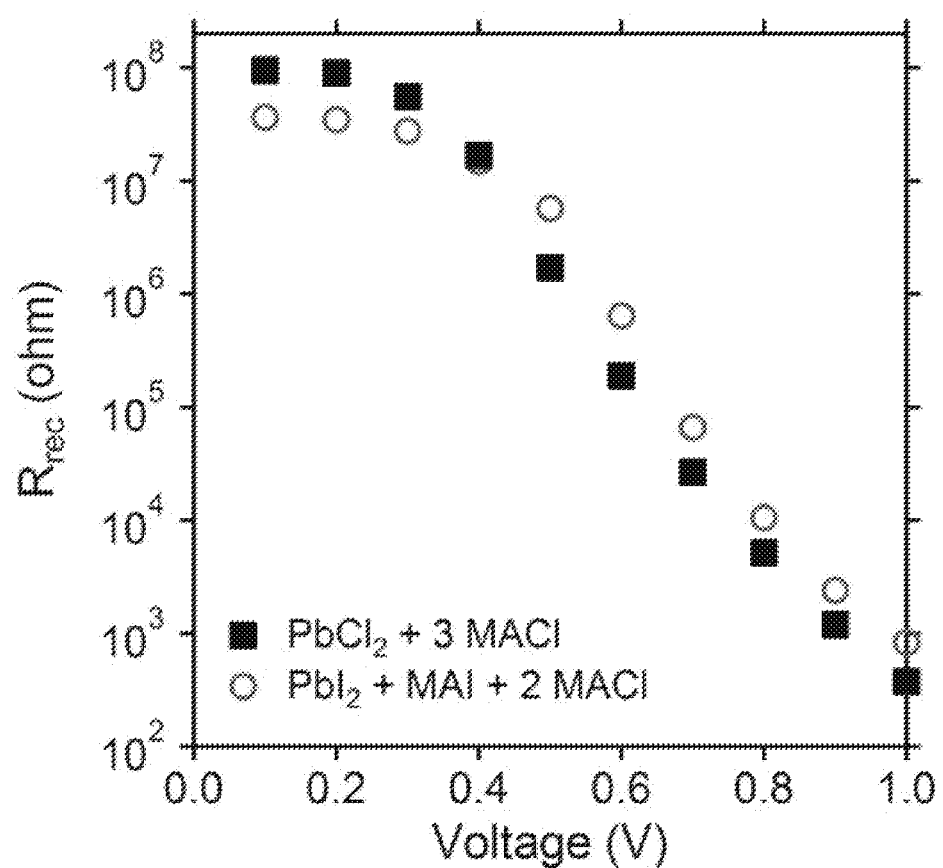
FIG. 17 is a graph showing recombination resistance $R_{rec}$ as a function of voltage for a planar perovskite solar cell based on the mixed halide $CH_3NH_3PbI_{3-x}Cl_x$ prepared from the precursor containing MAI and $PbCl_2$ (3:1 molar ratio).
Figure 18:
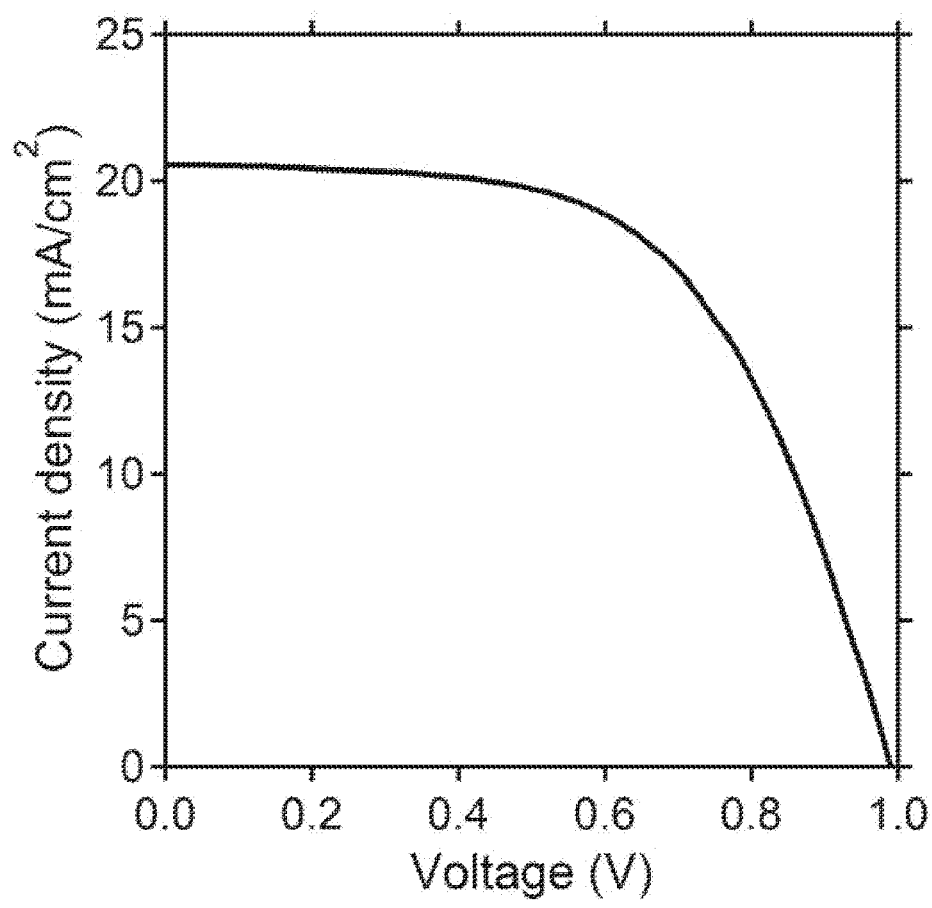
FIG. 18 is a J-V curve of a planar perovskite solar cell based on the mixed halide $CH_3NH_3PbI_{3-x}Cl_x$ prepared from the precursor containing MAI and $PbCl_2$ (3:1 molar ratio). The cell efficiency is 11.86% with a $J_{sc}$ of 20.57 $mA/cm^2$, $V_{oc}$ of 0.995 V, and FF of 0.579.

FIG. 17 illustrates recombination resistance $R_{rec}$ as a function of voltage for a planar perovskite solar cell based on the mixed halide $CH_3NH_3PbI_{3-x}Cl_x$ prepared from the starting solution containing MAI and $PbCl_2$ (3:1 molar ratio). The $R_{rec}$ values for the planar $CH_3NH_3PbI_3$ cells prepared from the $CH_3NH_3PbI_3$ precursor with 2-MACl additive are also plotted for comparison. The J-V curve for a planar $CH_3NH_3PbI_{3-x}Cl_x$ perovskite cell is shown in FIG. 18. The cell efficiency was ~11.86% with a $J_{sc}$ of ~20.57 $mA/cm^2$, $V_{oc}$ of ~0.995 V, and FF of ~0.579. The performance of the planar $CH_3NH_3PbI_{3-x}Cl_x$ perovskite cell was similar to that of the planar $CH_3NH_3PbI_3$ cells prepared from the starting solutions containing from 1 M to 2 M amounts of MACl additives, as previously described. Referring again to FIG. 17, the $R_{rec}$ values for the planar $CH_3NH_3PbI_3$ cells prepared with 2-MACl additive are also plotted for comparison. It is apparent that these two samples follow almost identical voltage dependence of the recombination resistances. Taken together the results of SEM, XRD, J-V, and impedance spectroscopy, it is reasonable to believe that the $CH_3NH_3PbI_{3-x}Cl_x$ perovskite film prepared from the $3MAI-PbCl_2$ precursor is similar to the $CH_3NH_3PbI_3$ perovskite film prepared from the MACl-added to the solution containing MAI and $PbI_2$. Despite these similarities, significant differences between these two approaches exist. First, the crystal structures of the perovskite films prepared with these two approaches during the early stage of thermal treatment are different (FIGS. 8a-c and 16a-c), indicating that the exact precursor composition is critical to the process of perovskite formation. Second, it was also found that the ratio of $MAI:PbCl_2$ in the starting solution for preparing $CH_3NH_3PbI_{3-x}Cl_x$ should not be less than 3; otherwise, $PbCl_2$ cannot be fully dissolved. This may explain why the $CH_3NH_3PbI_{3-x}Cl_x$ precursor has a molar ratio of 3:1 for $MAI:PbCl_2$. In contrast, a starting solution utilizing wide ranging amounts of MACl added to MAI and $PbI_2$, enhanced the ability to control the kinetics of the perovskite crystallization process. Third, this example shows that the $3MAI-PbCl_2$ precursor solution turned from green-yellow to brown-yellow after one week of storage in air. In contrast, the $PbI_2$-MAI-2MACl starting solution (with the same Pb concentration as in the $3MAI-PbCl_2$ precursor solution) stays clear with a green-yellow color for more than three months when stored in air.

In summary, the present disclosure provides a one-step solution approach to prepare perovskite halide films ($CH_3NH_3PbI_3$) on a mesoporous $TiO_2$ film or on a planar, compact $TiO_2$ layer on FTO. In this Example, $CH_3NH_3Cl$ (or MACl) was added to a standard equimolar solution of $CH_3NH_3I$ and $PbI_2$ to favorably adjust the crystallization process for the final target perovskite halide film; $CH_3NH_3PbI_3$. Depending on the amount of MACl used in the precursor solution, the optimum crystallization time for forming pure $CH_3NH_3PbI_3$ with the strongest absorption varied from a few minutes to several tens of minutes. The use of MACl not only led to enhanced absorption of $CH_3NH_3PbI_3$, but also to significantly improved coverage of $CH_3NH_3PbI_3$ on a planar substrate. Compared to a typical, standard one-step solution approach for producing $CH_3NH_3PbI_3$ films, the additional use of an alkyl ammonium halide such as MACl improves the performance of perovskite solar cells. For the mesostructured device architecture, the efficiency was enhanced from about 8% to 10%, whereas for the planar cell structure, the efficiency was improved from about 2% to 12%. The recombination resistance for planar cells was reduced by 1-2 orders of magnitude by using MACl. The significant performance improvement for planar perovskite cells is attributed primarily to the improved morphology of the perovskite films resulting from the additional use of MACl to control the crystallization process for forming the final target perovskite halide film, $CH_3NH_3PbI_3$.

Example 2: One-Step Method

Figures 19A, 19B, 19C:
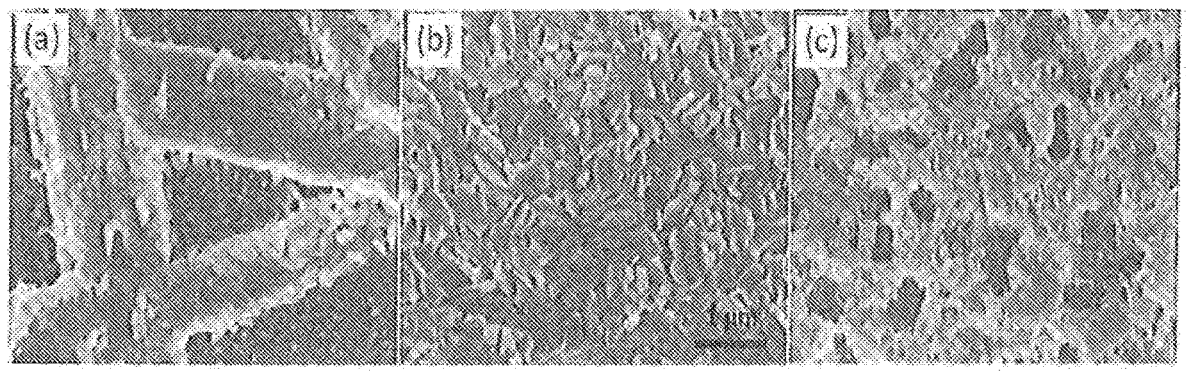
FIGS. 19*a-c* are typical SEM images of $MAPbI_2Br$ films deposited on $c-TiO_2/FTO$ substrates from various precursor solutions; (a) $PbI_2$+MABr; (b) $PbI_2$+MABr+MACl; and (c) $PbI_2$+MABr+2MACl.
Figure 20A:
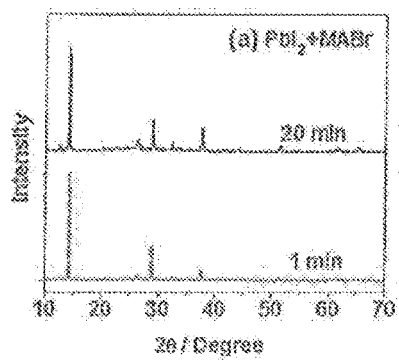
FIGS. 20*a-c* are graphs showing the effect of annealing time (as indicated) at 125° C. on the XRD patterns of $MAPbI_2Br$ films deposited on $c-TiO_2/FTO$ substrate from various precursor solutions: (a) $PbI_2$+MABr; (b) $PbI_2$+MABr+MACl; and (c) $PbI_2$+MABr+2MACl.
Figure 20B:
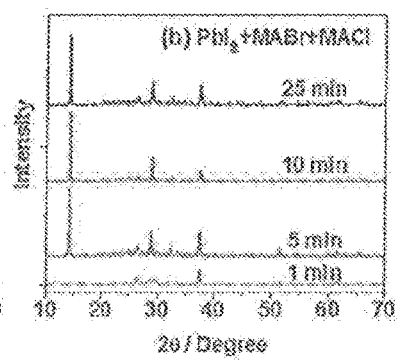
Figure 20C:
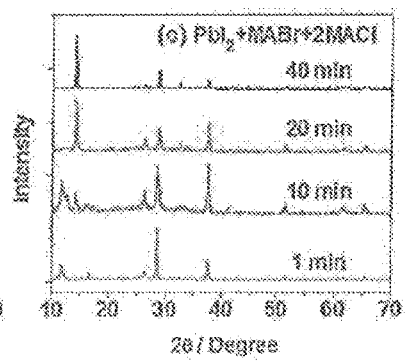
Figure 21:
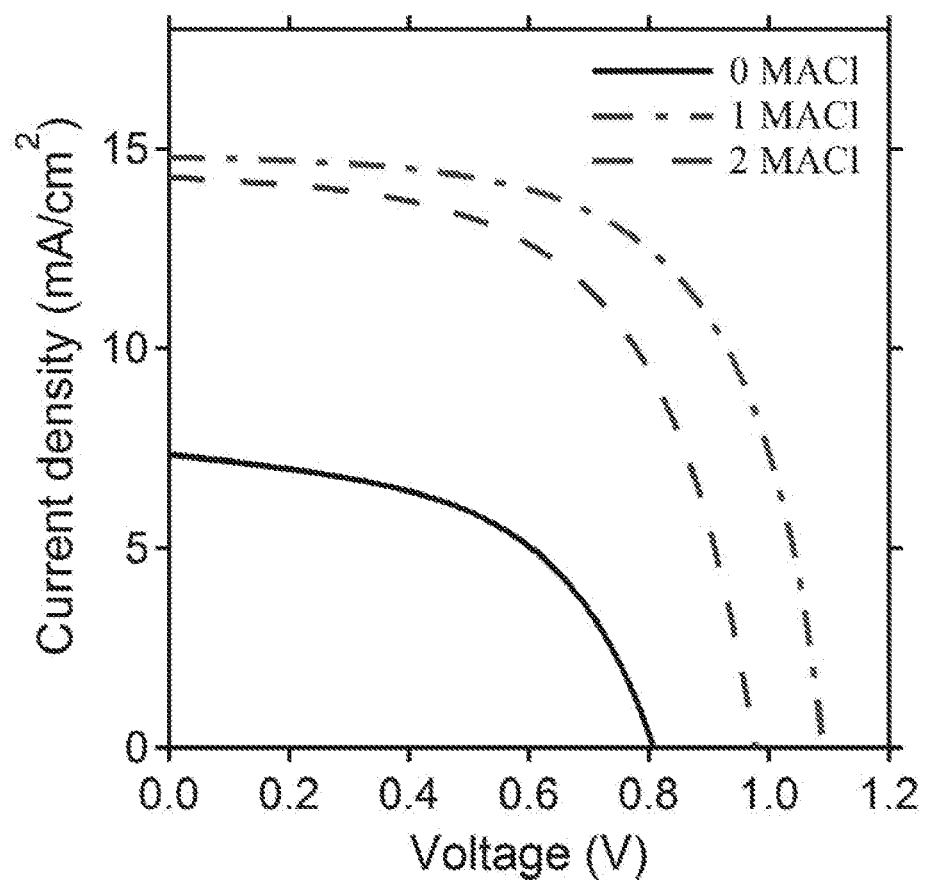
FIG. 21 is a graph showing the photocurrent density-photovoltage (J-V) curves of perovskite solar cells prepared from different precursor compositions (i.e., $PbI_2$+MABr or 0 MACl; $PbI_2$+MABr+MACl or 1 MACl; and $PbI_2$+MABr+2MACl or 2MACl).

FIGS. 19a-c depict typical SEM images of $CH_3NHPbI_2Br$ films deposited on c-$TiO_2$/FTO substrates from various precursor solutions: (a) $PbI_2$+MABr; (b) $PbI_2$+MABr+MACl; and (c) $PbI_2$+MABr+2MACl. FIGS. 20a-c illustrate the effect of annealing time (as indicated) at 125° C. on the XRD patterns of $CH_3NH_3PbI_2Br$ films deposited on c-$TiO_2$/FTO substrate from various precursor solutions: (a) $PbI_2$+MABr; (b) $PbI_2$+MABr+MACl; and (c) $PbI_2$+MABr+2MACl. FIG. 21 illustrates photocurrent density-photovoltage (J-V) curves of perovskite solar cells prepared from different precursor compositions (i.e., $PbI_2$+MABr or 0 MACl; $PbI_2$+MABr+MACl or 1 MACl; and $PbI_2$+MABr+2MACl or 2MACl).

This one-step solution approach provided by the present disclosure comprises introducing $CH_3NH_3Cl$ (or MACl) to the standard $CH_3NH_3PbI_2Br$ precursor solution to prepare perovskite $CH_3NH_3PbI_2Br$ films. It has been found that the use of $CH_3NH_3Cl$ alters the crystallization process for forming $CH_3NH_3PbI_2Br$. The amount of $CH_3NH_3Cl$ in the perovskite precursor solution strongly affects the film morphology (FIGS. 19a-c), crystal structure formation (FIGS. 20a-c), and device characteristics (FIG. 21).

Example 3: Three-Step Method

This example illustrates a three-step sequential deposition method for preparing $PbI_2$-free $CH_3NH_3PbI_3$ films. Using typical, known two-step approaches, it is often difficult to completely convert $PbI_2$ into final target perovskite halide film, e.g. $CH_3NH_3PbI_3$, without causing significant degradation of the perovskite film. In contrast, the disclosed three-step sequential solution deposition approach provides a thermally unstable stoichiometric $PbI_2·CH_3NH_3Cl$ ($PbI_2$·MACl) transitory, intermediate film that is first deposited on the mesoporous $TiO_2$ substrate, followed by thermal decomposition to form a $PbI_2$ film. Using this disclosed method, the $PbI_2$ film can be rapidly converted into $CH_3NH_3PbI_3$ without any $PbI_2$ residue by using a MAI IPA solution at room temperature, which ultimately leads to improved device performance.

Experimental Setup and Device Fabrication

Preparation of material for fabricating the disclosed structures, and for fabricating conventional devices used for purposes of comparison, used to quantify the improved performance of the disclosed structures proceeded as follows. MAI and MACl were synthesized by reacting methylamine (MA) with HI and HCl, respectively, followed by purification. A patterned fluorine-doped tin oxide (FTO) was first deposited with a blocking layer by spray pyrolysis at ~450° C. using ~0.2 M Ti(IV) bis(ethyl acetoacetate)-diisopropoxide 1-butanol solution, followed by ~450° C. annealing in air for one hour. A 500-nm-thick mesoporous $TiO_2$ film was then screen coated onto FTO followed by ~500° C. annealing in air for 30 minutes. The $TiO_2$ film was then treated in 40 mM $TiCl_4$ aqueous solution at ~65° C. for about 30 minutes. These $TiCl_4$-treated $TiO_2$ films were then sequentially rinsed by deionized (DI) water, blown dry in air, and finally annealed at about 500° C. for about 30 minutes.

"Standard" two-step deposition of perovskites proceeded as follows. From 0.4 M to about 1.0 M $PbI_2$ (99.99%) DMF solution was spin coated onto a mesoporous $TiO_2$ film at 3000 rpm for about 20 seconds. The deposited $PbI_2$ film was then thermally treated at about 70° C. for about 5 minutes. The $PbI_2$ film was cooled to room temperature and then immersed into a 10 mg MAI/mL isopropyl alcohol (IPA) solution for different times (from 2 minutes to about 60 minutes), followed by rinsing with IPA, blown dry with $N_2$, and then thermally treated at 70° C. for about 5 minutes.

Three-step methods for the formation perovskites halides, performed pursuant to methods provided by the present disclosure, as follows. A first solution in DMF of 1.0 M equal molar ratio $PbI_2$ and MACl was first spin coated onto the mesoporous $TiO_2$ film at 3000 rpm for about 20 seconds. The applied solution was then thermally treated at about 130° C. for about 30 minutes, resulting in the formation of a yellow $PbI_2$ film, which was then cooled to room temperature. The yellow $PbI_2$ film was then immersed into a 10 mg MAI/mL IPA solution for about 30 seconds, followed by rinsing with IPA, blown dry by $N_2$, and then thermally treated at ~70° C. for about 5 minutes.

In connection with device preparation, the perovskite-deposited electrodes were first coated with a layer of hole transport material (HTM) by spin coating at 4,000 rpm for 20 seconds using 0.1 M spiro-MeOTAD, 0.035 M bis(trifluoromethane)sulfonimide lithium salt (Li-TFSi), and 0.12 M 4-tert-butylpyridine (tBP) in chlorobenzene/acetonitrile (10:1, v/v) solution. A 150-nm-thick Ag contact layer was then deposited by thermal evaporation.

The crystalline structures of the perovskite films were measured by X-ray diffraction (XRD, Bruker D8 ADVANCE with Cu Kα radiation). The absorption spectra of the planar perovskite films were characterized by an ultraviolet-visible (UV-vis) spectrophotometer (Cary-60). The photocurrent density-voltage (J-V) characteristic of perovskite solar cells was measured with a Keithley 2400 source meter under simulated AM 1.5G illumination (100 mW/cm2; Oriel Sol3A Class AAA Solar Simulator).

Results and Discussion

In a standard two-step method, a 1.0 M $PbI_2$ precursor solution is normally used to obtain sufficient deposition of $CH_3NH_3PbI_3$ to absorb light. In this Example, the time evolution of the conversion of $PbI_2$ into the final target perovskite halide film, $CH_3NH_3PbI_3$, was examined by using UV-vis and XRD measurements. FIGS. 22*a-b* show the effect of MAI contacting times on changes of the XRD patterns. When the $PbI_2$ film was contacted with MAI for about 2 minutes, there was an incomplete conversion as evidenced by the existence of both the $PbI_2$ (near 12.6°) and $CH_3NH_3PbI_3$ (near 14°) diffraction peaks with similar peak intensities. The intensity of the $CH_3NH_3PbI_3$ peak increased, whereas the $PbI_2$ peak intensity decreased with longer MAI contact times (from 10 minutes to 60 minutes). Even with 60 minutes of contact time, there was still a noticeable amount of $PbI_2$ in the film as indicated by the characteristic $PbI_2$ diffraction peak. However, the intensity of the $PbI_2$ peak was much smaller and almost negligible compared to the $CH_3NH_3PbI_3$ peak when the contact time was more than 30 minutes.

During the conversion process to the final perovskite film, the initial yellow $PbI_2$ film slowly changed color to brown or dark brown, depending on the contact time in the second MAI-containing solution. FIG. 22*b* shows the UV-vis absorption spectra of the resulting films as a function of the contact time. Although the XRD measurement indicates a significant fraction of $PbI_2$ existed after 2 minutes of contact time, the UV-vis spectrum of this sample showed a typical $CH_3NH_3PbI_3$ absorbance as shown in FIG. 22*b*. The direct absorbance by the residue $PbI_2$ is likely hidden by the absorption spectrum from the partially converted $CH_3NH_3PbI_3$ within the film. Because the regular IPA solution can dissolve $CH_3NH_3PbI_3$, longer contact times eventually led to a significant drop of absorption across the entire wavelength range, despite more conversion of $PbI_2$ to the final target perovskite film, $CH_3NH_3PbI_3$, as suggested by the XRD results. Therefore, the sample contacted for about 60 minutes with the second solution only displayed about half the absorbance compared to the sample contacted with the second solution for about 2 minutes.

The impact of the MAI-containing contact time on the photovoltaic parameters of the perovskite solar cells are presented in Table 3. When the contact time was increased from 2 minutes to 60 minutes, the short-circuit photocurrent density first increased and then decreased, with a peak value (14.84 mA/cm2) reached at 30 minutes contact time, which reflects the balance between perovskite conversion and dissolution during the second contacting step, as shown in FIGS. 22*a-b*. Fill factor of these devices increased significantly with the increased contact times, from 0.346 at 2 minutes to 0.455 at 60 minutes. The overall conversion efficiency essentially followed the trend of photocurrent, increasing from ~2.55% at 2 minutes to ~5.75% at 30 minutes, and then decreases to ~4.59% at 60 minutes. These results indicate that it is important to have more complete conversion of $PbI_2$ to the final target perovskite halide film, $CH_3NH_3PbI_3$, without significant dissolution of $CH_3NH_3PbI_3$ in order to reach reasonable device performance.

TABLE 3

Effect of the MAI dipping time on the perovskite solar cell photovoltaic parameters: short-circuit photocurrent density, $J_{sc}$; open-circuit voltage, $V_{oc}$; fill factor, FF; and conversion efficiency, η.

| Dipping Time [min] | $J_{sc}$ [mA/cm²] | $V_{oc}$ [V] | FF | η [%] |
|---|---|---|---|---|
| 2 | 8.58 | 0.859 | 0.346 | 2.55 |
| 10 | 11.41 | 0.837 | 0.403 | 3.85 |
| 30 | 14.84 | 0.899 | 0.431 | 5.75 |
| 60 | 11.07 | 0.911 | 0.455 | 4.59 |

Figure 23A:
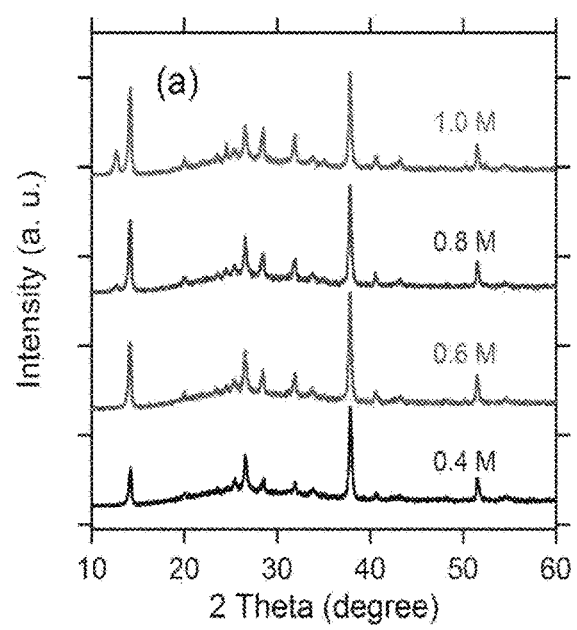
FIGS. 23*a-b* are graphs showing the effect of $PbI_2$ concentration (0.4-1.0 M) on the (a) XRD patterns and (b) UV-vis absorption spectra of the perovskite films deposited on mesoporous $TiO_2$ film after dipping in 10 mg MAI/mL IPA solution for 10 min.
Figure 23B:
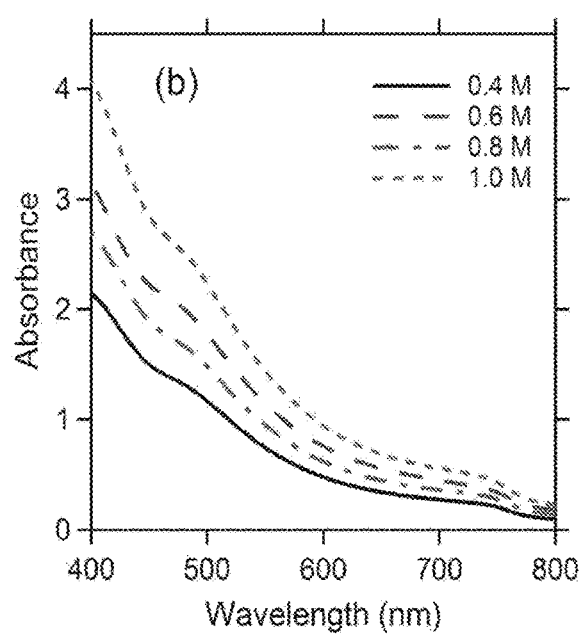

FIGS. 23*a-b* illustrate the effect of $PbI_2$ concentration (from 0.4 M to 1.0 M) on the (a) XRD patterns and (b) UV-vis absorption spectra of the perovskite films deposited on mesoporous $TiO_2$ films after contacting the $PbI_2$ films with a 10 mg MAI/mL IPA solution for about 10 minutes. The impact of varying $PbI_2$ concentration on the $PbI_2$-to-$CH_3NH_3PbI_3$ conversion using a typical two-step method was also analyzed. The concentration of the $PbI_2$ precursor solution was changed from 0.4 M to 1.0 M. To avoid the dissolution of $CH_3NH_3PbI_3$ in the IPA solution, the dipping time of $PbI_2$ film in the MAI IPA solution was fixed at about 10 minutes for all samples. FIG. 23*a* shows the XRD measurements of the perovskite films using different $PbI_2$ concentration with a ~10 minute contact time during the second contacting step with the second solution. The intensity of the characteristic $PbI_2$ diffraction peak decreased significantly when the $PbI_2$ concentration was reduced from 1.0 M to 0.8 M. The $PbI_2$ peak disappeared from the diffraction pattern when the $PbI_2$ concentration was further reduced to 0.6 M and 0.4 M, suggesting a complete conversion of $PbI_2$ to $CH_3NH_3PbI_3$ using a low-concentration $PbI_2$ first solution, with ~10 minute contact time in the second MAI IPA solution. Without wishing to be bound to theory, it is believed that lower concentration $PbI_2$ first solutions (e.g., from 0.4 M to 0.6 M) can lead to less infiltration of $PbI_2$ into the mesoporous $TiO_2$ films than the higher concentration first solutions (e.g., from 0.8 M to about 1.0 M $PbI_2$). A lower degree of pore filing of $PbI_2$ may promote the conversion of $PbI_2$ into $CH_3NH_3PbI_3$ by facilitating the intercalation of MAI into $PbI_2$; but it may also result in lower absorbance due to less $CH_3NH_3PbI_3$ deposition. FIG. 23*b* compares the effect of $PbI_2$ concentration on the UV-vis absorption spectra of the perovskite films. A higher $PbI_2$ concentration in the first solution for the first contacting step, generally led to stronger absorbance. The perovskite film based on a 0.4 M $PbI_2$ first solution displayed only about half the absorbance of the perovskite film based on a 1.0 M $PbI_2$ first solution.

Table 4 summarizes the photovoltaic parameters ($J_{sc}$, $V_{oc}$, FF and η) of the solar cells based on the $CH_3NH_3PbI_3$ films prepared using different concentrations of $PbI_2$ in the first solution of the two-step method, with 10 minute contact times in the second MAI solution during the second contacting step. The 0.8-M sample exhibited a low photocurrent density similar to the 1.0-M sample, which may be attributed to the residue $PbI_2$ observed by XRD. In contrast, the 0.6 M sample without any $PbI_2$ residue exhibited a reasonable photocurrent density despite its lower absorption than the 1.0 M sample (FIG. 22*b*). However, the lowest $J_{sc}$ value was observed for the 0.4 M sample, for which the poor light absorption clearly limits the device performance. As a balance for optimizing both the light absorption and conversion of $PbI_2$ to $CH_3NH_3PbI_3$, the best device performance efficiency was obtained for the 0.6 M sample with a cell efficiency of about 7.23%. Thus, it appears that isopropanol may not be suitable for a standard two-step method because of the dissolution of $CH_3NH_3PbI_3$ dissolution and the difficulty of obtaining a $PbI_2$-free $CH_3NH_3PbI_3$ film with sufficient absorption.

TABLE 4

Effect of $PbI_2$ concentration (0.4-1.0M) on the perovskite solar cell photovoltaic parameters. The second-step MAI dipping time is 10 min for all samples.

| Concentration [M] | $J_{sc}$ [mA/cm²] | Voc [V] | FF | η [%] |
|---|---|---|---|---|
| 0.4 | 10.27 | 0.842 | 0.609 | 5.27 |
| 0.6 | 14.79 | 0.836 | 0.585 | 7.23 |
| 0.8 | 11.73 | 0.830 | 0.55 | 5.35 |
| 1.0 | 11.40 | 0.837 | 0.403 | 3.85 |

In order to overcome the deficiencies of the two-step deposition, the three-step sequential deposition method, per embodiments of the present invention, was investigated. In the three-step method, a first solution of $PbI_2$ and MACl (in equimolar concentration) was first applied onto a mesoporous $TiO_2$ film. Upon thermal treatment at ~130° C. for about 1 minute, the resulting film exhibited a light brown color with an unknown XRD pattern. Its XRD pattern and UV-vis absorption spectra are shown in FIGS. 24a and 24b (Step 1), respectively. The absorption spectra were similar to those of $CH_3NH_3PbI_3$; however, their XRD patterns were very different. This unknown compound (denoted as $PbI_2$+MACl) was likely a mixture of $CH_3NH_3PbCl_3$, $CH_3NH_3PbI_3$, and some unknown structure. When thermally treated at 130° C. in air, the brown film slowly turned to a yellow color. After thermally treating at 130° C. for 30 min, the $PbI_2$+MACl film was thermally decomposed to $PbI_2$, as suggested by its UV-vis spectra and XRD pattern (FIGS. 24a-b, Step 2). No traceable chlorine content could be found in this film by the energy dispersive X-ray (EDX) analysis.

The $PbI_2$ film formed from thermal treatment turned dark brown almost immediately after contacting with the second MAI-containing solution (with regular IPA). It took only about 30 seconds for the yellow $PbI_2$ film to convert into a dark-brown $CH_3NH_3PbI_3$ film (FIG. 24a, step 3) without any traceable $PbI_2$ evident from its XRD pattern (FIG. 24b, step 3). The perovskite halide target film, $CH_3NH_3PbI_3$, prepared from the initial 1.0 M $PbI_2$.MACl precursor by the three-step method exhibited strong absorption (especially in the long-wavelength region) similar to the film prepared from the regular two-step approach using a 1.0 M $PbI_2$ first solution.

Figure 25:
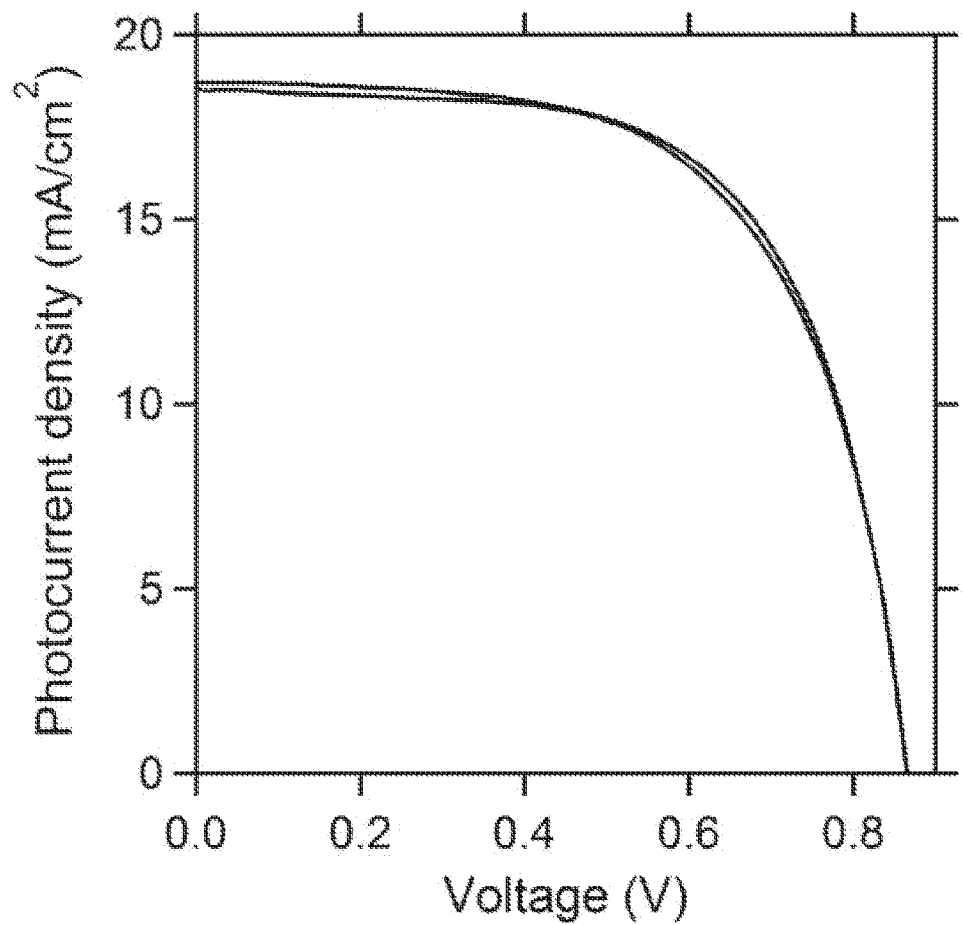
FIG. 25 is a curve showing the J-V characteristic of a perovskite solar cell based on the $CH_3NH_3PbI_3$ film prepared from the three-step approach.

FIG. 25 is a graphical illustration of a J-V characteristic of a perovskite solar cell based on the $CH_3NH_3PbI_3$ film prepared from the disclosed three-step method. The cell efficiency was about 10.11%, with a $J_{sc}$ of ~18.64 mA/cm2, $V_{oc}$ of ~0.868 V, and FF of ~0.625. Both forward and backward J-V scans are shown in FIG. 25. The hysteresis was about 1%, and thus, can be considered negligible.

The above results demonstrate that the three-step method provides a promising way to address the challenges associated with the $PbI_2$ conversion for a standard two-step method. Without wishing to be limited by theory, it is believed that the quick $PbI_2$-to-$CH_3NH_3PbI_3$ conversion kinetics observed results from the higher exposed surface of the $PbI_2$ film prepared through the thermal treatment step of the three-step deposition method. The formation of pores resulting from the release of MACl in the thermal treatment step is expected to form a $PbI_2$ film with a larger exposed surface area than the $PbI_2$ film deposited directly from the $PbI_2$ precursor. The higher exposed surface of the $PbI_2$ film may facilitate the intercalation reaction between MAI with $PbI_2$ during the contacting step with the second solution, leading to a complete conversion of $PbI_2$ within about 30 seconds. With such a short contact time, the issue of $CH_3NH_3PbI_3$ dissolution in the IPA solution may be effectively mitigated.

For a typical two-step method, with a high-concentration (1.0 M) $PbI_2$ first solution, the conversion of the $PbI_2$ film to the final target perovskite halide, $CH_3NH_3PbI_3$, required a long conversion time in the MAI IPA second solution. The long exposure to the second IPA solution caused the dissolution of the converted $CH_3NH_3PbI_3$ perovskite film, leading to reduced photocurrent generation, and consequently, poor device performance. On the other hand, a short exposure of the $PbI_2$ film to the second MAI IPA solution resulted in only a partial conversion of the film with significant $PbI_2$ residue, which also limited the device performance. Using a less concentrated first $PbI_2$ solution (e.g., 0.4 M) showed complete conversion of the $PbI_2$ film with a fixed contact time of about 10 minutes. However, the poorer light absorption for the final perovskite film prepared with a low concentration of $PbI_2$ in the first solution also limited the final device performance. To address this dilemma, the present disclosure provides a three-step solution method to prepare $CH_3NH_3PbI_3$ perovskite halide films by using a second MAI-containing solution with regular (non-anhydrous) IPA. In comparison to the typical two-step approach using similar processing conditions, the disclosed three-step method enables the formation of a $PbI_2$ film through the thermal decomposition of an intermediate and transitory $PbI_2$+MACl film. This intermediate film facilitates a rapid conversion of the subsequently formed $PbI_2$ film to the final target perovskite halide film, $CH_3NH_3PbI_3$, without any detectable residual $PbI_2$ in the perovskite film, leading to improved device performance. Thus, the disclosed three-step solution method using regular IPA represents a promising alternative deposition method for preparing low-cost, high-efficiency perovskite solar cells.

Example 4: Modified Three Step Method

In this Example, the three-step method provides a facile morphology-controllable sequential deposition of a planar $CH_3NH_3PbI_3$ film by stepping through a transitory intermediate $PbI_2$.xMAI (x: 0.1-0.3) precursor film. Adding a small amount of MAI to the $PbI_2$ first solution, may lead to about a 10-fold faster complete formation of the final target perovskite halide film, $CH_3NH_3PbI_3$, without any $PbI_2$ residue after the contacting step with the MAI-containing second solution, resulting in a much improved device performance with higher reproducibility, especially when using about 0.1 M to about 0.2M MAI in the second solution. The best cell efficiency recorded was 16.76% using this modified $PbI_2$.0.15MAI first solution with the maximum power output stabilized at about 16.5% under one-sun illumination. This demonstrates that the morphologies of $PbI_2$.xMAI intermediate films and the corresponding final target perovskite halide films, $CH_3NH_3PbI_3$, can be adjusted by tuning the relative amount of MAI.

Figure 26A:
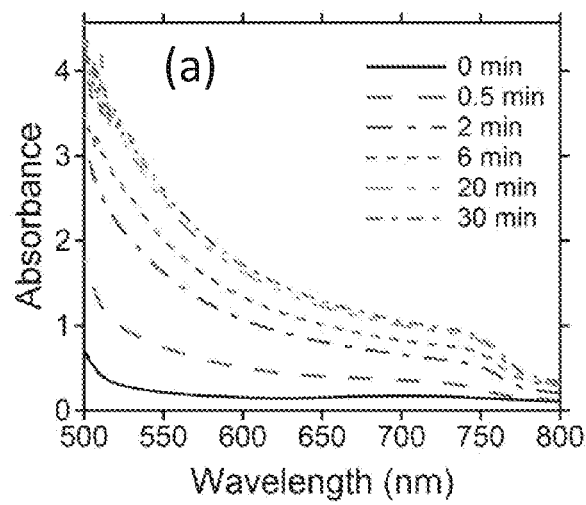
FIGS. 26*a-d* are (a) UV-vis absorption spectra and (b) XRD patterns of $CH_3NH_3PbI_3$ films grown via the standard two-step sequential solution deposition using pure $PbI_2$ precursor film with different MAI solution dipping times. SEM images of (c) the typical spin-coated $PbI_2$ film and (d) the converted $CH_3NH_3PbI_3$ film with 20-min dipping (reaction) time in MAI solution are also depicted.

FIG. 26a shows the ultraviolet-visible (UV-vis) absorption spectra evolution of a pure $PbI_2$ film after dipping in a second solution of 10 mg/mL MAI isopropanol (IPA) for contact times up to about 30 minutes. The absorption shoulder near 750 nm for perovskite $CH_3NH_3PbI_3$ increased slowly with the MAI dipping time up to 20 min. The absorption spectrum increased very little after 20 minutes of contacting, which indicates that most $PbI_2$ had been converted to $CH_3NH_3PbI_3$. The baseline of the absorption spectra also increased simultaneously with longer dipping time, reflecting the stronger light scattering effect associated with a rougher perovskite morphology. Although the absorption measurements suggest that the $CH_3NH_3PbI_3$ perovskite film grown with 6 minutes dipping exhibited strong $CH_3NH_3PbI_3$ absorbance spectrum, the X-ray diffraction (XRD) pattern of the same sample (FIG. 26b) still exhibited the characteristic peaks for $PbI_2$ along with the $CH_3NH_3PbI_3$ diffraction peaks, which is an indication of incomplete conversion of $PbI_2$ to $CH_3NH_3PbI_3$. The intensity of $PbI_2$ diffraction peak was substantially reduced with longer contacting times up to 20 minutes. The $PbI_2$ peak disappeared completely when the contact time was further increased to 30 minutes. The typical scanning electron microscopy (SEM) images of planar $PbI_2$ and $CH_3NH_3PbI_3$ (20-min dipping/conversion) films are compared in FIGS. 26c and 26d, respectively. The planar $PbI_2$ film appeared porous with a coarse top surface, which may be caused by the shrinkage of the precursor film during the drying process. The resulting $CH_3NH_3PbI_3$ film was also full of tiny pinholes and its surface was covered with rough perovskite nanocrystals; this appearance is similar to that of the perovskite capping layer grown on a mesoporous substrate using two-step sequential deposition. The increased roughness of the $CH_3NH_3PbI_3$ film compared to the initial $PbI_2$ film may be attributed to space expansion during the second step of MAI intercalation reaction with $PbI_2$.

Figure 26B:
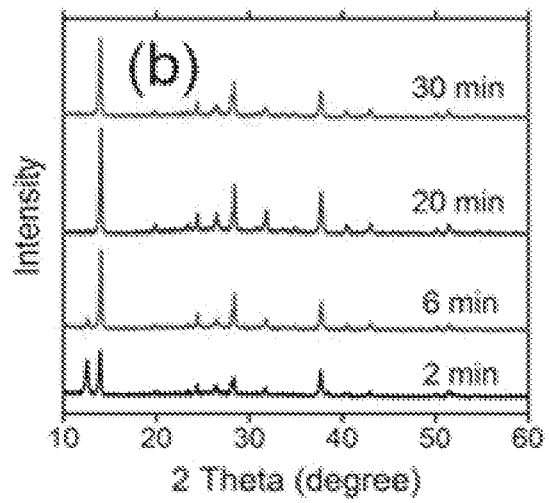
Figure 26C:
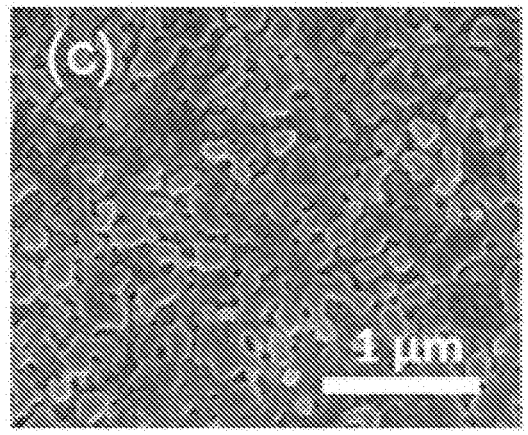
Figure 26D:
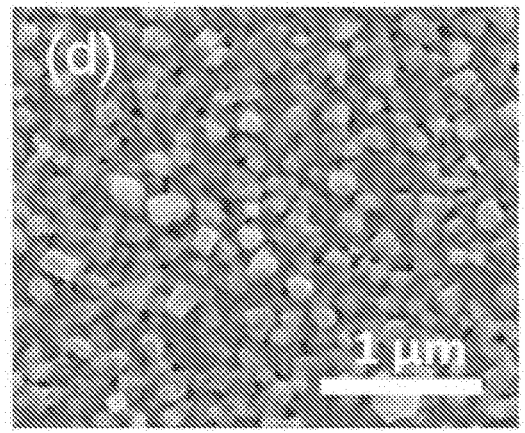
Figure 27:
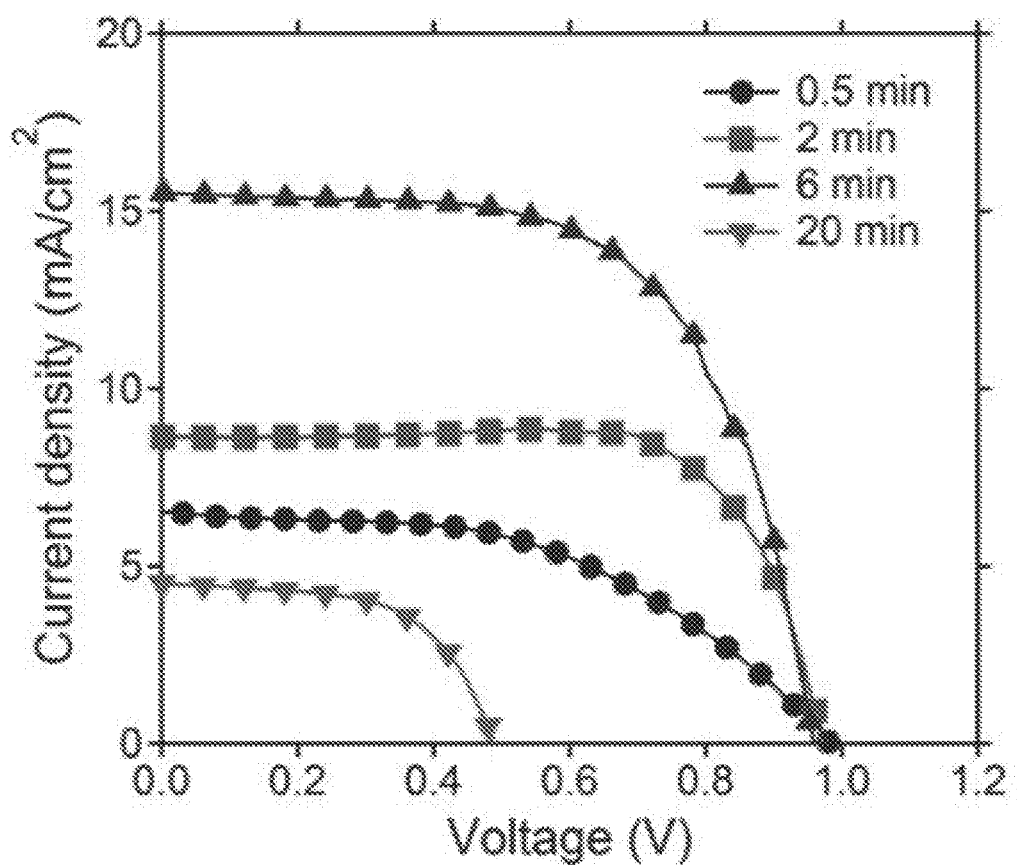
FIG. 27 depicts typical J-V curves of planar $CH_3NH_3PbI_3$ solar cells prepared from $PbI_2$ precursor films with different MAI solution dipping time from 0.5 to 20 min.

Taken together, the results of XRD and absorption measurements in FIGS. 26a and 26b illustrate the deficiencies associated with planar $CH_3NH_3PbI_3$ thin films prepared from $PbI_2$ using the standard two-step sequential solution deposition method. The effect of varying MAI dipping time on the device characteristics is shown in FIG. 27 and the corresponding photovoltaic parameters are listed Table 5. The cell efficiency increased significantly with longer contact time from 3.145% at 0.5 min to 6.105% at 2 min to 9.301% at 6 min, which was consistent with the more complete conversion of $PbI_2$ to $CH_3NH_3PbI_3$. However, when the contact time was increased to 20 min, the device performance dropped in all parameters to an overall efficiency of only 1.290%, despite the fact that the $CH_3NH_3PbI_3$ film with 20 min contact time showed a reduced amount of residue $PbI_2$ and also had stronger light absorption than the $CH_3NH_3PbI_3$ film with 6 minute contact times. Thus, simply lengthening the conversion time to complete the $PbI_2$-to-$CH_3NH_3PbI_3$ conversion presents a challenge for the typical two-step sequential solution processing. The long contacting/reaction duration caused damage to the $CH_3NH_3PbI_3$ layer resulting from the back extraction of MAI from $CH_3NH_3PbI_3$, thus deteriorating the device performance.

To address the challenges associated with the incomplete conversion of $PbI_2$ and rough perovskite surface discussed above and associated with the known two-step approach, the modified three-step deposition process provided by the present disclosure has been developed. The disclosed modified three-step method utilizes an alkyl ammonium halide in combination with the typical perovskite precursor, a mixture of $PbI_2$ and x alkyl ammonium halide with x varying from 0.1-0.3, during a first contacting step to deposit a resulting precursor film denoted as $PbI_2$.x alkyl ammonium halide. Even in the presence of the alkyl ammonium halide, the deposited $PbI_2$.x alkyl ammonium halide films still looked yellowish without any indication of the formation of perovskite $CH_3NH_3PbI_3$.

Figure 28A:
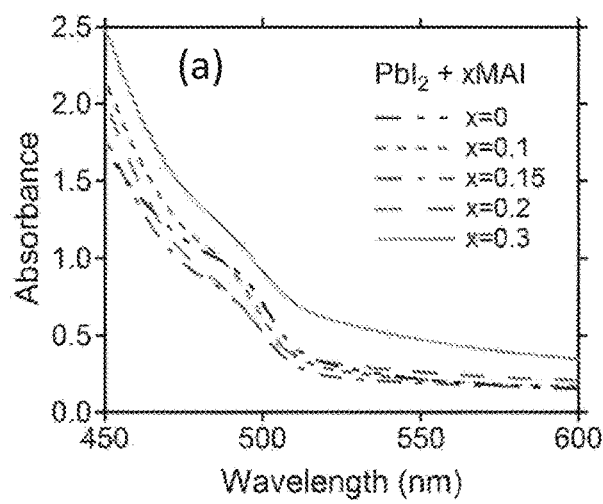
FIGS. 28*a-d* are (a) UV-vis absorption spectra and (b) XRD patterns of $PbI_2$.xMAI films (with varying x values as indicted) before the second conversion step; (c) UV-vis absorption spectra of $CH_3NH_3PbI_3$ films prepared from $PbI_2$.xMAI films after the second conversion step; (d) evolution of UV-vis absorption spectra using the $PbI_2$.0.15MAI precursor film with different dipping times in the MAI solution.
Figure 28B:
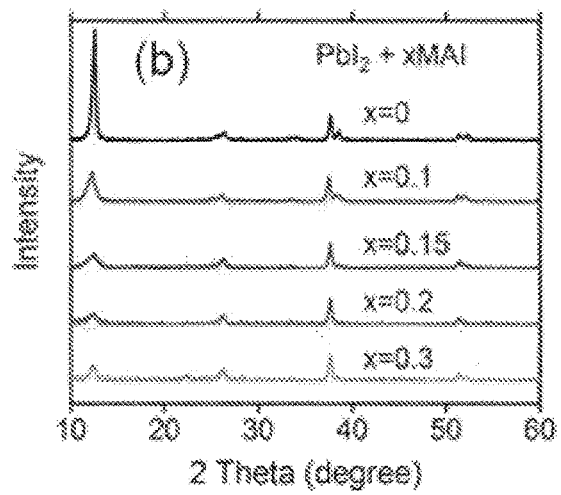

In this Example, the alkyl ammonium halide was methyl ammonium iodide (MAI). FIG. 28a shows the UV-vis absorption spectra of the $PbI_2$.xMAI precursor films. All of these films exhibited an absorption onset near 510 nm, which is characteristic for $PbI_2$. The sharp absorption edge associated with $PbI_2$ became less clear with increasing MAI. At x=0.3, the baseline of the absorption of the precursor film increased substantially, indicating an enhanced light scattering effect. FIG. 28b compares the XRD patterns of $PbI_2$.xMAI (x: 0-0.3) precursor films. In the absence of MAI (x: 0), the $PbI_2$ film displayed a strong characteristic XRD peak at about 12.5°. The intensity of $PbI_2$ peaks decreased significantly with the increase of the MAI amount used in the first-step precursor solution. The addition of xMAI into $PbI_2$ during the first deposition step did not result in any detectable $CH_3NH_3PbI_3$ diffraction peaks, such as the main (110) peak near 14°. This is consistent with the yellow appearance and the corresponding absorption spectra. The intensity of the main $PbI_2$ diffraction peak (~12.5°) decreased substantially with increased amounts of MAI in the precursor. This observation suggests that a partial incorporation of MAI in the $PbI_2$ film decreased the $PbI_2$ crystallinity in the $PbI_2$.xMAI films (compared to the pure $PbI_2$ film) without forming the perovskite $CH_3NH_3APbI_3$ phase.

Figure 28C:
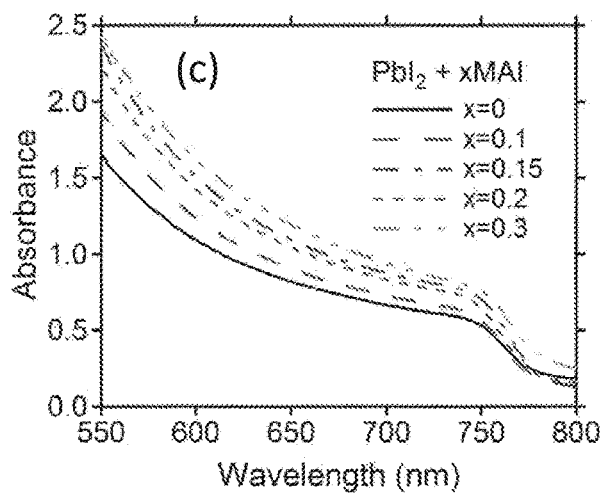
Figure 29:
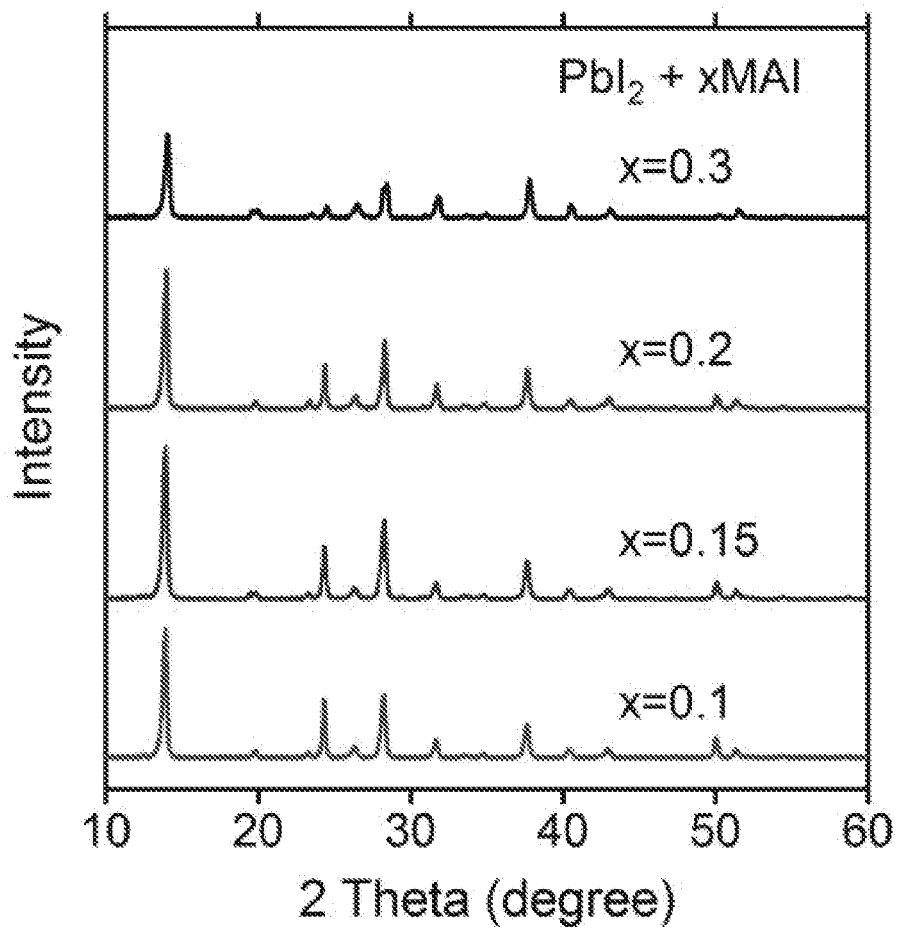
FIG. 29 is a graph showing XRD patterns of $PbI_2$.xMAI (x: 0.1-0.3) films after dipping in MAI solution for 1-3 min.

In contrast to the slow conversion of planar $PbI_2$ film into $CH_3NH_3PbI_3$ via the standard two-step sequential deposition, using the disclosed $PbI_2$.xMAI precursor films was found to convert to red-brown planar $CH_3NH_3PbI_3$ film relatively quickly when using the same sequential deposition processes. It took from about 1 minute to about 3 minutes for all $PbI_2$.xMAI (x: 0.1-0.3) films to convert completely into $CH_3NH_3PbI_3$ without any $PbI_2$ residue as evidenced by the XRD measurements (FIG. 29). This contrasts significantly to the about 20 minutes to about 30 minutes required for the pure $PbI_2$ film to reach full conversion to $CH_3NH_3PbI_3$ (FIG. 26b) for the standard two-step sequential deposition process. FIG. 28c shows the UV-vis absorption spectra of the planar $CH_3NH_3PbI_3$ films using various $PbI_2$.xMAI (x: 0.1-0.3) precursor films. The absorption spectrum for $PbI_2$ is also shown for comparison. Consistent with their XRD results, all of these films exhibited the same absorption shoulder near 750 nm, which is typical for $CH_3NH_3PbI_3$. The variation of the absorption intensity is presumably due to differences in $CH_3NH_3PbI_3$ film thicknesses due to different precursors. A noticeable increase of the baseline was observed for the $PbI_2$.0.3MAI sample, corresponding to a larger light scattering effect as discussed in connection with FIG. 28a. Using the $PbI_2$.0.15MAI precursor film as an example, FIG. 26d demonstrates the effect of MAI on the evolution of the absorption spectra of the precursor films. The rapid increase of absorbance near 750 nm indicated a quick conversion process from the $PbI_2$.0.15MAI precursor film to the final perovskite $CH_3NH_3PbI_3$ film. Furthermore,

TABLE 5

Device parameters of planar $CH_3NH_3PbI_3$ solar cells prepared from $PbI_2$ precursor films.

| $PbI_2$ in MAI time | $J_{sc}$ (mA/cm$^2$) | $V_{oc}$ (V) | FF | η (%) |
|---|---|---|---|---|
| 0.5 min | 6.539 | 0.979 | 0.491 | 3.145 |
| 2 min | 8.847 | 0.969 | 0.712 | 6.105 |
| 6 min | 15.515 | 0.961 | 0.624 | 9.301 |
| 20 min | 4.512 | 0.489 | 0.584 | 1.290 | there was no obvious increase of the baseline of the absorption spectra during the entire conversion process, suggesting that the $CH_3NH_3PbI_3$ film sequentially deposited from $PbI_2.0.15MAI$ may have a similar surface roughness as the initial $PbI_2.0.15MAI$ film.

Figure 28D:
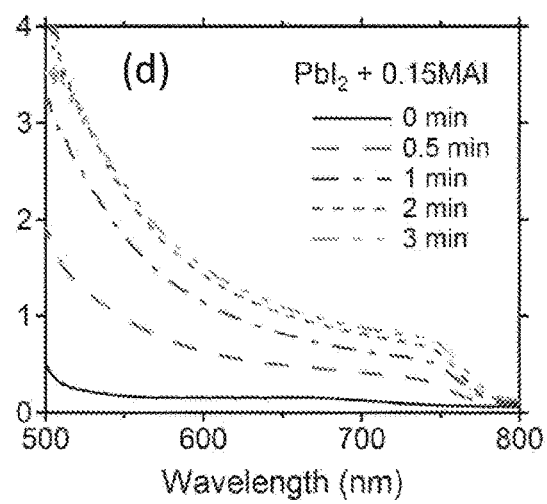

FIGS. 30a-d show the typical SEM images of top views of the $PbI_2.xMAI$ (x=0.1, 0.15, 0.2, and 0.3) precursor films. These films had very different morphologies than the pure $PbI_2$ film and their morphologies varied with the amount of MAI used in the precursor. When x<0.2, the introduction of MAI into $PbI_2$ led to the formation of a smoother $PbI_2.xMAI$ film with less pinholes than the pure $PbI_2$ film. However, the morphologies of the $PbI_2.0.3MAI$ films became even coarser than pure $PbI_2$ films, which is consistent with the higher absorption baseline of the $PbI_2.0.3MAI$ film as shown in FIG. 28a. FIGS. 30e-h show the typical SEM images of the $CH_3NH_3PbI_3$ films prepared from $PbI_2.xMAI$ films after the second contacting/conversion step. Note that the $CH_3NH_3PbI_3$ films fabricated from $PbI_2.xMAI$ (x=0.1-0.2) were nearly pinhole free and showed a relatively uniform, smooth surface, especially for the 0.15MAI sample, which was significantly different from the relatively rough $CH_3NH_3PbI_3$ films prepared from the pure $PbI_2$ film (See FIGS. 26a-d). The grain sizes of the $CH_3NH_3PbI_3$ films also showed a dependence on the amount of MAI used in the precursor. When x=0.1, the $CH_3NH_3PbI_3$ film consisted mainly of relatively small $CH_3NH_3PbI_3$ nanocrystals with sizes less than 200 nm. When using 0.15-0.2 MAI, the $CH_3NH_3PbI_3$ films were composed of many relatively large (~500 nm) crystals filled with ~200 nm small crystals; such film morphology is comparable to that of the vapor-phase-grown perovskite films. This result is also consistent with the absence of absorption baseline increase during the sequential deposition as shown in FIG. 28d. When starting with the relatively coarse $PbI_2.0.3MAI$ film, the $CH_3NH_3PbI_3$ film looked similar to that prepared from the pure $PbI_2$ film. These results clearly demonstrate that the new $PbI_2.xMAI$-based modified three-step deposition method described herein allows for the control of the morphology of the final $CH_3NH_3PbI_3$ film.

Figure 31A:
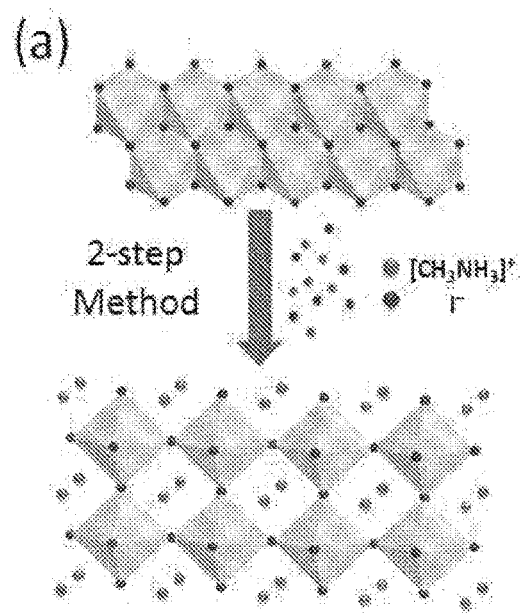
FIGS. 31*a-b* are (a) a schematic illustration of the crystal phase transformation from $PbI_2$ to $CH_3NH_3PbI_3$ in the standard two-step sequential deposition process and (b) a plot of the film thickness (or volume) expansion ratios of converting $PbI_2$.xMAI to $CH_3NH_3PbI_3$ films as a function of the relative amount x MAI used. The solid line is the best fit as discussed in the Detailed Description.
Figure 31B:
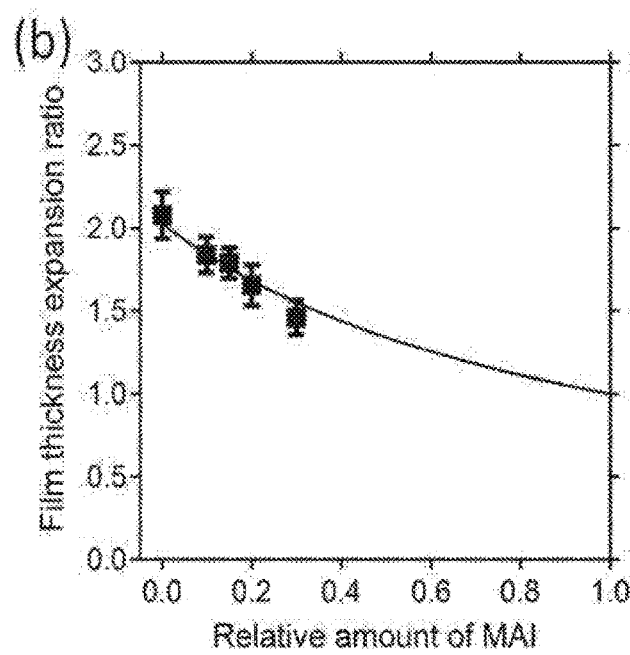

In the standard two-step sequential solution deposition of $CH_3NH_3PbI_3$, the layer structured $PbI_2$ crystal was intercalated by MAI to form the $CH_3NH_3PbI_3$ as shown in FIG. 31a. This significant phase transformation normally leads to approximately a factor of two volume expansion per formula during the second conversion step. To help understand the effect of adding MAI (during the first step deposition) on the $CH_3NH_3PbI_3$ film formation, the thickness (or volume) expansion ratios of converting $PbI_2.xMAI$ to $CH_3NH_3PbI_3$ films were examined by using a surface profiler. FIG. 31b shows the result of the expansion ratios for the films prepared with different amounts (x) of MAI from 0 to 0.3. The ratio continuously decreased with increasing amount of MAI. Without wishing to be bound by any theory, it is believed that, for the $PbI_2.xMAI$ films, the added MAI was likely incorporated into the $PbI_2$ matrix and partially pre-expanded the volume of $PbI_2$ matrix. The degree of this pre-expansion may depend on the amount of MAI used during the first step deposition. This pre-expansion may decrease the final film expansion ratio with increasing amounts of MAI. Assuming the pre-expansion ratio of reactant MAI is the same as the expansion ratio in the standard conversion process with pure $PbI_2$, the expansion ratio of the final $CH_3NH_3PbI_3$ film thickness ($d_f$) to the thickness of the initial $PbI_2.xMAI$ film ($d_i$) can be calculated with the expression $d_f/d_i=m/[1+(m-1)x]$, where m is the expansion ratio. A best fit of the data yields $m=2.02\pm0.07$; the corresponding best-fit line is shown in FIG. 31b. The expansion is approximately two, suggesting that the pre-expansion to form $PbI_2.xMAI$ and the standard expansion to form $CH_3NH_3PbI_3$ have essentially the same volume expansion ratio. Considering the absence of the crystalline $CH_3NH_3PbI_3$ phase in the $PbI_2.xMAI$ films (FIG. 28b), the additive MAI likely forms an amorphous structure with the nearby $PbI_2$. The formation of this amorphous structure may strongly affect the crystallinity of the remaining $PbI_2$ phase. The XRD intensity of the $PbI_2$ peak is much reduced even when the $PbI_2$ phase still constitutes the majority of the $PbI_2.xMAI$ film (e.g., x=0.15; FIG. 28b). Thus, the addition of small amounts of MAI may result in several features that favor the rapid conversion reaction during the second step. These features may include the formation of amorphous $PbI_2.MAI$, the pre-expansion of the $PbI_2$ matrix, and reduced crystallinity of $PbI_2$. Moreover, using different amounts of MAI may allow the control of the pre-expansion of the $PbI_2.xMAI$ precursor film, which may give rise to the advantageous morphology shown in FIGS. 30a-h and may also affect the final photovoltaic performance of the perovskite solar cells based on the planar $CH_3NH_3PbI_3$ films.

Figure 32:
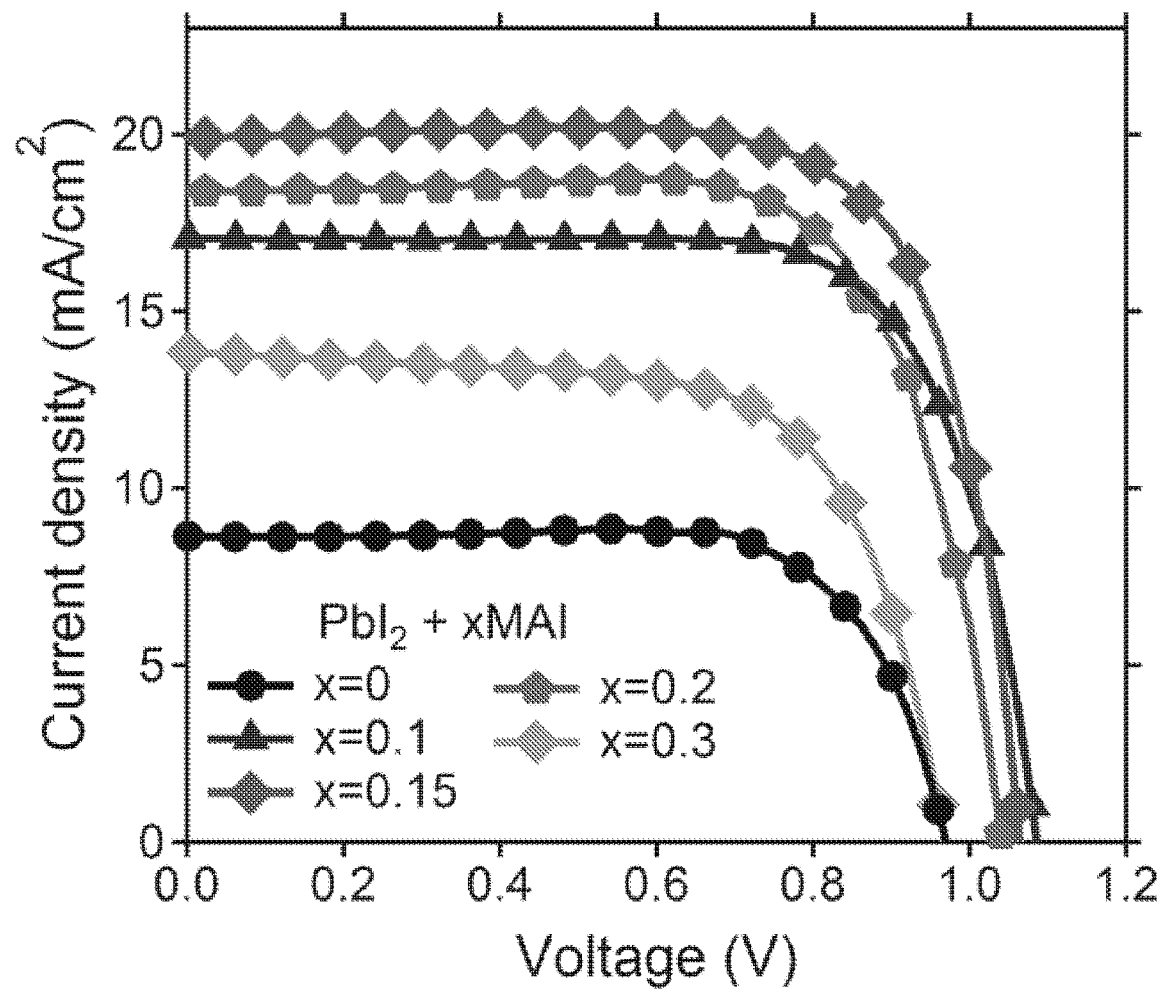
FIG. 32 is a graph showing the typical J-V curves of planar $CH_3NH_3PbI_3$ solar cells prepared from $PbI_2$.xMAI precursor films.
Figure 33:
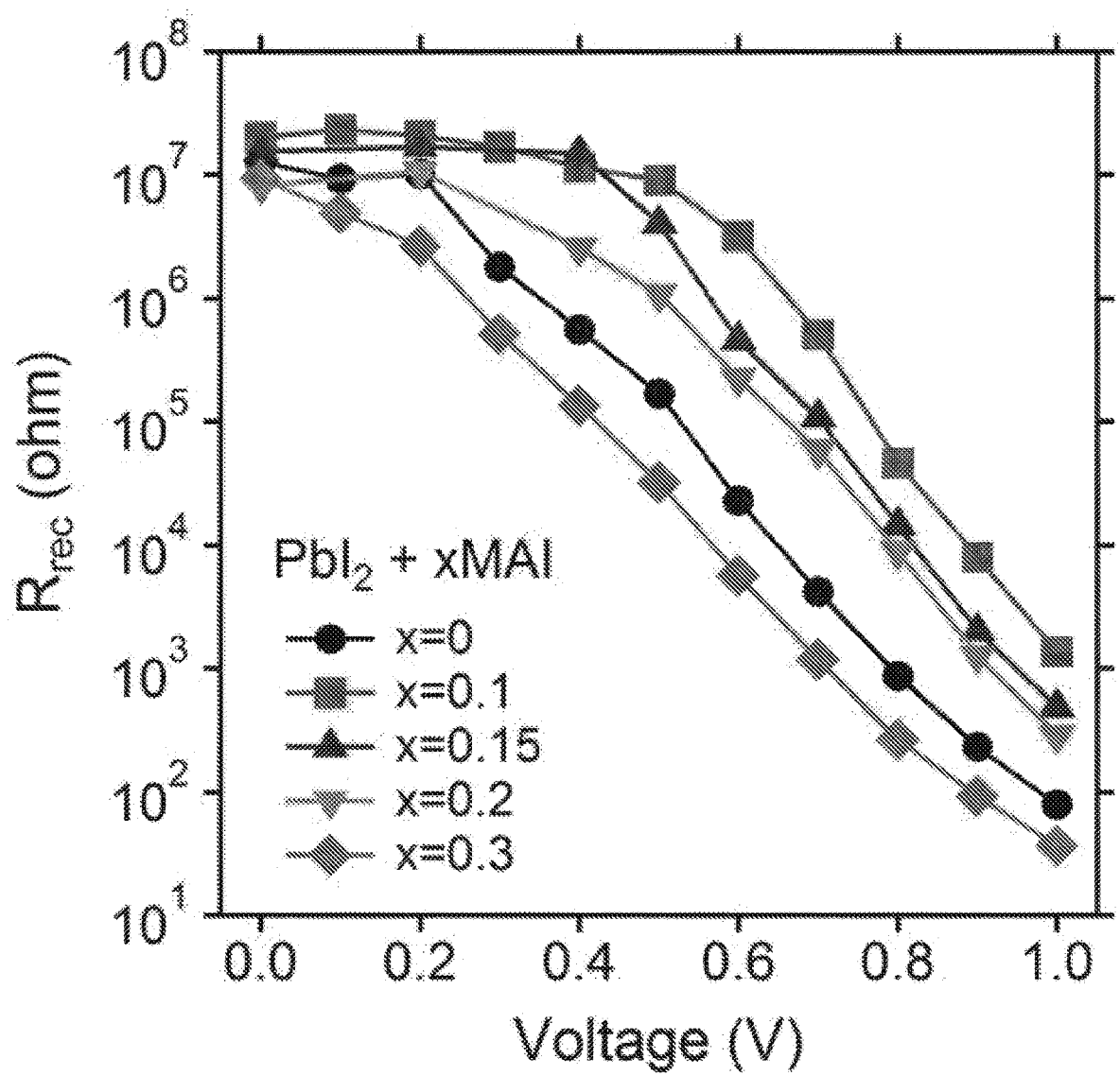
FIG. 33 shows plots of recombination resistance $R_{rec}$ as a function of voltage for solar cells prepared with different $PbI_2$.xMAI precursor compositions (x: 0-0.3).
Figure 34A:
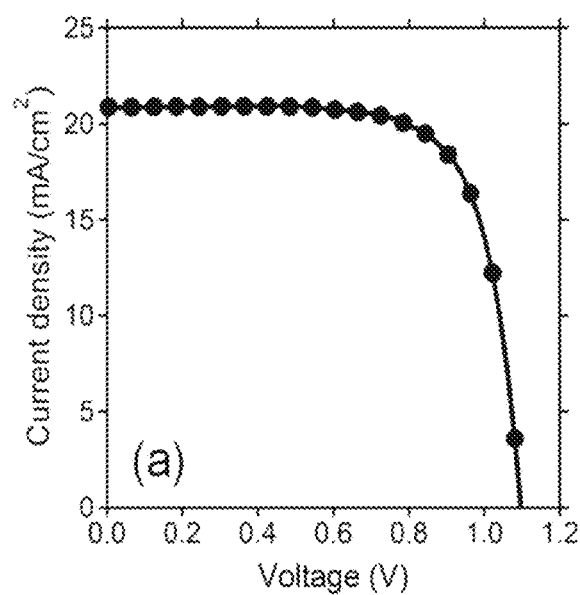
FIGS. 34*a-b* are (a) the J-V curve of a planar $CH_3NH_3PbI_3$ solar cell prepared from $PbI_2$.0.15MAI precursor with the highest efficiency of 16.76% ($J_{sc}$=20.86 $mA/cm^2$, $V_{oc}$=1.09 V, FF=0.737) under simulated one-sun illumination; and (b) the stability of power conversion efficiency as a function of time for the same cell in (a) under simulated one-sun illumination.
Figure 34B:
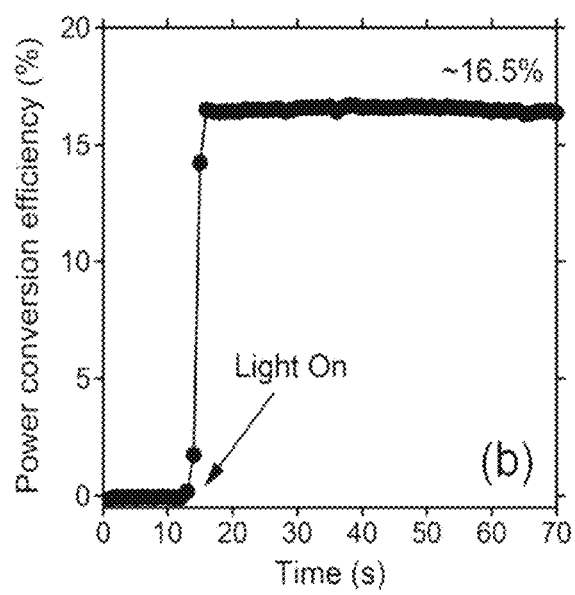

FIG. 32 summarizes photocurrent density-voltage (J-V) curves of planar $CH_3NH_3PbI_3$ solar cells prepared using different $PbI_2.xMAI$ (x: 0-0.3) under simulated one-sun illumination. These $PbI_2.xMAI$ films were dipped in the MAI solution for 2 min to form the $CH_3NH_3PbI_3$ layers, which were adjusted to about 250 nm thick. In the absence of MAI (i.e., using the standard $PbI_2$ precursor), the device shows a short-circuit photocurrent density ($J_{sc}$) of 8.847 mA/cm$^2$, open-circuit voltage ($V_{oc}$) of 0.969 V, fill factor (FF) of 0.712, and overall conversion efficiency ($\eta$) of 6.105%. The cell efficiency increases significantly when 0.1-0.2 MAI along with $PbI_2$ is used during the first-step deposition, especially when 0.15 MAI is used. A typical efficiency for the 0.15 MAI based device is increased to 15.622% with the $J_{sc}$ of 19.888 mA/cm$^2$, $V_{oc}$ of 1.065 and FF of 0.738. The performance improvement is largely determined by the increased $J_{sc}$ value associated with enhanced $PbI_2$ conversion process and less perovskite damage resulting from minimized interaction with IPA solvent. The $V_{oc}$ and FF values for the devices based on 0.1-0.2 MAI are also significantly larger than those of the cells based on the standard, pure $PbI_2$. However when 0.3 MAI is used, all device parameters are reduced with a typical $J_{sc}$ of 13.867 mA/cm$^2$, $V_{oc}$ of 0.967 V and FF of 0.668, yielding an efficiency of 8.977%. This is presumably due to the coarser morphology of $CH_3NH_3PbI_3$ when 0.3 MAI is used, since there is no $PbI_2$ residue found in the perovskite film. The significant drop in cell performance of the 0.3 MAI based device is consistent with its much reduced recombination resistance (or faster recombination) compared to the 0.1-0.2 MAI-based cells (FIG. 33). The details of photovoltaic parameters of all these devices including the statistical analysis (mean values and standard deviations) for each type of devices are given in Table 6. Using 0.15 MAI, the best cell efficiency recorded is 16.76% (FIG. 34a). The maximum power output of this device stabilizes at the efficiency of about 16.5% (FIG. 34b), which is in good agreement with the value obtained from the J-V measurement.

TABLE 6

Effect of PbI$_2$•xMAI precursor composition (x: 0-0.3) on the device parameters of typical planar perovskite CH$_3$NH$_3$PbI$_3$ solar cells using two-step sequential deposition. The mean values and standard deviations of the device parameters from about 8 to 16 cells for each type of devices are given in parentheses.

| Precursor Type | $J_{sc}$ (mA/cm$^2$) | $V_{oc}$ (V) | FF | η (%) |
| --- | --- | --- | --- | --- |
| PbI$_2$ (standard) | 8.847 | 0.969 | 0.712 | 6.105 |
| | (9.067 ± 0.790) | (0.995 ± 0.036) | (0.657 ± 0.069) | (5.914 ± 0.479) |
| PbI$_2$ + 0.1MAI | 17.069 | 1.089 | 0.726 | 13.494 |
| | (18.009 ± 1.603) | (1.097 ± 0.013) | (0.714 ± 0.039) | (14.087 ± 1.208) |
| PbI$_2$ + 0.15MAI | 19.888 | 1.065 | 0.738 | 15.622 |
| | (20.388 ± 0.815) | (1.085 ± 0.009) | (0.714 ± 0.027) | (15.798 ± 0.618) |
| PbI$_2$ + 0.2MAI | 18.372 | 1.041 | 0.729 | 13.928 |
| | (18.526 ± 0.792) | (1.056 ± 0.020) | (0.721 ± 0.063) | (14.263 ± 1.253) |
| PbI$_2$ + 0.3MAI | 13.867 | 0.967 | 0.668 | 8.977 |
| | (14.013 ± 1.300) | (0.949 ± 0.024) | (0.642 ± 0.034) | (8.519 ± 0.712) |

In summary, the present disclosure provides the use of a precursor composition comprising a mixture of PbI$_2$ and MAI (molar ratio 1:x, where x varies from 0.1 to 0.3) to replace the pure PbI$_2$ used in the standard two-step sequential solution deposition of CH$_3$NH$_3$PbI$_3$. In comparison to the standard two-step approach, the use of additive MAI during the first step deposition leads to about 10-fold faster CH$_3$NH$_3$PbI$_3$ formation without any PbI$_2$ residue during the second MM intercalation step and ultimately results in a much improved device performance when 0.1-0.2 MAI is used. The morphology of the CH$_3$NH$_3$PbI$_3$ film depends on the relative amount of MAI used in the PbI$_2$.xMAI precursor films during the first-step deposition, and generally demonstrates a smoother surface morphology when 0.1-0.2 MAI is used. Adding a small amount of MAI is found to lead to the formation of amorphous PbI$_2$.MAI, the pre-expansion of the PbI$_2$ matrix, and reduced crystallinity of PbI$_2$, all of which favor the complete conversion within a short period of time and thus minimizes the negative impact of the IPA solvent on the integrity of the CH$_3$NH$_3$PbI$_3$ film during the second dipping/conversion step of the standard two-step process. This new first-step precursor (PbI$_2$.xMAI) is promising for facile preparation of high-quality planar CH$_3$NH$_3$PbI$_3$ films with controllable morphologies via the new two-step sequential solution deposition methods described herein, to fabricate high-performance perovskite solar cells.

Experimental Setup and Device Preparation

CH$_3$NH$_3$I (MAI) was synthesized by reacting methylamine (33 wt % ethanol solution) and hydroiodic acid (57 wt % in water, Aldrich) and purified as previously reported. Unless otherwise stated, the mixtures of 0.784 g PbI$_2$ (1.7 mmol) and 0, 0.027 g (0.17 mmol), 0.041 g (0.26 mmol), 0.054 g (0.34 mmol), or 0.081 g MAI (0.51 mmol) were dissolved in 2 mL dimethylformamide (DMF) at room temperature to form five different precursor solutions with mixed PbI$_2$ and MAI with a molar ratio of 1:x—noted as PbI$_2$.xMAI (x=0, 0.1, 0.15, 0.2, 0.3, respectively).

A patterned fluorine-doped tin oxide (FTO) was first deposited with a blocking layer by spray pyrolysis at 450° C. using 0.2 M Ti(IV) bis(ethyl acetoacetate)-diisopropoxide 1-butanol solution, followed by 450° C. annealing in air for one hour. The different PbI$_2$.xMAI films were prepared by spin coating different PbI$_2$.xMAI precursor solutions (pre-warmed at 65° C.) onto the substrate at 65° C. at 6,000 rpm for 15 s. The spin coated PbI$_2$.xMAI films were dried in air for about 30-60 min before dipping in the 10 mg/mL MAI solution at 55° C. for different duration. After quickly rinsing by anhydrous IPA twice, the CH$_3$NH$_3$PbI$_3$ perovskite films were annealed on a hotplate at 150° C. for about 1 min, and then washed again by spin coating IPA at 4,000 rpm for 15 s, followed by an additional annealing at 150° C. for 1 min. A hole-transport material (HTM) solution was spin-coated on the perovskite-covered TiO$_2$ electrodes at 4,000 rpm for 30 s. The HTM solution consists of 0.065 M spiro-MeOTAD, 0.053 M bis(trifluoromethane)sulfonimide lithium salt (Li-TFSi) and 0.20 M 4-tert-butylpyridine (tBP) in chlorobenzene/acetonitrile (30:1, v/v) solution. Finally, a 150-nm-thick Ag layer was deposited on the HTM layer by thermal evaporation. A typical cell area was about 0.12 cm$^2$ as defined by a shadow mask.

The crystal structures of the perovskite films were characterized by X-ray diffraction (XRD, Shimadzu XRD-6100 diffractometer with Cu Kα radiation). The morphologies of the perovskite films were examined on a FEI Sirion 200 scanning electron microscope (SEM). The optical absorption spectra of CH$_3$NH$_3$PbI$_3$ perovskite films were measured by a UV/Vis spectrophotometer (Cary-60). The photocurrent-voltage (J-V) characteristic and continuous power output of perovskite CH$_3$NH$_3$PbI$_3$ solar cells were measured respectively with a Keithley 2400 source meter and a potentiostat (Princeton Applied Research, VersaSTAT MC) under the simulated AM 1.5G illumination (100 mW/cm$^2$; Oriel Sol3A Class AAA Solar Simulator). Film thickness was measured by a surface profilometer (Dektak 8). Impedance spectroscopy (IS) was done using a PARSTAT 2273 workstation with the frequency range of 0.1 Hz-100 kHz and the modulation amplitude of 10 mV. The IS spectra were analyzed using ZView 2.9c software (Scribner Associates).

Example 5: Ammonia Sensing

It has been found that (CH$_3$NH$_3$)PbI$_3$ is not stable (with color bleaching) under polar solvents or in solutions containing high iodine/iodide concentrations. Although the exact mechanism underlying this stability issue is unclear, the reported color bleaching for (CH$_3$NH$_3$)PbI$_3$ is irreversible. The (CH$_3$NH$_3$)PbI$_3$ film changes its color from brown to yellow when exposed to water, and cannot turn back from yellow to brown after the removal of water. This disclosure shows that the NH$_3$ gas induces a phase transformation of the perovskite (CH$_3$NH$_3$)PbI$_3$ film, leading to a rapid (<1 s) change of its color from brown to transparent across the entire visible spectral range. This color change is reversed within seconds upon removing the NH$_3$ gas. These findings suggest the potential use of perovskite halides (e.g., (CH$_3$NH$_3$)PbI$_3$) for NH$_3$ sensor applications. It is believed that this special material property of $(CH_3NH_3)PbI_3$ or similar halide perovskites could inspire a broader range of applications and fundamental investigations.

The $(CH_3NH_3)PbI_3$ films were deposited onto mesoporous $TiO_2$ nanocrystalline films on fluorine-doped tin oxide (FTO) by spin coating using a γ-butyrolactone solution comprising 35 wt % of stoichiometric $PbI_2$ and $CH_3NH_3I$, as described in previous reports. The effects of ammonia on the structural and optical properties of perovskite $(CH_3NH_3)PbI_3$ films were studied by X-ray diffraction (XRD, Rigaku D/Max 2200 diffractometer with Cu Kα radiation) and ultraviolet-visible (UV-vis, Cary-6000i) absorption techniques. The transient photoresponse of $(CH_3NH_3)PbI_3$ associated with the introduction and removal of the $NH_3$ source was probed with a 660-nm illumination using a silicon detector connected to a potentiostat (PARSTAT 2273).

Figure 35A:
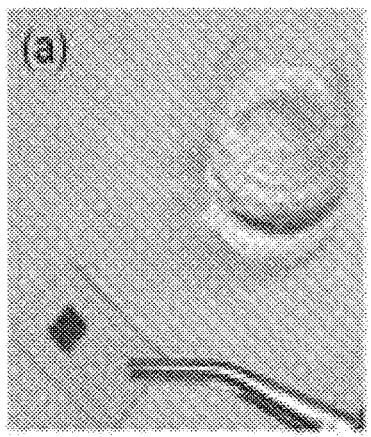
FIGS. 35*a-c* are the sequence (a) to (c) of the color change of a $(CH_3NH_3)PbI_3$ film (deposited on a mesoporous $TiO_2$ film on FTO) passing through the top opening of a 3% $NH_3$ solution bottle.
Figure 35B:
Figure 35C:
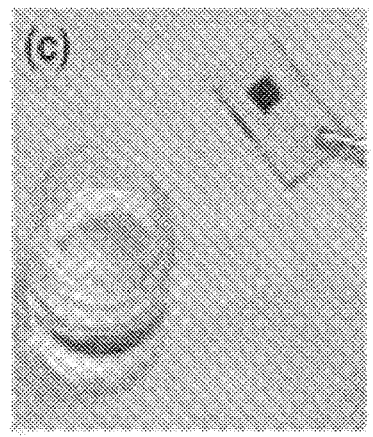

FIGS. 35a-c show the sequence (left to right) of the color change of a $(CH_3NH_3)PbI_3$ film passing through the top opening of a bottle containing a 3% $NH_3$ solution. The perovskite film is deposited on a mesoporous $TiO_2$ film on FTO. The sample is held at each position for about 1-2 seconds. Interestingly, we find that the brown $(CH_3NH_3)PbI_3$ film (FIG. 35a) immediately becomes nearly colorless when it is in contact with the $NH_3$ gas (FIG. 35b), and rapidly turns back to the brown color once the $NH_3$ source is removed (FIG. 35c).

Figure 36A:
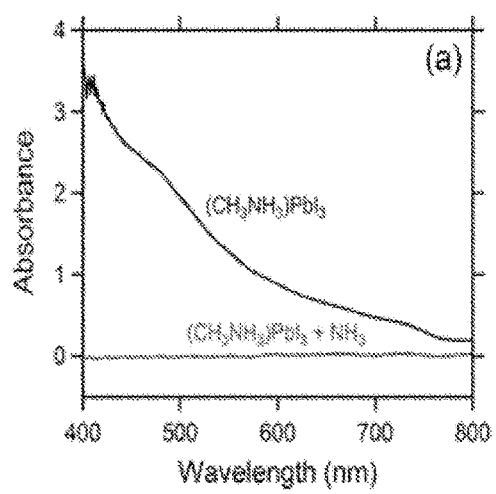
FIGS. 36*a-b* are (a) UV-vis absorption spectra of a $(CH_3NH_3)PbI_3$ film in the absence and in the presence of $NH_3$ gas; and (b) the photoresponse (transmitted light intensity) of a $(CH_3NH_3)PbI_3$ film at 660 nm as measured by a silicon detector in response to the introduction (on) and removal (off) of $NH_3$ gas.
Figure 36B:
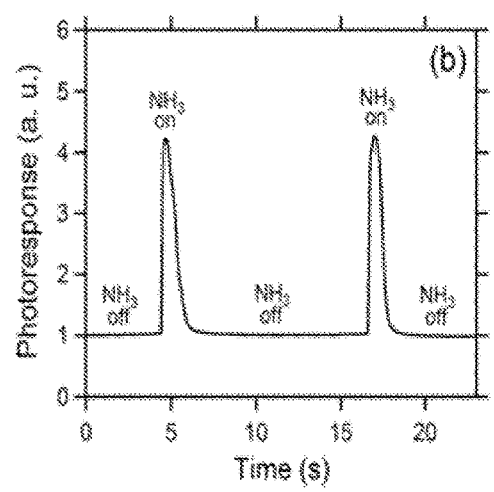

FIGS. 36a-b includes (a) UV-vis absorption spectra of a $(CH_3NH_3)PbI_3$ film in the absence and in the presence of $NH_3$ gas. (b) Photoresponse (transmitted light intensity) of a $(CH_3NH_3)PbI_3$ film at 660 nm as measured by a silicon detector in response to the introduction (on) and removal (off) of $NH_3$ gas. FIG. 36a compares the UV-vis absorption spectra of the perovskite $(CH_3NH_3)PbI_3$ film in the absence and in the presence of $NH_3$. In the absence of $NH_3$, the $(CH_3NH_3)PbI_3$ film starts to absorb around 750-800 nm and absorbs strongly below 600 nm, which agrees with our previous study. In contrast, the absorption spectrum of the $(CH_3NH_3)PbI_3$ film across the entire visible region is essentially reduced to zero (i.e., the film becomes transparent in the visible region) when the perovskite film is exposed to the $NH_3$ gas.

The significant contrast of the optical absorption of the perovskite $(CH_3NH_3)PbI_3$ film in the presence and in the absence of $NH_3$ suggests that the $(CH_3NH_3)PbI_3$ film could potentially be used for optical $NH_3$ sensing applications. Because the perovskite $(CH_3NH_3)PbI_3$ film has a very wide response over the entire visible spectral range (i.e., the disappearance/substantial decrease of the entire absorption spectrum from 400 to 800 nm), the change of the absorption spectrum of the $(CH_3NH_3)PbI_3$ film at any single wavelength or wavelength range from 400 to 800 nm can be used. FIG. 36b shows the photoresponse (transmitted light intensity) at 660 nm as measured by a silicon detector. The transmitted light intensity increases immediately (<1 s) after the introduction of $NH_3$ and also decreases quickly (1-2 s) after $NH_3$ is removed. It is noteworthy that other perovskite halides (e.g., $(CH_3NH_3)PbI_{3-x}Cl_x$ and $(CH_3NH_3)PbBr_3$) exhibit similar optical changes in the presence of $NH_3$.

Figure 37:
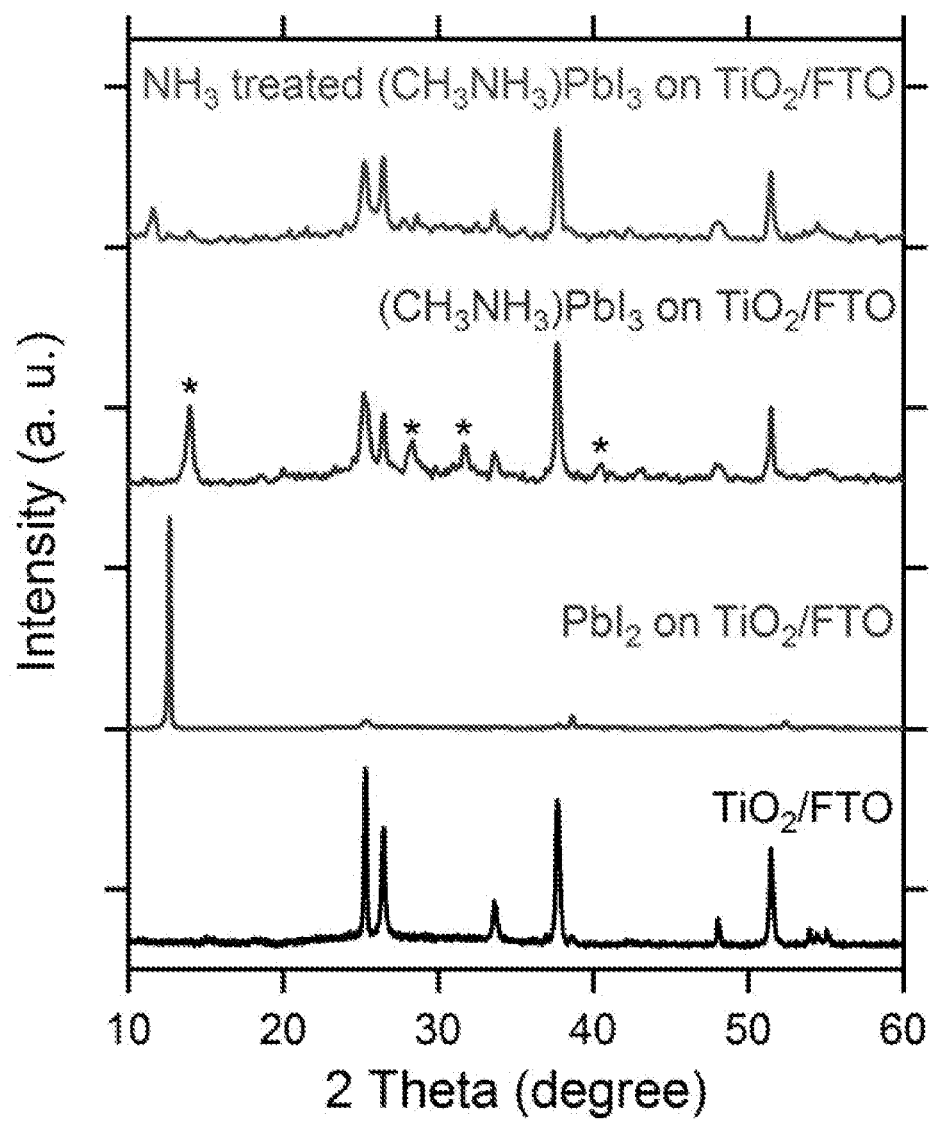
FIG. 37 depicts XRD patterns of the $TiO_2/FTO$ substrate (black line), a $PbI_2$ film on $TiO_2/FTO$, a $(CH_3NH_3)PbI_3$ film on $TiO_2/FTO$, and the $NH_3$-treated $(CH_3NH_3)PbI_3$ film on $TiO_2/FTO$. The asterisks denote the characteristic XRD peaks for $(CH_3NH_3)PbI_3$.

To understand the effect of $NH_3$ on the optical change of the perovskite film, we carried out XRD measurements on the perovskite samples in the presence and in the absence of the $NH_3$ environment (FIG. 37). For comparison, the XRD patterns of the $TiO_2$/FTO substrate and $PbI_2$ deposited on the $TiO_2$/FTO substrate are also shown in FIG. 37. The perovskite $(CH_3NH_3)PbI_3$ film shows the standard XRD pattern, as we described previously. Several characteristic peaks associated with the perovskite structure are denoted with asterisks. The XRD pattern of the perovskite film changes substantially after the film is exposed to the $NH_3$ gas. The characteristic XRD peaks (e.g., at 14.02°) for $(CH_3NH_3)PbI_3$ either disappear or become indistinguishable from the background signal. Interestingly, an unknown peak at about 11.6° arises after the $NH_3$ treatment. This characteristic peak cannot be assigned to either $(CH_3NH_3)PbI_3$ or $PbI_2$. It is also noteworthy that the XRD pattern of the $(CH_3NH_3)PbI_3$ film in the presence of $NH_3$ cannot be matched to other possible compounds such as $NH_4PbI_3$, $Pb(NH_3)_4I_3$ and $NH_4PbI_3 \cdot xH_2O$. Thus, further studies are required to identify the crystal structure of the perovskite film subjected to the $NH_3$ treatment. Based on the results above, it is evident that the dramatic change of the optical property of the perovskite film results from its interaction with $NH_3$ at room temperature.

To our knowledge, previous studies provide virtually no information on the phase transition of organometallic halide perovskites induced by $NH_3$ at room temperature. It is well known that metal oxide perovskites (e.g., $Sr_2RuO_4$) are layered materials (due to their strong in-plane chemical bonding and weak out-of-plane bonding) and thus can be easily exfoliated by a solution process. The metal oxide perovskites are usually exfoliated through a liquid-phase transformative process via ion-exchange and intercalation reactions. $PbI_2$ also has a layered structure. It was shown previously that the yellow $PbI_2$ can turn colorless by reacting with nitrogen-containing molecules (e.g., ammonia or pyridine) to form either an intercalation compound or a coordination complex; these colorless products can largely reverse back to the yellow $PbI_2$ once the nitrogen source is removed. Inasmuch as $(CH_3NH_3)PbI_3$ shows essentially the same optical change as $PbI_2$ when $NH_3$ is introduced to or removed from the perovskite film, we hypothesize that $NH_3$ either intercalates into or forms a new coordination complex with the perovskite network and that the crystal structure of $(CH_3NH_3)PbI_3$ can also be largely restored once the $NH_3$ source is removed. It is noteworthy that the $(CH_3NH_3)PbI_3$ film exposed to $NH_3$ for a long period of time (e.g., tens of minutes) does not turn back to the brown color when the $NH_3$ source is removed. The exact mechanism of $NH_3$-induced phase transformation of $(CH_3NH_3)PbI_3$ is still uncertain. Further studies are required to understand how the crystal structure of $(CH_3NH_3)PbI_3$ evolves in the presence of $NH_3$ and then how the crystal structure of $NH_3$-treated $(CH_3NH_3)PbI_3$ changes with the removal of the $NH_3$ environment.

In summary, we investigated the impact of a $NH_3$ gas environment on the structural and optical properties of perovskite $(CH_3NH_3)PbI_3$. A mild treatment of $NH_3$ to $(CH_3NH_3)PbI_3$ at room temperature strongly affects its crystal structure and physical appearance. The color of the $(CH_3NH_3)PbI_3$ film changes immediately (<1 s) from brown to colorless (i.e., transparent from 400 to 800 nm) in the presence of $NH_3$. The color of the $NH_3$-treated $(CH_3NH_3)PbI_3$ film turns back to brown within 1-2 s after the $NH_3$ environment is removed. XRD measurements show that the crystal structure of perovskite $(CH_3NH_3)PbI_3$ changes significantly when the perovskite film is exposed to $NH_3$. This structure change could result from the formation of either an intercalation compound or a coordination complex from $(CH_3NH_3)PbI_3$ and $NH_3$. The results of this study imply that organometallic halide perovskites (e.g., $(CH_3NH_3)PbI_3$) could potentially be used as ammonia sensors with both a fast response time and a wide range of spectral response. Thus, understanding how halide perovskites interact with their surrounding environment will help researchers fully use the unique properties of this new absorber system for solar cell applications, but may also lead to potential applications of these materials in different fields.

Example 6: Molybdenum Oxide Top Contact

At present, perovskite solar cells are often made with two types of common device architectures, i.e., either mesostructured or planar thin-film solar cells. The first type is similar to the conventional solid-state dye-sensitized solar cells (DSSCs). A key component of this device configuration is a mesoporous metal-oxide (e.g., $TiO_2$) layer that is first coated with nanostructured perovskite absorbers and then infiltrated with a hole transport material (HTM; e.g., spiro-MeOTAD). In addition to being the light absorber, perovskite can also be used as a hole conductor. In this situation, the standard HTM layer can be avoided. For the planar perovskite solar cells, a thin layer (a few hundred nanometers) of perovskite absorber is sandwiched between the electron- and hole-contact layers (e.g., $TiO_2$ and spiro-MeOTAD, respectively). For both the mesostructured and planar perovskite solar cells, a layer (about 80-150 nm thick) of Au or Ag is often used as the top metal contact for carrier extraction. Replacing Au or Ag with a low-cost material/structure that can also effectively extract photogenerated holes would help reduce the overall cost for producing perovskite solar cells.

This disclosure demonstrates that a thin layer (10 nm) of molybdenum oxide ($MoO_x$) coupled with Al can be used as an effective top-contact structure for extracting photogenerated holes from perovskite $CH_3NH_3PbI_3$ solar cells. In recent years, transition metal oxides (TMO; e.g., $MoO_x$) have been used as either an interlayer or buffer layer for a variety of optoelectronic devices to improve either hole injection (e.g., in organic light-emitting diodes) or hole extraction (e.g., in organic photovoltaics, CdTe, Si, and quantum-dot solar cells). We find that the device performance of perovskite solar cells using a $MoO_x$/Al top contact is comparable to that of cells using the standard Ag top contact. Analysis of impedance spectroscopy measurements shows that using 10-nm-thick $MoO_x$ and Al does not affect charge-recombination properties. However, a thicker (20-nm) $MoO_x$ layer leads to decreased cell performance resulting primarily from a reduced fill factor.

The precursor of $CH_3NH_3I$ was synthesized and purified as previously reported. The pre-patterned fluorine-doped $SnO_2$-coated glass substrate (FTO; TEC15, Hartford, USA) was coated with a compact $TiO_2$ layer by spray pyrolysis using 0.2 M Ti(IV) bis(ethyl acetoacetate)-diisopropoxide in 1-butanol at 450° C. A mixture of $PbCl_2$ and $CH_3NH_3I$ (1:3 molar ratio) was dissolved in dimethylformamide (DMF) to form the precursor solution, which was spin-coated onto the $TiO_2$/FTO substrate at 2500 rpm for 10 s, followed by annealing at 100° C. for 45 min in air. A spiro-MeOTAD-based HTM solution with a previously reported recipe was spin-coated on the perovskite-covered $TiO_2$ electrodes at 4000 rpm for 30 s. A thin layer (0-20 nm) of $MoO_x$ was deposited by thermal evaporation. Finally, a 150-nm-thick metal (Ag or Al) layer was deposited by thermal evaporation. The active area of each device was about 0.2-0.3 $cm^2$. The X-ray diffraction (XRD) patterns of the perovskite films were conducted using Rigaku D/Max 2200 diffractometer with Cu Kα radiation. The ultraviolet/visible (UV/vis) spectra were characterized by an ultraviolet/visible-near infrared (UV/vis-NIR) spectrophotometer (Cary-6000i). The morphology of perovskite film was examined by a field-emission scanning electron microscopy (FE-SEM, JEOL JSM-7000F). The photocurrent density-voltage (J-V) characteristic of perovskite solar cells were studied using a class AAA solar simulator (Oriel Sol3A). Impedance spectroscopy (IS) was done with a PARSTAT 2273 workstation with the frequency range of 0.1 Hz-100 kHz and modulation amplitude of 10 mV.

Figure 38:
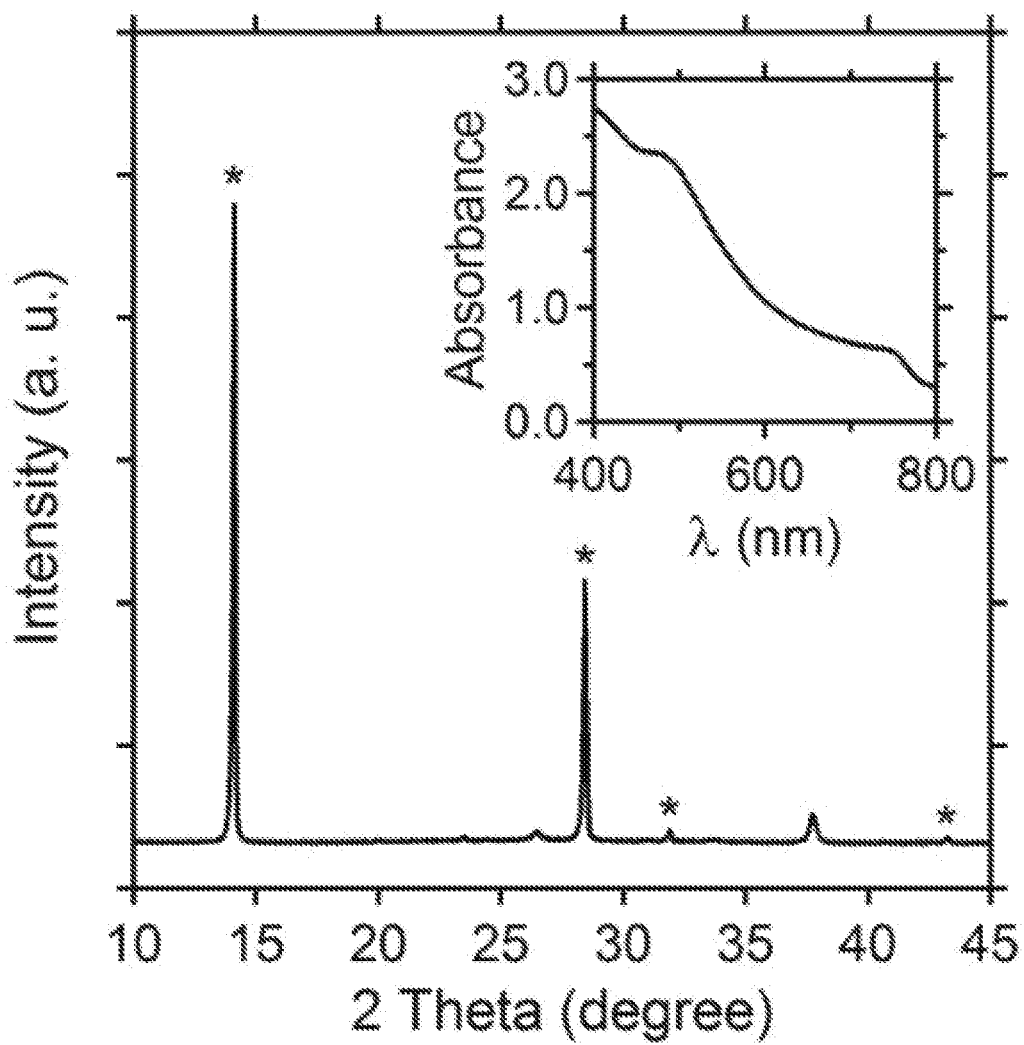
FIG. 38 depicts XRD patterns and UV-vis absorption spectra of perovskite $CH_3NH_3PbI_3$ deposited on a compact $TiO_2$ layer on the FTO substrate.

FIG. 38 displays the XRD patterns of a perovskite $CH_3NH_3PbI_3$ film deposited on a compact $TiO_2$ layer on the FTO-coated glass substrate. We observe characteristic perovskite diffraction peaks (denoted by stars) at about 14.1, 28.44, 31.88, and 43.24°, respectively, corresponding to the diffractions from (110), (220), (310), and (314) crystal planes of the $CH_3NH_3PbI_3$ perovskite structure. The positions of these diffraction peaks are consistent with previous reports. The other XRD peaks are attributable to the $TiO_2$/FTO substrate. No secondary phases (e.g., $PbI_2$) are found. The typical UV-vis absorption spectrum for the same perovskite $CH_3NH_3PbI_3$ film is shown in the inset of FIG. 38. Consistent with our previous reports, the $CH_3NH_3PbI_3$ film strongly absorbs the illumination below 600 nm. The absorbance of $CH_3NH_3PbI_3$ decreases slightly with increasing wavelength from about 600 to 750 nm and then drops rapidly when the wavelength approaches the bandgap near 800 nm.

FIG. 39a shows the typical cross-sectional SEM image of the planar perovskite $CH_3NH_3PbI_3$ solar cell with the following layered structure: FTO/compact $TiO_2$/perovskite absorber/spiro-MeOTAD/$MoO_x$/metal. In this study, the metal layer is either Ag or Al. Although it is not evident in the SEM image, a 10-nm $MoO_x$ interlayer is deposited by thermal evaporation between the spiro-MeOTAD and metal layers. The average thickness of the $CH_3NH_3PbI_3$ layer is about 300 nm, and the average thickness of the HTM layer (spiro-MeOTAD) is about 280 nm. In FIG. 39b, we test the effect of $MoO_x$ interlayer thickness on the J-V characteristics of perovskite $CH_3NH_3PbI_3$ solar cells using the Ag top contact. In the absence of $MoO_x$, the device displays a short-circuit photocurrent density ($J_{sc}$) of 19.94 mA/$cm^2$, open-circuit voltage ($V_{oc}$) of 1.011 V, and fill factor (FF) of 0.613 to yield an efficiency (η) of 12.36%. When 5-nm and 10-nm $MoO_x$ layers are used, the respective efficiencies are 11.49% and 12.04%. The mean values and standard deviations of the PV parameters from 8-20 cells for these device architectures are given in Table 7. It is evident that the 5-nm and 10-nm $MoO_x$ cells have essentially the same performance level as the cell without the $MoO_x$ layer, within experimental error. However, when a 20-nm-thick $MoO_x$ layer is used, the cell efficiency is significantly reduced from about 12% to 9.33%. The decrease of cell efficiency is primarily caused by the much reduced FF, which is in agreement with a recent study on the effect of $MoO_x$ layer thickness on the device characteristics of Si solar cells. The details of the photovoltaic parameters ($J_{sc}$, $V_{oc}$, FF, and η) for all these cells are given in Table 7.

TABLE 7

Effect of the top layer (hole-contact) structure on the short-circuit photocurrent density $J_{sc}$, open-circuit voltage $V_{oc}$, fill factor FF, and conversion efficiency η of champion planar perovskite $CH_3NH_3PbI_3$ solar cells. The mean values and standard deviations of the PV parameters from 8-20 cells for each type of devices are given in parentheses.

| Cell Type | $J_{sc}$ (mA/cm$^2$) | $V_{oc}$ (V) | FF | η (%) |
|---|---|---|---|---|
| HTM/Ag | 19.94 | 1.011 | 0.613 | 12.36 |
| | (19.45 ± 0.90) | (0.967 ± 0.040) | (0.538 ± 0.043) | (10.13 ± 0.99) |
| HTM/5-nm MoO$_x$/Ag | 19.60 | 0.985 | 0.595 | 11.49 |
| | (19.43 ± 0.60) | (0.952 ± 0.026) | (0.544 ± 0.027) | (10.08 ± 0.81) |
| HTM/10-nm MoO$_x$/Ag | 20.14 | 0.993 | 0.602 | 12.04 |
| | (20.37 ± 0.95) | (0.962 ± 0.021) | (0.543 ± 0.036) | (10.63 ± 0.70) |
| HTM/20-nm MoO$_x$/Ag | 19.56 | 1.008 | 0.473 | 9.33 |
| | (19.22 ± 0.82) | (0.964 ± 0.024) | (0.439 ± 0.025) | (8.15 ± 0.64) |
| HTM/10-nm MoO$_x$/Al | 19.55 | 0.990 | 0.590 | 11.42 |
| | (19.31 ± 0.85) | (0.972 ± 0.023) | (0.542 ± 0.030) | (9.85 ± 0.91) |
| HTM/Al | 0.92 | 0.182 | 0.165 | 0.027 |
| | (0.67 ± 0.26) | (0.119 ± 0.104) | (0.203 ± 0.060) | (0.015 ± 0.011) |
| 10-nm MoO$_x$/Ag | 0.84 | 0.045 | 0.261 | 0.01 |
| | (0.66 ± 0.13) | (0.034 ± 0.016) | (0.254 ± 0.025) | (0.006 ± 0.003) |

Figure 40A:
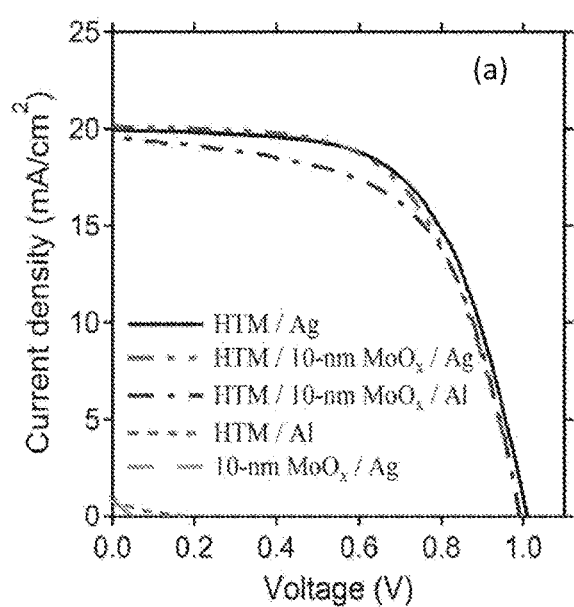
FIGS. 40*a-b* are a comparison of (a) J-V characteristics and (b) IPCE of perovskite $CH_3NH_3PbI_3$ solar cells using different top-contact structures as indicated.
Figure 40B:
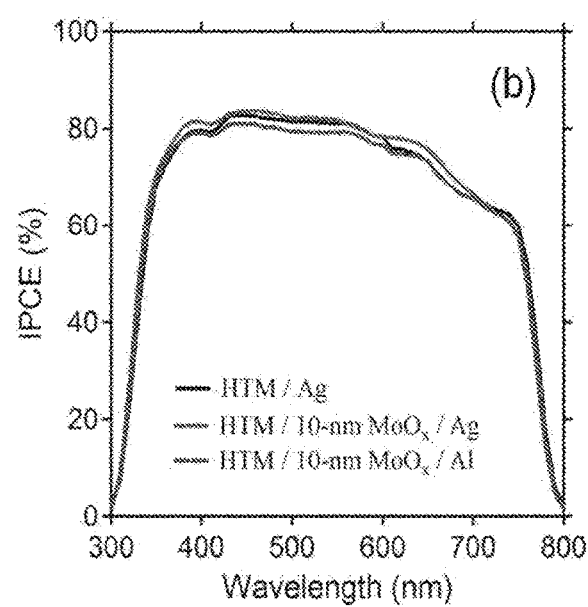

Having established that MoO$_x$ works as an effective interlayer for hole extraction in our regular device architecture, we compare in FIG. 40a the J-V characteristics of perovskite $CH_3NH_3PbI_3$ solar cells using different top-contact structures, including: (1) HTM/Ag, (2) HTM/MoO$_x$/Ag, (3) HTM/MoO$_x$/Al, (4) HTM/Al, and (5) MoO$_x$/Ag (no HTM). For top-contact structures (2), (3), and (5), we used a fixed 10-nm-thick MoO$_x$ layer. The composition of the spiro-MeOTAD-based HTM layer is given in detail in the experimental section. Using the HTM/MoO$_x$/Al contact structure, the cell efficiency is 11.42% with a $J_{sc}$ of 19.55 mA/cm$^2$, $V_{oc}$ of 0.990 V, and FF of 0.590. All of these parameters are comparable to those of the cells using HTM/Ag and HTM/MoO$_x$/Ag contact structures (Table 7). Consistent with the J-V results, the incident photon-to-current efficiency (IPCE) spectra for cells based on contact structures (1)-(3) are essentially identical (FIG. 40b). These results suggest that the junction between MoO$_x$ and the metal contact is not critical to hole extraction in perovskite solar cells. This observation agrees with other studies where MoO$_x$ is used as an interlayer in organic solar cells and quantum-dot solar cells[28] to facilitate extraction of photogenerated holes. It is worth noting that these studies demonstrated improved cell performance using the MoO$_x$ interlayer than the control sample without the MoO$_x$ layer. In contrast, our study shows that cells using HTM/MoO$_x$/Ag or HTM/MoO$_x$/Al have comparable performance to the control cells using HTM/Ag. This is presumably caused by the use of HTM in this study, whereas in other studies the MoO$_x$ layer is deposited directly on the absorber layer. Interestingly, we find that when Al is deposited directly on top of the HTM layer (i.e., no MoO$_x$ is used), the perovskite solar cell only shows a conversion efficiency of 0.027% with a $J_{sc}$ of 0.92 mA/cm$^2$, $V_{oc}$ of 0.182 V, and FF of 0.165. This could be attributed to the formation of a back diode at the HTM/Al interface, which creates an energy barrier limiting hole extraction. It was shown previously for PbS quantum dot solar cells that the back-diode effect can be significantly reduced when using higher work-function metals (e.g., Au or Ag) or can be completely removed by using a MoO$_x$ interlayer. It is worth noting that using MoO$_x$/Ag directly on the perovskite absorber layer (i.e., no HTM layer) leads to a 0.01% device (Table 7). This is presumably caused by shorting associated with pinholes on the absorber layer. The use of the HTM layer appears to be effective in suppressing shorting in perovskite cells.

Figure 41A:
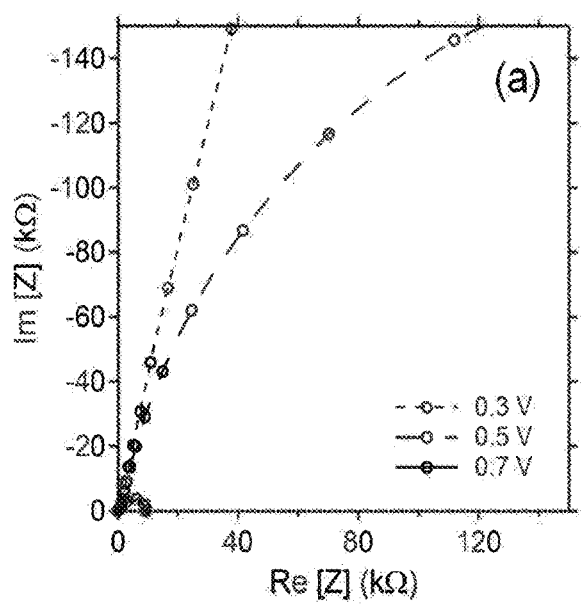
FIGS. 41*a-b* are (a) typical Nyquist plots of the impedance responses (Z) for a planar perovskite cell (using HTM/10-nm $MoO_x$/Ag) with three different bias voltages; and (b) a comparison of recombination resistance ($R_{rec}$) as a function of voltage for planar perovskite solar cells using different top-contact structures.
Figure 41B:
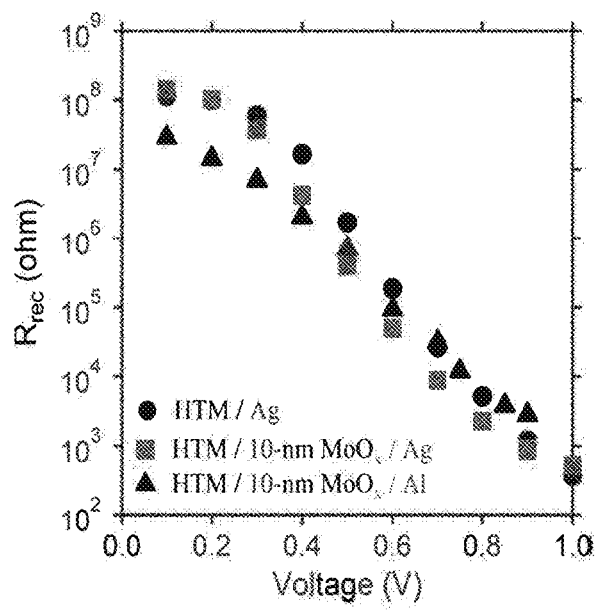

Impedance spectroscopy is used to study the impact of top-contact structure on the recombination resistance ($R_{rec}$) for the perovskite solar cells. FIG. 41a shows the typical Nyquist plots of the complex impedance Z (i.e., the imaginary component Im [Z] versus the real component Re [Z] of the impedance) for a perovskite cell with three different bias voltages. The impedance spectra are dominated by a large semicircle at low frequencies. This feature has been attributed to charge recombination either at the interface between perovskite and contact layers or within the bulk perovskite layer. A larger semicircle corresponds to a larger recombination resistance $R_{rec}$, which is inversely proportional to the recombination rate. The model used for impedance analysis has been previously discussed in detail by others. From these Nyquist plots, the recombination resistance of the perovskite cells can be determined. FIG. 41(b) shows the $R_{rec}$ values as a function of voltage for perovskite solar cells using the top-contact structures (1)-(3). The $R_{rec}$ for all these cell structures depends strongly on the bias voltage, following an approximately exponential decrease with voltage. Similar voltage dependence of recombination resistance for perovskite solar cells has been reported previously. Interestingly, there is not much difference in recombination resistance among the three samples despite the significant difference in their top-contact structures, which suggests that the MoO$_x$/metal interface does not affect charge transfer at the back contact. This is in agreement with the J-V measurements in FIG. 40a. Thus, the J-V and impedance results suggest that MoO$_x$/Al can be used as an effective hole-extraction contact to replace more expensive metal contacts (e.g., Ag or Au) for perovskite solar cells.

In summary, we demonstrate the effectiveness of using a combination of a thin layer of molybdenum oxide and aluminum as the top-contact structure for extracting photogenerated holes from perovskite solar cells. MoO$_x$ is deposited by thermal evaporation. The device performance of perovskite solar cells using a MoO$_x$/Al top contact is comparable to that of cells using the standard Ag top contact. Impedance measurements suggest that the extraction of photogenerated holes is not affected by the MoO$_x$/metal interface when proper MoO$_x$ thickness (e.g., 10 nm) is used. Using a thicker (20-nm) MoO$_x$ layer leads to decreased cell performance resulting primarily from a reduced fill factor.

Figure 42:
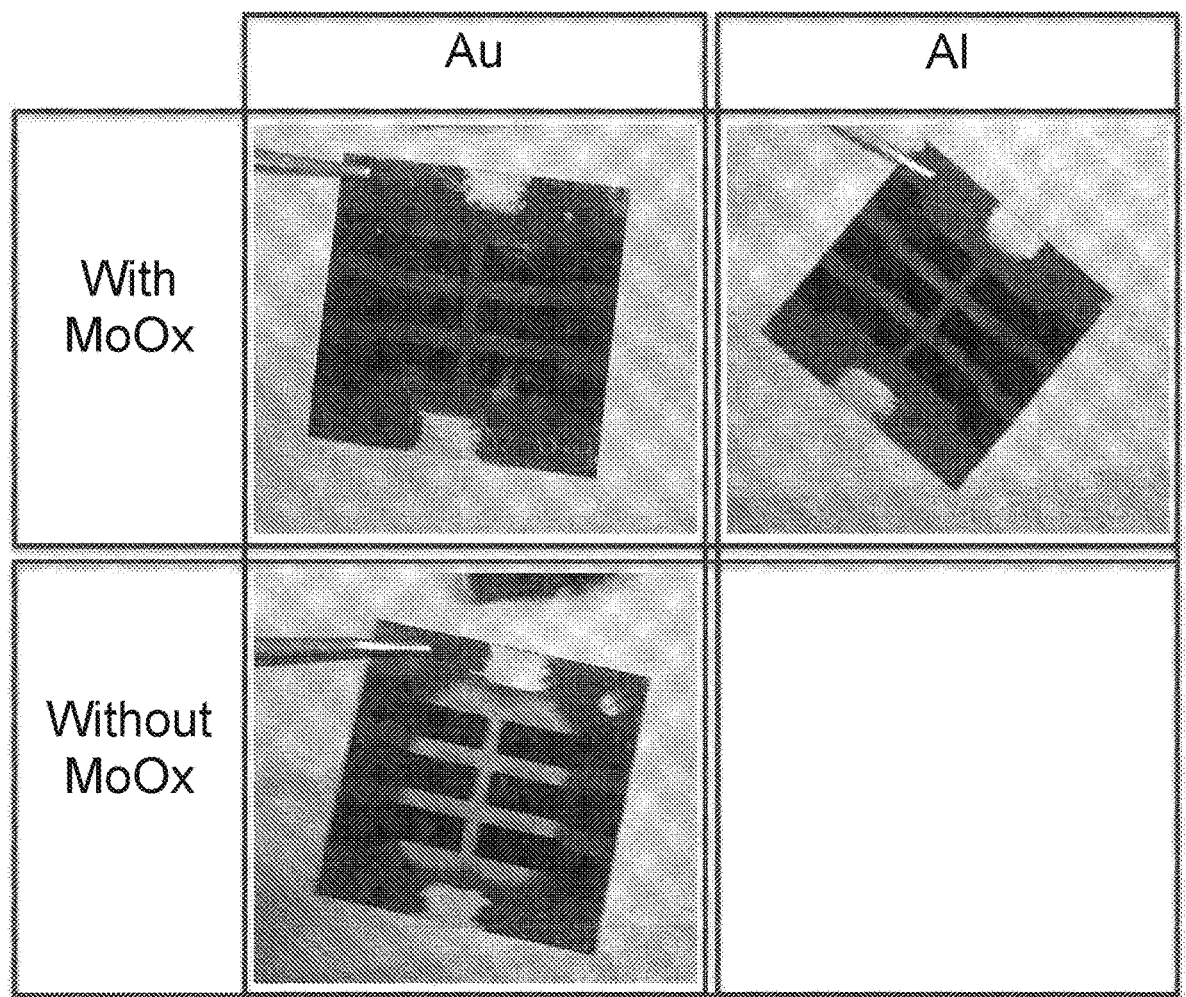
FIG. 42 shows the pictures of the perovskite solar cells after 15 hour continuous light soaking under simulated one sun illumination.

FIG. 42 shows the pictures of the perovskite solar cells after 15 hour continuous light soaking under simulated one sun illumination. The devices using MoO$_x$ showed essentially no color change of the illuminated areas. In contrast, the device without MoO$_x$ layer showed significant color change from brown to yellow, suggesting the degradation of the perovskite layer under illumination.

Figure 43:
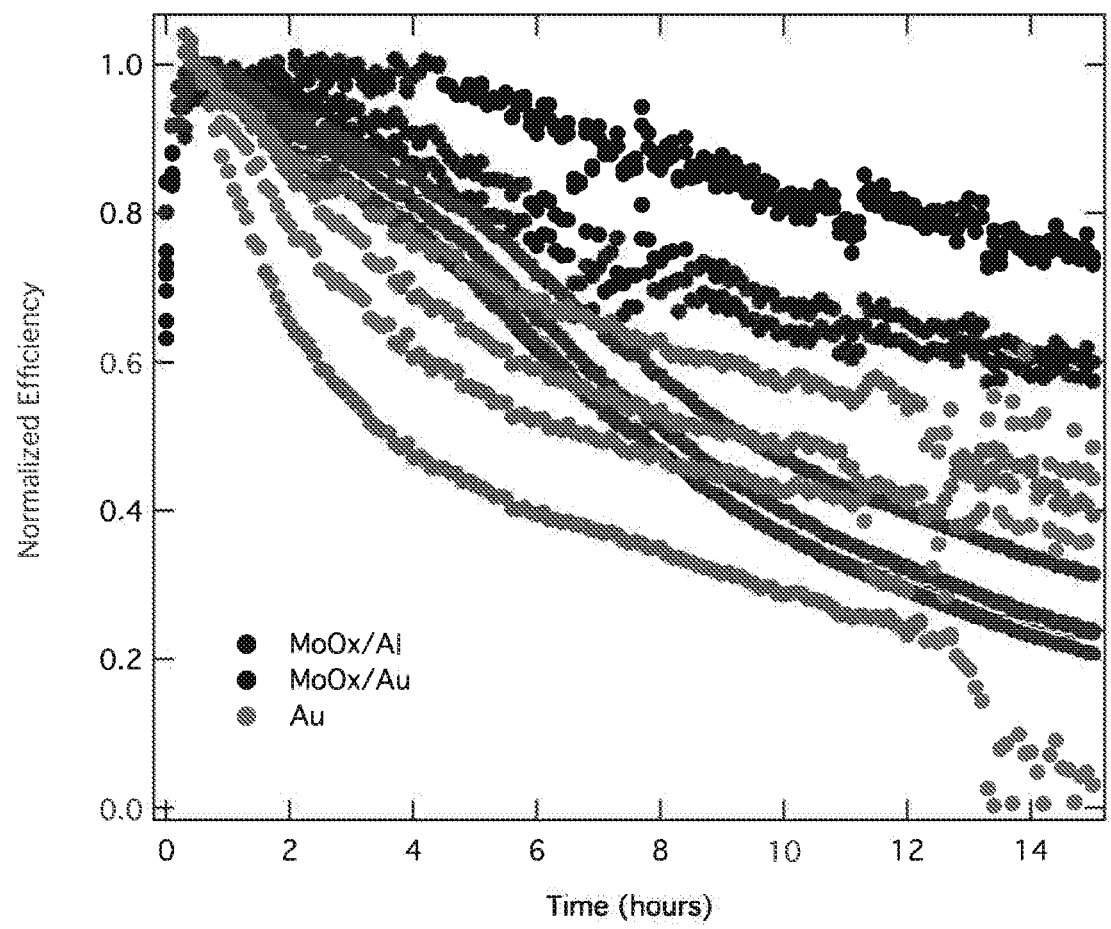
FIG. 43 shows the dependence of solar cell efficiencies as a function of continuous light soaking under simulated one sun illumination for 15 hours.

FIG. 43 shows the dependence of solar cell efficiencies as a function of continuous light soaking under simulated one sun illumination for 15 hours. The efficiencies are normalized for easy comparison. The devices using MoO$_x$/Al layer showed the best devices stability among the cells tested.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

Finally, it should be noted that there are alternative ways of implementing the embodiments disclosed herein. Accordingly, the present embodiments are to be considered as illustrative and not restrictive, and the claims are not to be limited to the details given herein, but may be modified within the scope and equivalents thereof.

From the foregoing description, various modifications and changes in the compositions and methods of the present disclosure will occur to those skilled in the art. All such modifications coming within the scope of the appended claims are intended to be included therein.

What is claimed is:

1. A method comprising:
    applying a solution onto a substrate, the solution comprising a first alkyl ammonium halide having a first halogen, a second alkyl ammonium halide having a second halogen, and a metal halide in a solvent; and
    treating the solution, wherein:
    the first halogen is different than the second halogen, the treating results in an alkyl ammonium metal halide perovskite film on the substrate, and
        the alkyl ammonium metal halide perovskite film includes only one of the first halogen or the second halogen.

2. The method of claim 1, wherein the metal halide and the second alkyl ammonium halide are present in the solution at a molar ratio of about one to one (1:1).

3. The method of claim 1, wherein the second alkyl ammonium halide and the first alkyl ammonium halide are present in the solution at a molar ratio between about 1:0.1 and about 1:4.

4. The method of claim 1, wherein the first alkyl ammonium halide is an alkyl ammonium chloride and the second alkyl ammonium halide is an alkyl ammonium iodide.

5. The method of claim 1, wherein during the treating, an intermediate alkyl ammonium metal halide perovskite film forms comprising the first halogen and the second halogen.

6. The method of claim 5, wherein the intermediate alkyl ammonium metal halide perovskite film comprises iodide.

7. The method of claim 6, wherein the intermediate alkyl ammonium metal halide perovskite film further comprises chloride.

8. The method of claim 5, wherein the intermediate alkyl ammonium metal halide perovskite film comprises at least one of a methyl ammonium metal iodide and a methyl ammonium metal chloride, or a methyl ammonium metal dihalide comprising iodide and chloride.

9. The method of claim 8, wherein the alkyl ammonium metal halide perovskite film comprises a methyl ammonium metal iodide.

10. The method of claim 1, wherein an alkyl group for at least one of the first alkyl ammonium halide or the second alkyl ammonium halide comprises at least one of a methyl group, an ethyl group, a propyl group, or a butyl group.

11. The method of claim 1, wherein both the first halogen and the second halogen comprise at least one of fluorine, chlorine, bromine, or iodine.

12. The method of claim 11, wherein the first halogen comprises chloride and the second halogen comprises at least one of bromine or iodine.

13. The method of claim 1, wherein the metal halide comprises at least one of lead, tin, germanium, or any other metal in a 2+ valence state.

14. The method of claim 1, wherein the solvent comprises at least one polar solvent.

15. The method of claim 14, wherein the solvent comprises at least one of dimethysulfoxide, dimethylformamide, γ-butyrolactone, or N-methyl-2-pyrrolidone.

16. The method of claim 1, wherein at least one of the first alkyl ammonium halide, the second alkyl ammonium halide, or the metal halide are present in the solution at a concentration between about 0.1 M and about 3.0 M.

17. The method of claim 1, wherein the treating comprises thermally treating.

18. The method of claim 17, wherein the thermally treating comprises heating the solution at a temperature between about 20° C. and about 250° C.

19. The method of claim 18, wherein the thermally treating comprises heating the solution for a period of time between about 30 seconds and about 6 hours.

* * * * *